(12) United States Patent
Hiroki et al.

(10) Patent No.: US 7,420,628 B1
(45) Date of Patent: Sep. 2, 2008

(54) METHOD OF MAKING AN ACTIVE-TYPE LCD WITH DIGITALLY GRADED DISPLAY

(75) Inventors: Masaaki Hiroki, Kanagawa (JP); Akira Mase, Aichi (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/943,238

(22) Filed: Oct. 3, 1997

Related U.S. Application Data

(60) Division of application No. 08/372,899, filed on Jan. 17, 1995, which is a continuation of application No. 07/993,391, filed on Dec. 18, 1992, now abandoned, which is a division of application No. 07/837,394, filed on Feb. 18, 1992, now Pat. No. 5,200,846.

(30) Foreign Application Priority Data

| Feb. 16, 1991 | (JP) | 3-77317 |
| Feb. 16, 1991 | (JP) | 3-77320 |
| Feb. 16, 1991 | (JP) | 3-77321 |
| Mar. 27, 1991 | (JP) | 3-87776 |
| Mar. 27, 1991 | (JP) | 3-89540 |

(51) Int. Cl.
*G02F 1/1339* (2006.01)
*G02F 1/136* (2006.01)
*H01L 21/00* (2006.01)
*H01L 21/302* (2006.01)

(52) U.S. Cl. .............. 349/41; 349/43; 438/30; 438/158; 257/70

(58) Field of Classification Search ........ 438/158, 438/30, 745, 750; 349/155, 41, 43, 44, 50; 257/70
See application file for complete search history.

(56) References Cited

U.S. PATENT DOCUMENTS

| 3,798,752 A | 3/1974 | Fujimoto |
| 3,838,209 A | 9/1974 | Tsuchiya et al. |
| 4,007,294 A | 2/1977 | Woods et al. |
| 4,068,020 A | 1/1978 | Reuschel |
| 4,365,013 A | 12/1982 | Ishioka |
| 4,378,417 A | 3/1983 | Maruyama et al. |
| 4,420,870 A | 12/1983 | Kimura |
| 4,466,172 A | 8/1984 | Batra |
| 4,468,855 A | 9/1984 | Sasaki |

(Continued)

FOREIGN PATENT DOCUMENTS

EP 0 161 555 11/1985

(Continued)

OTHER PUBLICATIONS

Wallmark et al., "Field-Effect Transistors Physics, Technology and Applications", 1968, pp. 199, MOS Field-Effect Transistors Sec. 8-3.

(Continued)

*Primary Examiner*—Wael Fahmy
*Assistant Examiner*—Steven H Rao
(74) *Attorney, Agent, or Firm*—Eric J. Robinson; Robinson Intellectual Property Law Office, P.C.

(57) ABSTRACT

An electro-optical device comprising a display drive system with the display timing related to the unit time t for writing-in a picture element and to the time F for writing-in one picture is disclosed. In the device, a gradated display corresponding to the ratio of the division can be obtained by time-sharing the signal during a write-in of time t without changing the time F.

40 Claims, 45 Drawing Sheets

U.S. PATENT DOCUMENTS

| | | | |
|---|---|---|---|
| 4,528,480 | A | 7/1985 | Unagami |
| 4,581,620 | A | 4/1986 | Yamazaki et al. |
| 4,591,892 | A | 5/1986 | Yamazaki |
| 4,597,160 | A | 7/1986 | Ipri |
| 4,597,637 | A | 7/1986 | Ohta |
| 4,600,274 | A | 7/1986 | Morozumi |
| 4,646,426 | A | 3/1987 | Sasaki |
| 4,648,691 | A | 3/1987 | Oguchi et al. |
| 4,650,543 | A * | 3/1987 | Kishita et al. ............... 156/643 |
| 4,653,862 | A | 3/1987 | Morozumi |
| 4,716,403 | A | 12/1987 | Morozumi |
| 4,727,044 | A | 2/1988 | Yamazaki |
| 4,740,829 | A | 4/1988 | Nakagiri et al. |
| 4,748,510 | A | 5/1988 | Umezawa |
| 4,752,774 | A | 6/1988 | Clerc et al. |
| 4,755,865 | A | 7/1988 | Wilson et al. |
| 4,770,502 | A * | 9/1988 | Kitazima et al. ............ 350/350 |
| 4,818,075 | A | 4/1989 | Takao et al. |
| 4,838,654 | A | 6/1989 | Hamaguchi et al. |
| 4,860,069 | A | 8/1989 | Yamazaki |
| 4,862,237 | A | 8/1989 | Morozumi |
| 4,888,305 | A | 12/1989 | Yamazaki et al. |
| 4,891,330 | A | 1/1990 | Guha et al. |
| 4,897,360 | A | 1/1990 | Guckel et al. |
| 4,905,066 | A | 2/1990 | Dohjo et al. |
| 4,916,090 | A | 4/1990 | Motai et al. |
| 4,917,471 | A | 4/1990 | Takao et al. |
| 4,943,837 | A | 7/1990 | Konishi et al. |
| 4,959,700 | A | 9/1990 | Yamazaki |
| 4,960,719 | A * | 10/1990 | Tnaka et al. .................. 437/40 |
| 4,969,025 | A | 11/1990 | Yamamoto et al. |
| 4,969,031 | A | 11/1990 | Kobayashi et al. |
| 4,986,213 | A | 1/1991 | Yamazaki et al. |
| 4,988,643 | A | 1/1991 | Tsou |
| 5,003,356 | A | 3/1991 | Wakai et al. |
| 5,016,610 | A * | 5/1991 | Meguro et al. ................ 126/91 |
| 5,023,679 | A | 6/1991 | Shibata |
| 5,042,920 | A | 8/1991 | Yoshino et al. |
| 5,051,570 | A | 9/1991 | Tsujikawa et al. |
| 5,075,674 | A | 12/1991 | Katayama et al. |
| 5,077,223 | A | 12/1991 | Yamazaki |
| 5,084,905 | A | 1/1992 | Sasaki et al. |
| 5,093,703 | A | 3/1992 | Minami et al. |
| RE33,882 | E | 4/1992 | Morozumi |
| 5,102,361 | A | 4/1992 | Katayama et al. |
| 5,132,754 | A | 7/1992 | Serikawa et al. |
| 5,132,821 | A | 7/1992 | Nicholas |
| 5,142,344 | A | 8/1992 | Yamazaki |
| 5,162,901 | A | 11/1992 | Shimada et al. |
| 5,166,816 | A | 11/1992 | Kaneko et al. |
| 5,181,132 | A * | 1/1993 | Shindo et al. .................. 359/58 |
| 5,182,620 | A | 1/1993 | Shimada et al. |
| 5,194,136 | A | 3/1993 | Jeung et al. |
| 5,200,846 | A | 4/1993 | Hiroki et al. |
| 5,206,635 | A | 4/1993 | Inuzuka et al. |
| 5,235,195 | A | 8/1993 | Tran et al. |
| 5,245,452 | A | 9/1993 | Nakamura et al. |
| 5,250,818 | A | 10/1993 | Saraswat et al. |
| 5,268,679 | A | 12/1993 | Shannon |
| 5,273,910 | A | 12/1993 | Tran et al. |
| 5,287,205 | A | 2/1994 | Yamazaki et al. |
| 5,289,030 | A | 2/1994 | Yamazaki et al. |
| 5,296,870 | A | 3/1994 | Nicholas |
| 5,302,845 | A | 4/1994 | Kumagai et al. |
| 5,308,998 | A | 5/1994 | Yamazaki et al. |
| 5,313,077 | A | 5/1994 | Yamazaki |
| 5,315,132 | A | 5/1994 | Yamazaki |
| 5,327,901 | A | 7/1994 | Delente |
| 5,329,390 | A * | 7/1994 | Fujiwara et al. ............... 359/67 |
| 5,340,999 | A | 8/1994 | Takeda et al. |
| 5,358,810 | A | 10/1994 | Yoshimo |
| 5,495,353 | A | 2/1996 | Yamazaki et al. |
| 5,521,107 | A | 5/1996 | Yamazaki et al. |
| 5,543,636 | A | 8/1996 | Yamazaki |
| 5,568,288 | A | 10/1996 | Yamazaki et al. |
| 5,572,345 | A | 11/1996 | Yamazaki et al. |
| 5,591,987 | A | 1/1997 | Yamazaki et al. |
| 5,612,799 | A | 3/1997 | Yamazaki et al. |
| 5,744,818 | A | 4/1998 | Yamazaki et al. |
| 5,854,879 | A | 12/1998 | Inuzuka et al. |
| 5,899,547 | A | 5/1999 | Yamazaki et al. |
| 5,905,555 | A | 5/1999 | Yamazaki et al. |
| 5,933,205 | A | 8/1999 | Yamazaki et al. |
| 5,946,059 | A | 8/1999 | Yamazaki et al. |
| 5,956,105 | A | 9/1999 | Yamazaki et al. |
| 5,963,278 | A | 10/1999 | Yamazaki et al. |
| 5,998,841 | A | 12/1999 | Suzawa |
| 6,011,277 | A | 1/2000 | Yamazaki |
| 6,013,928 | A | 1/2000 | Yamazaki et al. |
| 6,023,075 | A | 2/2000 | Yamazaki |
| 6,281,520 | B1 | 8/2001 | Yamazaki |
| 6,436,815 | B1 | 8/2002 | Yamazaki et al. |
| 6,437,367 | B1 | 8/2002 | Yamazaki et al. |
| 6,566,711 | B1 | 5/2003 | Yamazaki et al. |
| 5,998,841 | C1 | 7/2003 | Suzawa |
| 6,737,676 | B2 | 5/2004 | Yamazaki |
| 6,778,231 | B1 | 8/2004 | Yamazaki et al. |
| 6,838,698 | B1 | 1/2005 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,154,147 | B1 | 12/2006 | Yamazaki et al. |
| 7,253,437 | B2 | 8/2007 | Yamazaki et al. |
| 2002/0033906 | A1 | 3/2002 | Hiroki et al. |
| 2005/0001965 | A1 | 1/2005 | Hiroki et al. |
| 2005/0007329 | A1 | 1/2005 | Hiroki et al. |
| 2006/0151792 | A1 | 7/2006 | Yamazaki et al. |
| 2007/0252149 | A1 | 11/2007 | Yamazaki et al. |

FOREIGN PATENT DOCUMENTS

| | | | |
|---|---|---|---|
| EP | 0 271 960 | | 6/1988 |
| EP | 0 318 224 | | 5/1989 |
| EP | 0 412 701 | | 2/1991 |
| GB | 1 396 486 | | 6/1975 |
| GB | 2130781 | | 6/1984 |
| GB | 2 187 859 | | 9/1987 |
| GB | 2187859 | * | 9/1987 |
| JP | 63-237571 | | 10/1888 |
| JP | 49-52598 | | 5/1974 |
| JP | 49-078483 | | 7/1974 |
| JP | 49-098964 | | 9/1974 |
| JP | 52-76897 | | 6/1977 |
| JP | 53-027483 | | 3/1978 |
| JP | 53-144297 | | 12/1978 |
| JP | 55-032026 | | 3/1980 |
| JP | 55-154750 | | 12/1980 |
| JP | 56-043679 | | 4/1981 |
| JP | 56-069864 | | 6/1981 |
| JP | 56-094386 | | 7/1981 |
| JP | 57-109994 | | 7/1982 |
| JP | 58-002073 | | 1/1983 |
| JP | 58-023478 | | 2/1983 |
| JP | 58-023479 | | 2/1983 |
| JP | 58-27365 | | 2/1983 |
| JP | 58-066477 | | 4/1983 |
| JP | 58-105574 | | 6/1983 |
| JP | 58-106861 | | 6/1983 |
| JP | 58-115864 | | 7/1983 |
| JP | 58-118154 | | 7/1983 |
| JP | 58-118691 | | 7/1983 |
| JP | 58-142566 | | 8/1983 |
| JP | 58-164268 | | 9/1983 |
| JP | 58-186967 | | 11/1983 |

| | | |
|---|---|---|
| JP | 58-192379 | 11/1983 |
| JP | 59-021067 | 2/1984 |
| JP | 59-61818 | 4/1984 |
| JP | 59-141271 | 8/1984 |
| JP | 59-211087 | 11/1984 |
| JP | 60-047574 | 3/1985 |
| JP | 60-154996 | 10/1985 |
| JP | 60-237403 | 11/1985 |
| JP | 60-245173 | 12/1985 |
| JP | 60-245174 | 12/1985 |
| JP | 60-247603 | 12/1985 |
| JP | 61-018755 | 5/1986 |
| JP | 61-136263 | 6/1986 |
| JP | 62-031278 | 2/1987 |
| JP | 62-073658 | 4/1987 |
| JP | 62-073660 | 4/1987 |
| JP | 62-105474 | 5/1987 |
| JP | 62-131575 | 6/1987 |
| JP | 62-142480 | 6/1987 |
| JP | 62-193277 | 8/1987 |
| JP | 62-210422 | 9/1987 |
| JP | 62-214669 | 9/1987 |
| JP | 62-219574 | 9/1987 |
| JP | 62-283664 * | 9/1987 |
| JP | 62-226192 | 10/1987 |
| JP | 62-247330 | 10/1987 |
| JP | 62-283664 * | 12/1987 |
| JP | 63-009978 | 1/1988 |
| JP | 63-066969 | 3/1988 |
| JP | 63-070832 | 3/1988 |
| JP | 63-096636 | 4/1988 |
| JP | 63-100777 | 5/1988 |
| JP | 63-101829 | 5/1988 |
| JP | 63-119578 | 5/1988 |
| JP | 63-126277 | 5/1988 |
| JP | 63-170692 | 7/1988 |
| JP | 63-178560 | 7/1988 |
| JP | 63-219152 | 9/1988 |
| JP | 63-279228 | 11/1988 |
| JP | 63-283068 | 11/1988 |
| JP | 64-012576 | 1/1989 |
| JP | 64-018266 | 1/1989 |
| JP | 64-68724 | 3/1989 |
| JP | 64-68728 | 3/1989 |
| JP | 64-068732 | 3/1989 |
| JP | 1-107237 | 4/1989 |
| JP | 64-089464 | 4/1989 |
| JP | 01-121802 | 5/1989 |
| JP | 01-134342 | 5/1989 |
| JP | 01-156725 | 6/1989 |
| JP | 01-183845 | 7/1989 |
| JP | 01-183853 | 7/1989 |
| JP | 01-194351 | 8/1989 |
| JP | 01-241862 | 9/1989 |
| JP | 01-274117 | 11/1989 |
| JP | 01-289917 | 11/1989 |
| JP | 01-292315 | 11/1989 |
| JP | 01-321073 | 12/1989 |
| JP | 02-002522 | 1/1990 |
| JP | 02-004093 | 1/1990 |
| JP | 2-16596 | 1/1990 |
| JP | 02-024604 | 1/1990 |
| JP | 02-027320 | 1/1990 |
| JP | 02-044314 | 2/1990 |
| JP | 02-079476 | 3/1990 |
| JP | 02-090683 | 3/1990 |
| JP | 02-103925 | 4/1990 |
| JP | 02-146878 | 6/1990 |
| JP | 02-159730 | 6/1990 |
| JP | 02-177679 | 7/1990 |
| JP | 2-199498 | 8/1990 |
| JP | 02-201940 | 8/1990 |
| JP | 02-210330 | 8/1990 |
| JP | 02-211428 | 8/1990 |
| JP | 02-212818 | 8/1990 |
| JP | 02-228041 | 9/1990 |
| JP | 02-228042 | 9/1990 |
| JP | 02-234134 | 9/1990 |
| JP | 02-250357 | 10/1990 |
| JP | 02-278749 | 11/1990 |
| JP | 02-281291 | 11/1990 |
| JP | 02-282728 | 11/1990 |
| JP | 02-307273 | 12/1990 |
| JP | 02-309317 | 12/1990 |
| JP | 03-007911 | 1/1991 |
| JP | 03-012637 | 1/1991 |
| JP | 03-017629 | 1/1991 |
| JP | 03-024735 | 2/1991 |
| JP | 03-034434 | 2/1991 |
| JP | 03-036767 | 2/1991 |
| JP | 03-059543 | 3/1991 |
| JP | 03-109739 | 5/1991 |
| JP | 03-165575 | 7/1991 |
| JP | 03-180058 | 8/1991 |
| JP | 03-185839 | 8/1991 |
| JP | 03-217059 | 9/1991 |
| JP | 03-272183 | 12/1991 |
| JP | 3-288824 | 12/1991 |
| JP | 04-015996 | 1/1992 |
| JP | 04-268536 | 9/1992 |
| JP | 04-283729 | 10/1992 |
| JP | 4-283729 | 10/1992 |
| JP | 4-291240 | 10/1992 |
| JP | 04-291240 | 10/1992 |
| JP | 04-299864 | 10/1992 |
| JP | 04-360580 | 12/1992 |
| JP | 05-267667 | 10/1993 |
| JP | 11-311805 | 11/1999 |

OTHER PUBLICATIONS

Wilmsen, "Chemical Composition and Formation of Thermal and Anodic Oxide/III-V Compound Semiconductor Interfaces", Sep.-Oct. 1981, pp. 279-287, J. Vacuum Society. Technology, vol. 19, No. 3.

Millman et al., "Microelectronics", 1988, pp. 143, McGraw-Hill Book Company, Second Edition.

Cobbold, "Theory and Applications of Field-Effect Transistors", 1971, pp. 62, Field-Effect Transistors.

Inventors: Yamazaki et al., Specification & Drawings for U.S. Appl. No. 09/344,373, filed Jun. 25, 1999.

Inventors: Yamazaki et al., Specification & Drawings for U.S. Appl. No. 09/233,145, filed Jan. 19, 1999.

Inventors: Hiroki et al., Specification & Drawings for U.S. Appl. No. 09/300,596, filed Apr. 28, 1999.

Inventor: Yamazaki, Specification & Drawings for U.S. Appl. No. 90/005,691, filed Mar. 31, 2000.

B. Bahadur et al., *Liquid Crystals—Applications and Uses*, vol. 1, pp. 178-181, 421-423.

M. Tsumura et al., *12.1: High-Resolution 10.3-in-Diagonal Multicolor TFT-LCD*, SID 91 Digest, pp. 215-218.

T. Yanagisawa et al., "An MOS Array with Platinum Display Electrodes for Reflective Dynamic Scattering LCDs." SID 81 Digest, pp. 110-111, 1981.

Y. Oana et al., "A 240 X 360 Element Active Matrix LCD with Integrated Gate-Bus Drivers Using Poly-Si TFTs." SID 84 Digest, pp. 312-315, Jan. 6, 1984.

Color Liquid Crystal Display, pp. 162-163, Dec. 14, 1990.

Flat Panel Display 1991, pp. 66-67, Jan. 1, 1991.

Flat Panel Display 1992, pp. 100-101, Nov. 19, 1992.

Pending Claims on Appeal as of Jan. 21, 2004 of U.S. Appl. No. 90/006,102 filed Aug. 29, 2007 (Reexamination of U.S. Patent 5,905,555).

Official Action dated Mar. 24, 2006 and Corresponding Claims for U.S. Appl. No. 09/300,596.

Official Action dated Dec. 26, 2006 and Corresponding Claims for U.S. Appl. No. 09/300,596.

Specification, Original Claims, Abstract, Drawings and Pending Claims as of Jun. 26, 2006 of U.S. Appl. No. 09/300,596 filed Apr. 28, 1999.

Specification, Original Claims, Abstract, Drawings and Allowed Claims as of Nov. 8, 2007 of U.S. Appl. No. 09/288,140 Filed Apr. 8, 1999.

Official Action dated Apr. 4, 2007 and Corresponding Claims of U.S. Appl. No. 09/288,509, now abandoned.

Specification, Original Claims, Abstract, and Drawings of U.S. Appl. No. 09/288,509 filed Apr. 8, 1999, now abandoned.

Specification, Original Claims, Abstract, and Drawings and Pending Claims on Appeal as of Jul. 10, 2006 of U.S. Appl. No. 09/285,899 filed Apr. 8, 1999.

Official Action dated Mar. 9, 2000 and Corresponding Claims of U.S. Appl. No. 09/316,198, now abandoned.

Specification, Claims, Abstract, and Drawings of U.S. Appl. No. 09/316,198 filed May 21, 1999, now abandoned.

Pending Claims as of Dec. 12, 2007 of U.S. Publication No. 2006/0151792 (U.S. Appl. No. 11/374,038).

Pending Claims as of Jun. 13, 2007 of U.S. Publication No. 2002/0033906 (U.S. Appl. No. 09/961,055).

Pending Claims as of Oct. 31, 2007 of U.S. Publication No. 2005/0001965 (U.S. Appl. No. 10/836,246).

Pending Claims as of Sep. 17, 2007 of U.S. Publication No. 2005/0007329 (U.S. Appl. No. 10/844,347).

* cited by examiner

FIG. 7
PIXEL A
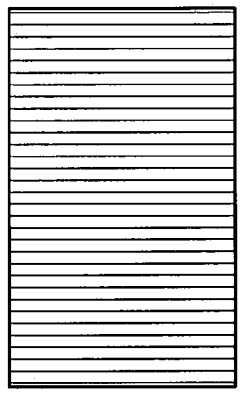
PIXEL F
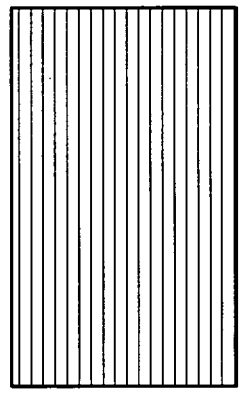
PIXEL I
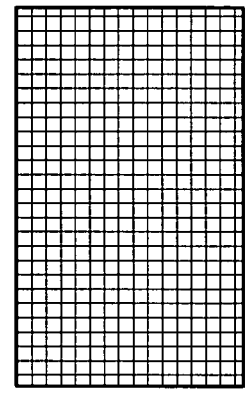

FIG. 14
PIXEL A 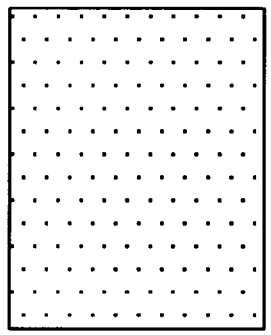 PIXEL E 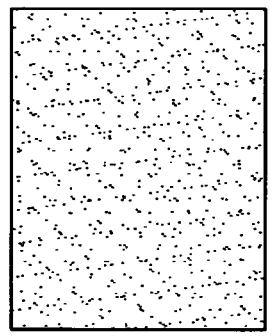 PIXEL C 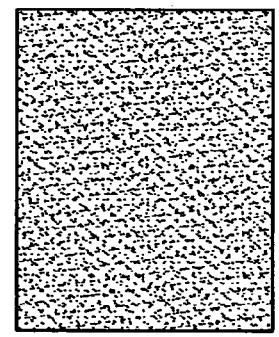

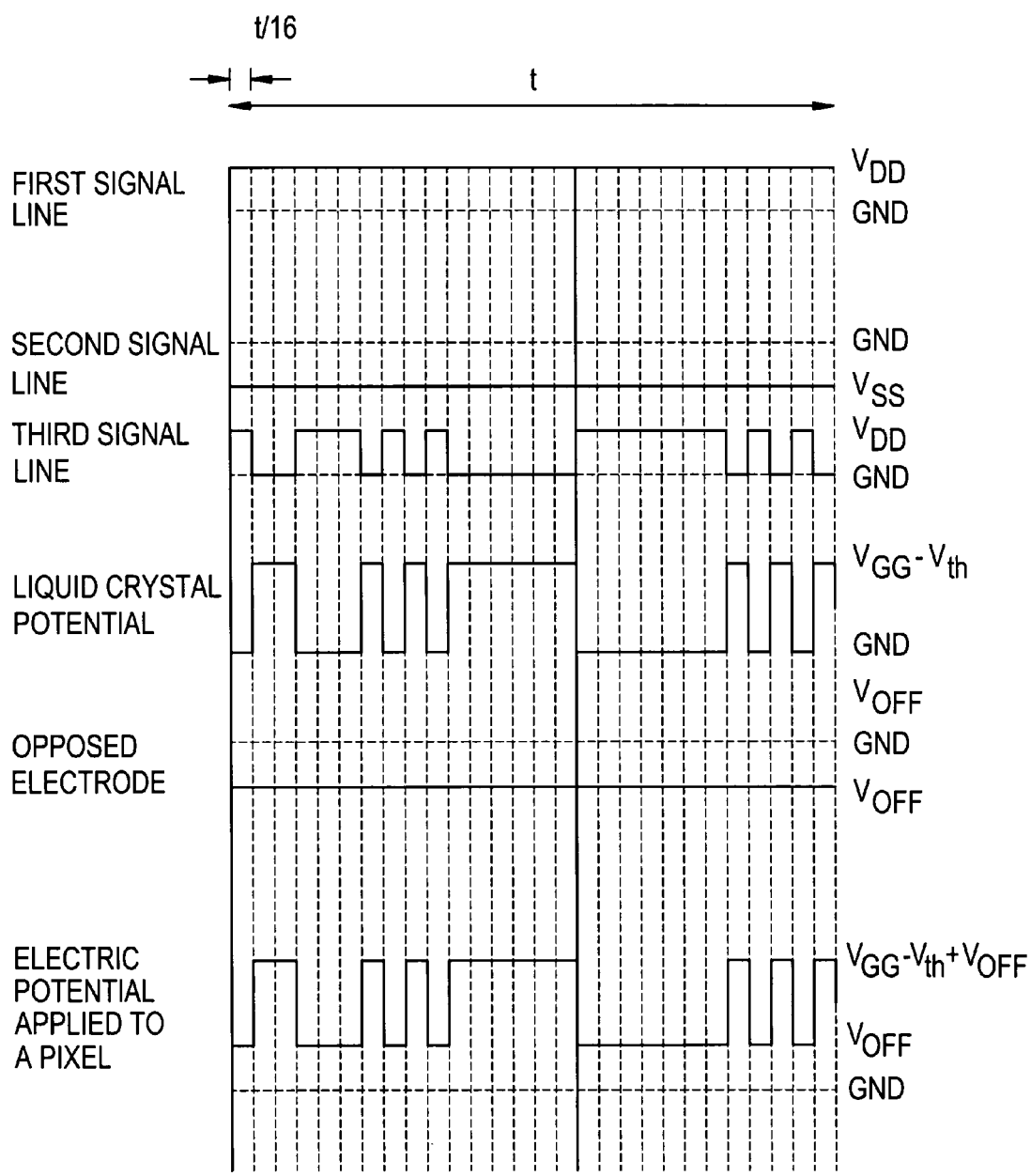

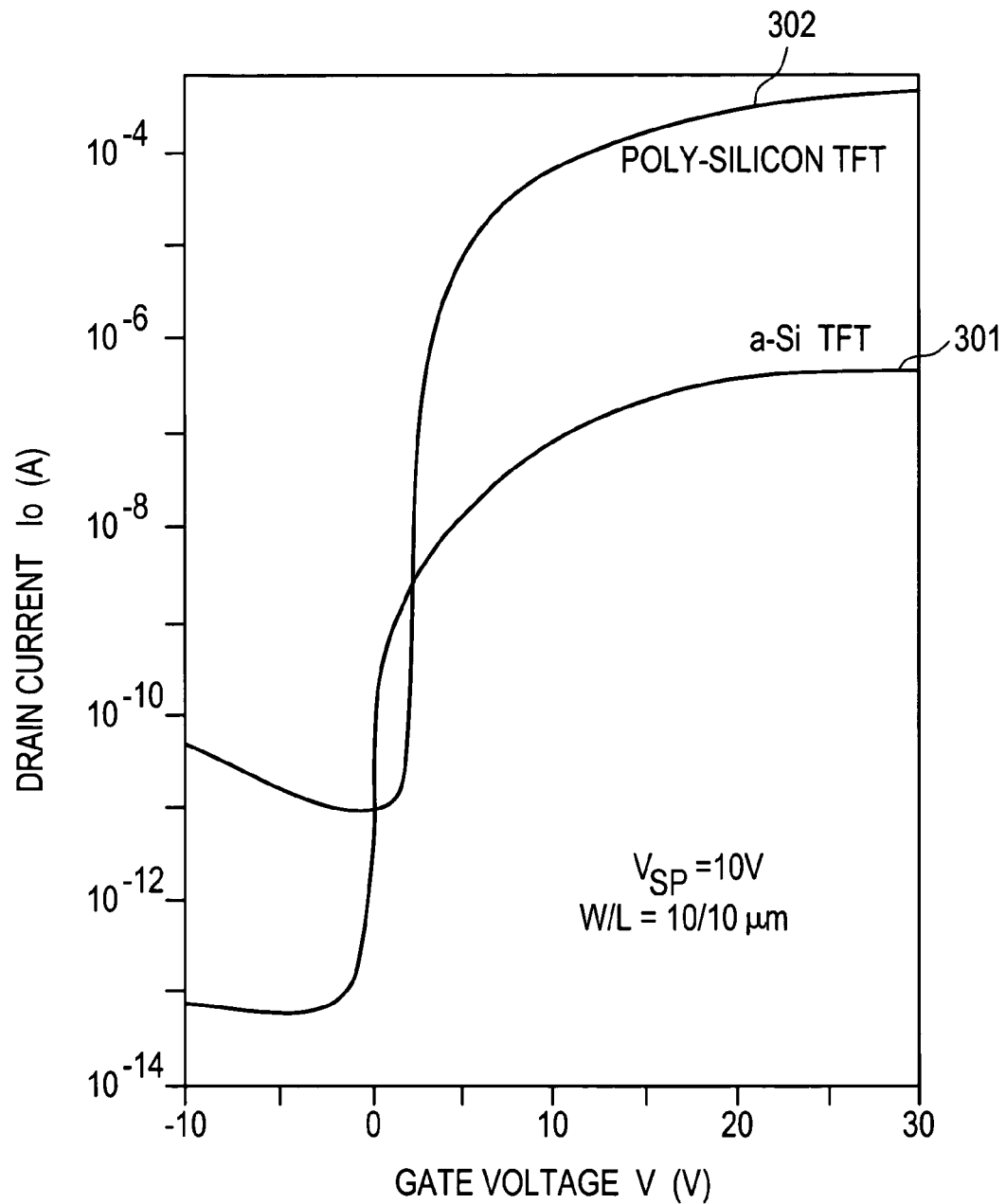

FIG. 27
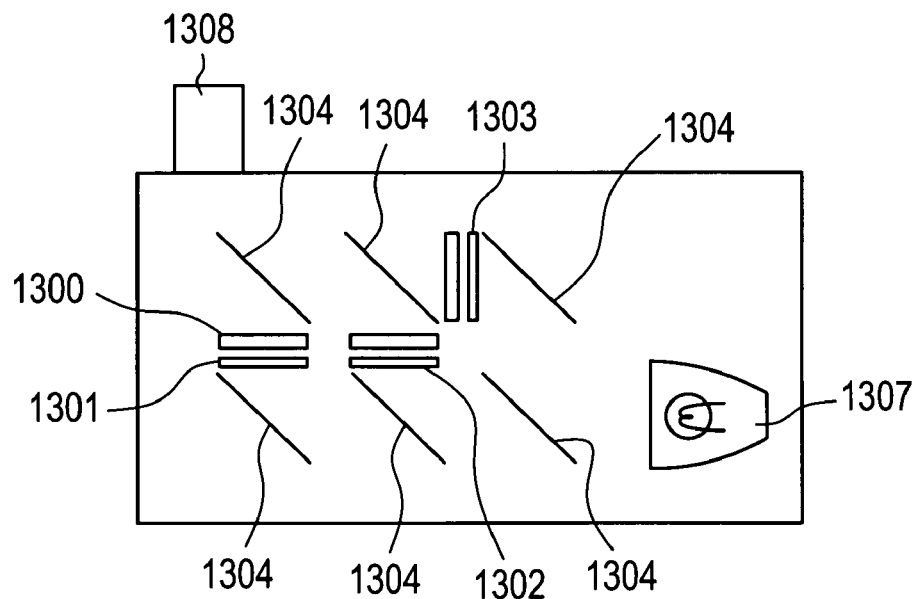
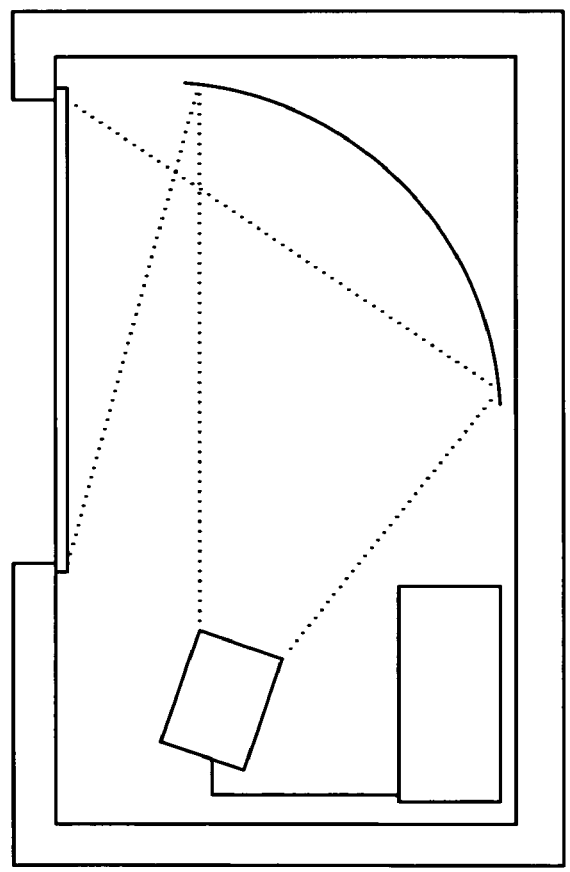

METHOD OF MAKING AN ACTIVE-TYPE LCD WITH DIGITALLY GRADED DISPLAY

This is a Divisional application of Ser. No. 08/372,899, filed Jan. 17, 1995; which itself is a continuation of Ser. No. 07/993,391, filed Dec. 18, 1992 now abandoned; which is a division of Ser. No. 07/837,394, filed Feb. 18, 1992 now U.S. Pat. No. 5,200,846.

BACKGROUND OF THE INVENTION

1. Field of the Invention

This invention relates to an electro-optical device and more particularly, to an active-type liquid crystal display device in which clear gradated display levels can be set.

2. Description of the Prior Art

Because of the physical characteristics of the liquid crystal composition, the dielectric constant of such compositions differs between a direction parallel to the molecule axis and a direction perpendicular to the molecule axis. This phenomena is referred to as dielectric anisotropy. Thus, the liquid crystals in the composition can easily be arranged parallel to or perpendicular to an external electric field. A liquid crystal electro-optical device utilizes this dielectric anisotropy, so that the ON/OFF display characteristics are achieved by controlling the amount of light transmitted or the amount of light dispersion.

The electro-optical characteristics of a nematic liquid crystal are shown in FIG. 2. The relationship between the applied voltage and the transmissivity (amount of light transmitted) is as follows:

| the applied voltage | the light transmitted |
| --- | --- |
| smaller Va at point A 201 | 0%; |
| Vb at point B 202 | about 30%; |
| Vc at point C 203 | about 80%; |
| larger Vd at point D 204 | about 100%. |

In short, if only points A and D are utilized, the two gradations, black and white, are displayed, and if the rising portion of the electro-optical characteristic curve is utilized, such as at points B and C, an intermediate gradated display is possible. It has been confirmed that Va=2.0V, Vb=2.18V, Vc=2.3V and Vd=2.5V.

Conventionally, in the case of a liquid crystal electro-optical device with a gradated display utilizing a TFT, the applied gate voltage or voltage applied over the source and drains of the TFT is varied to adjust the voltage, so that an analog gradated display is obtained.

The gradated display method with a liquid crystal electro-optical device utilizing TFTs is further described below in detail.

An n-channel thin film transistor conventionally utilized in a liquid crystal electro-optical device has the voltage-current characteristic as shown in FIG. 20. In the drawing, numeral 301 designates the characteristic in case of an n-channel thin film transistor using amorphous silicon, while numeral 302 designates the characteristic in case of an n-channel thin film transistor using polycrystalline silicon.

In a conventional gradated display method, by controlling analog voltages to be applied to the gate electrode, drain currents can be controlled, and accordingly, the resistance value between the source and the drain can be changed. As a result, the strength of the electric fields to be applied to the liquid crystal, connected in series thereto, can be arbitrarily changed by the division of the resistance, whereby a gradated display is made possible.

Also there is another conventional method, where the gate electrode is connected to scanning signal lines and the voltage between the source and drain is changed, resulting in controlling arbitrarily the electric field value itself to be applied to the liquid crystal.

Both of the above methods are analog gradated display methods, largely relying upon the TFT characteristics. It is however difficult to form numbers of TFTs for matrix composition so as to make all of them have a uniform electric characteristic. Particularly, it is extremely difficult, in the present circumstances, to finely adjust the intermediate voltage necessary for a gradated display by the present techniques. As can be realized by the electro-optical characteristics of a nematic liquid crystal shown in FIG. 2, a gradated display has to be carried out within 0.32V (i.e., from around 2.08V, the boundary value of dark condition, to around 2.40V, the boundary value of light condition). In the case of a gradated display of 16 gradations, the control of the voltage at every 0.02V in average is required.

On the other hand, when the voltage is controlled at such as point A 201 and point D 204 shown in FIG. 2 where liquid crystal is completely turned ON/OFF, the difference between voltages of 0.5V or more can be obtained. The difference will sufficiently ease the variation in TFT characteristics. When, using a plurality of write-in frames, for example 6 frames among 10 frames are turned ON (at 2.5V) and the remaining 4 frames are turned OFF (2.0V), the write-in voltage is 2.3V in average, so that an intermediate gradated display becomes possible.

In this case, however, the drive frequency might be decreased to 30 Hz or lower which is not discernible by the human eyes. Depending on conditions, this becomes a cause of flicker in a display. Although it is proposed to raise the drive frequency to prevent the above problem, the data transfer speed of a driver IC has its limit up to about 20 MHz.

SUMMARY OF THE INVENTION

Accordingly, an object of the present invention is to provide a means of supplying a precise, clear level of gradated display to the liquid crystals by presenting a digital gradated display rather than a conventional analog gradated display.

In order to obtain a quality gradated picture, the drive frequency of the drive IC is raised, the frame frequency is not reduced substantially and the frame frequency does not fall below the visually discernable minimum frequency (the lowest confirmed number of frames) in the method of displaying a gradated image, in accordance with the present invention.

In accordance with the present invention, a gradated display is provided in an active-matrix-type liquid crystal display device. The display uses a display drive system with a display timing related to the unit time t for writing-in a picture element and to the time F for writing-in one picture. By time-sharing the signal during a write-in of time t, without changing the time F, a gradated display corresponding to the ratio of the division is obtained since an average electric field applied to a liquid crystal at a picture element (pixel) during the time t can be controlled by controlling the ratio of the division.

For purposes of explanation, a 4×4 matrix shown in FIG. 3 will be used in discussing the present invention. In the case of a method for gradated display with a conventional display device, as shown in FIG. 4, the electric fields like 220-223 to be applied to the pixel electrodes are determined depending on the strength of the electric fields to the signal lines 210-213 of the data electrode direction, from which the transmittance of the liquid crystals is determined. Note reference numerals in FIG. 3 corresponds to that in FIG. 4.

In the present invention, analog gradation control is not used, and the signal during a write-in unit time t 225 for writing in a pixel is time-shared as shown in FIG. 1. This is done so that the gradated display can be achieved with each of the divisions used as a minimum unit.

At this time, in the case where the electric fields 227, 229, 231 in the write-in time are changed as shown in FIG. 1, the electric fields in the non-write-in time become the average values 228, 230, 232, and a clear gradated display becomes possible.

For another explanation, a 2×2 matrix shown in FIG. 10 or FIG. 17 will be used in discussing the present invention. In another method for gradated display with a conventional display device, as shown in FIG. 11, a plurality of picture frames, (e.g., 16 frames) are used, and the electric field over the picture element electrodes is determined as the average voltage for 16 frames by turning the picture elements ON and OFF, from which the transmittance of the liquid crystals is determined.

In the present invention, however, the conventional analog gradation control or the gradated display with a plurality of frames is not used, and the signal during a write-in unit time t 325 for writing in a pixel is time-shared as shown in FIG. 9 and FIG. 16, so that the gradated display can be accomplished with each of the divisions used as a minimum unit. In the case of the circuit shown in FIG. 10, a gradated display can be obtained with the signal in FIG. 9. In the case of the circuit shown in FIG. 17, a gradated display is obtained with the signal in FIG. 16.

At this time, in the case where the electric fields 327, 329 in the write-in time are changed as shown in FIG. 9 or FIG. 16, the liquid crystals are activated by the average value of the applied voltage and a clear gradated display becomes possible.

In another method of the present invention, a digital gradated display is achieved without changing the frame frequency and with the data transfer frequency and the frequency for gradated display being independent of each other.

In the case of a liquid crystal electro-optical device having 1920×400 dots, for example, the data transfer on the information signal side by 8 bit parallel transfer requires a clock frequency of 5.76 MHz. If the conventional method with a plurality of frames, e.g. 10 frames, is employed for this data transfer, the clock frequency as high as 57.6 MHz is necessary. However, since the clock frequency for a gradated display is made independent in the present invention, a gradated display having about 166 gradations is possible with an IC driven at 8 MHz in maximum. If an IC driven at 12.3 MHz is used, a display having 256 gradations, which is considered necessary for a visual display, is sufficiently possible. Therefore, the gradated display in accordance with the above method is greatly advantageous over the conventional analog gradated display and the gradated display with a plurality of frames.

Liquid crystal components which can be utilized in the present invention are a material exhibiting ferroelectricity, a material exhibiting anti-ferroelectricity, a material consisting mainly of a nematic liquid crystal, a material consisting mainly of a cholesteric liquid crystal, a nematic liquid crystal dispersed in an organic resin, a cholesteric liquid crystal dispersed in an organic resin, and a smectic liquid crystal dispersed in an organic resin.

BRIEF DESCRIPTION OF THE DRAWINGS

FIG. 7 shows examples of picture elements in display in this invention;

FIG. 14 illustrates a gradated display obtained in one embodiment of the present invention;

FIG. 19 illustrates a graph showing an example of the drive waveforms in the present invention;

FIG. 20 shows gate voltage-drain current characteristics in a polycrystalline silicon TFT and an amorphous silicon TFT.

FIG. 27 shows an assembly of a projection type image display of one embodiment of the present invention;

DETAILED DESCRIPTION OF THE PREFERRED EMBODIMENTS

Figure 16:
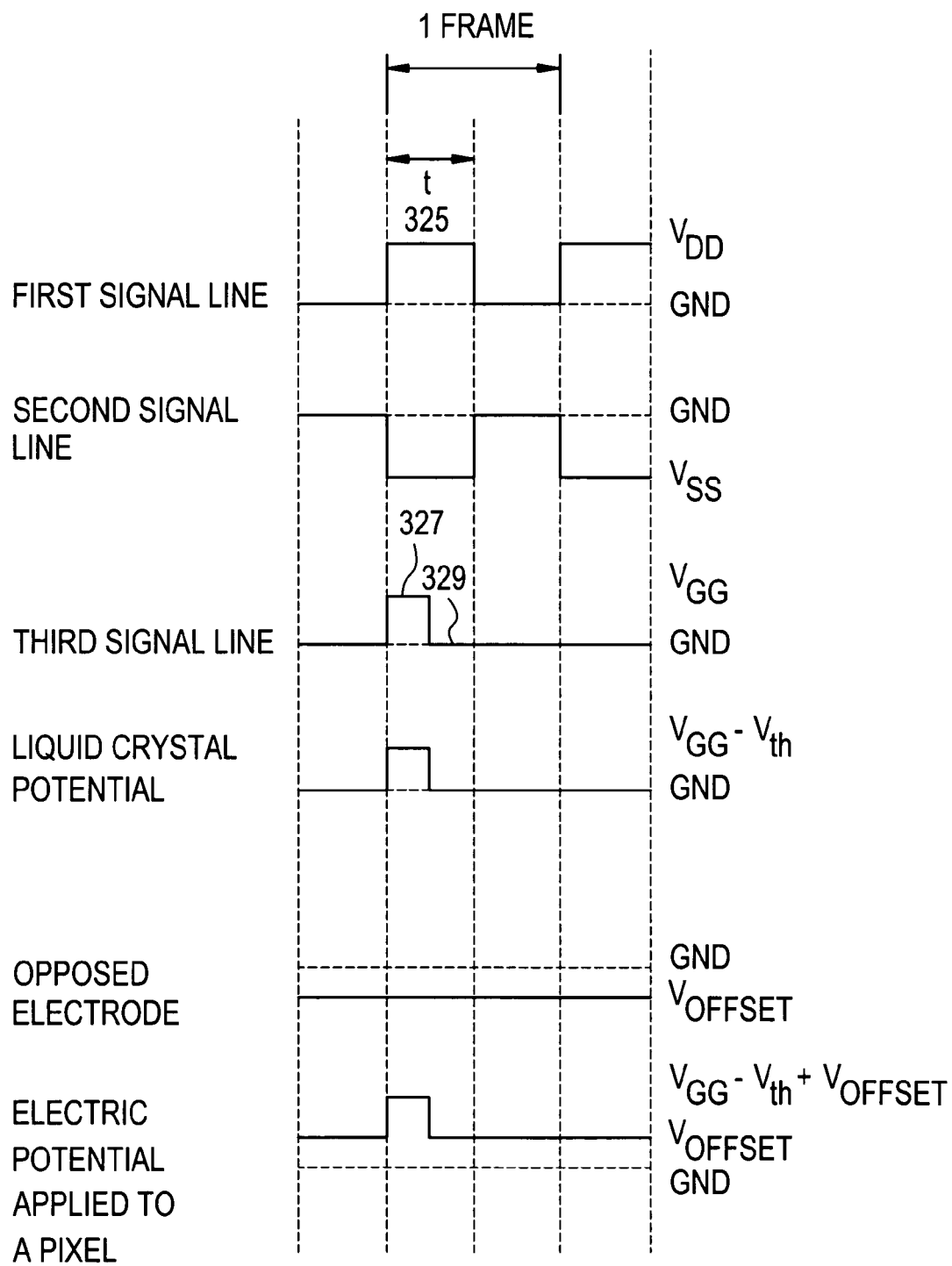
FIG. 16 illustrates a graph showing another example of the drive waveform in accordance with the present invention.
Figure 17:
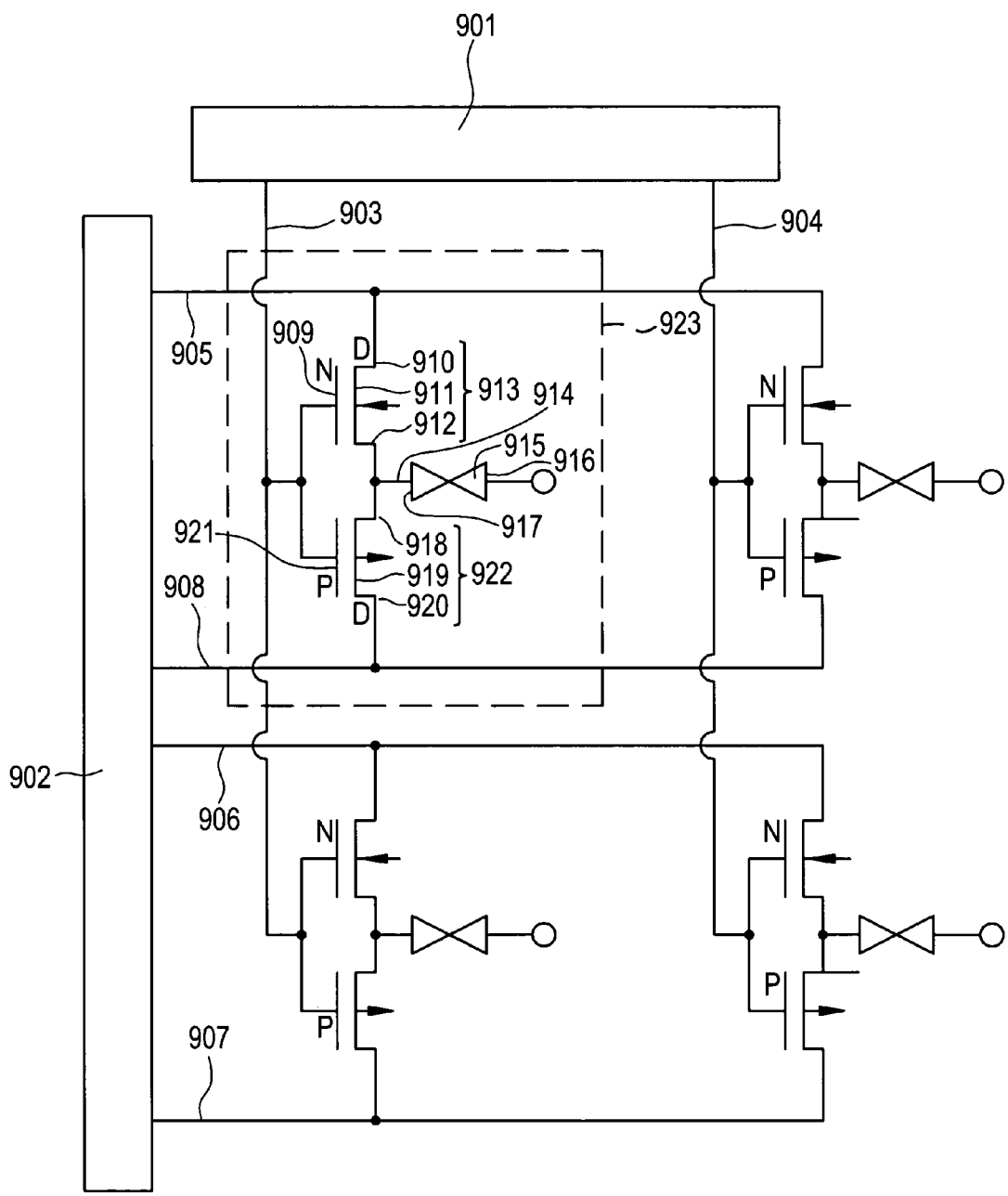
FIG. 17 is another example of the circuit configuration of a liquid crystal electro-optical device of the present invention.
Figure 38:
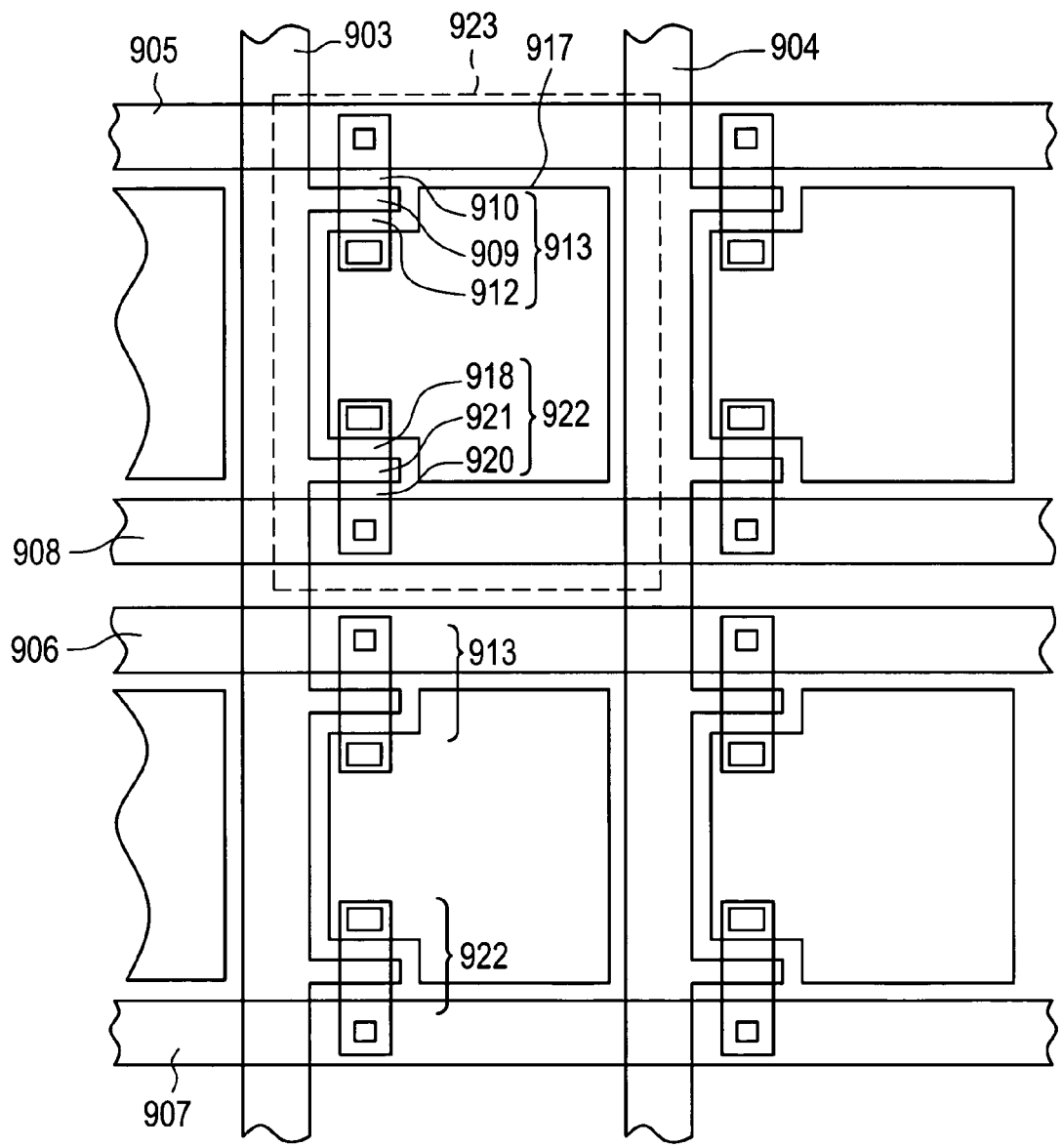
FIG. 38 illustrates a layout of electrodes and the like of still another embodiment of the present invention.

In a first embodiment of the present invention, a liquid crystal display device with the circuit configuration shown in FIG. 17, (i.e., a buffer type circuit configuration) is used. FIG. 38 shows the layout of the actual electrodes and the like corresponding to the circuit configuration of FIG. 17. In order to simplify the explanation, the parts corresponding to a 2×2 matrix only are described. The driving signal waveform is shown in FIG. 16. For simplicity, the explanation of the signal waveform is also given for the case of 2×2 matrix configuration.

Figure 18A:
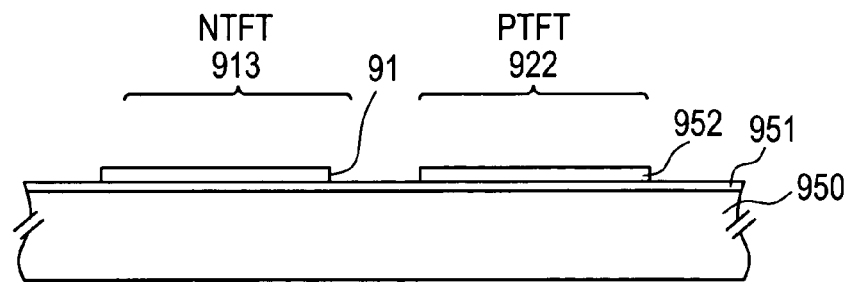
FIGS. 18(A) to 18(F) are cross-sectional views to show the formation process of a substrate of one embodiment of the present invention.
Figure 18B:
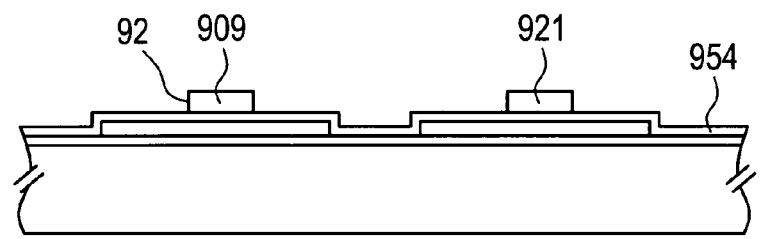

The manufacturing process for forming the substrate for the liquid crystal display device used in an embodiment of the present invention is shown in FIG. 18(A)-18(F). In FIG. 18(A), a silicon oxide film for a blocking layer 951 having a thickness of 1000 to 3000 angstroms is formed on a glass substrate 950, using a magnetron RF (high frequency) sputtering method. The glass substrate 950 is made of inexpensive glass capable of withstanding heat treatment up to 700° C. e.g. of 600° C.

The process conditions are as follows:
atmosphere: 100% oxygen;
film forming temperature: 150° C.;
output: 400 to 800 W; and
pressure: 0.5 Pa.

The film forming, using either quartz or single-crystal silicon for a target has a speed of 30 to 100 Angstroms/minute.

On top of this construction, an amorphous silicon film is formed using an LPCVD (low pressure chemical vapor deposition) method, sputtering method, or a plasma CVD method.

If using the LPCVD method to form the silicon film, disilane ($Si_2H_6$) or trisilane ($Si_3H_8$) is supplied to the CVD apparatus at a temperature 100 to 200° C. less than the crystallization temperature (i.e., 450 to 550° C., for example at 530° C.). The pressure inside the reaction furnace is 30 to 300 Pa. The film forming speed is 50 to 250 Å/minute. In order to control the threshold voltage (Vth) of both the NTFT and PTFT at a substantially same level, boron with a concentration of $1\times10^{15}$ to $5\times10^{18}$ cm$^{-3}$ can be added using diborane. If using a sputtering method, the conditions are as follows:

back pressure before sputtering: up to $1\times10^{-5}$ Pa;
target: a single crystal silicon;
atmosphere: argon with hydrogen 20 to 80% by volume e.g. 20 volume % Ar and 80 volume % $H_2$;
the film forming temperature: 150° C.;
frequency: 13.56 MHz;
sputter output: 400 to 800 W; and
pressure: 0.5 Pa.

When forming a silicon film using the plasma CVD method, the temperature is 300° C. for example, and monosilane ($SiH_4$) or disilane ($Si_2H_6$) is used as the reactive gas, which are input into a PCVD apparatus and 13.56 MHz high frequency electric power is applied for film forming.

Preferably, the oxygen concentration of the film formed is $5\times10^{21}$ cm$^{-3}$ or less. If the oxygen concentration is higher than this range, crystallization becomes difficult and the heat annealing temperature must be high or the annealing time long. On the other hand, if the concentration is too low, the current leak in the OFF state increases because of the back light. For this reason the concentration is held in the range from $4\times10^{19}$ to $4\times10^{21}$ cm$^{-3}$. The silicon concentration is assumed to be $4\times10^{22}$ cm$^{-3}$ and hydrogen concentration is $4\times10^{20}$ cm$^{-3}$, which is equal to one atomic % of the silicon concentration.

Also, to promote further crystallization at the source and drain, the oxygen concentration is adjusted to $7\times10^{19}$ cm$^{-3}$ or less, or, preferably, $1\times10^{19}$ cm$^{-3}$ or less, and oxygen may be added by ion implantation to a concentration range of $5\times10^{20}$ to $5\times10^{21}$ cm$^{-3}$, only to the channel forming regions of the TFTs which form the pixels. On the other hand, it is effective for a high frequency operation to reduce the amount of oxygen contained in the TFT provided in the peripheral circuits which no light reaches, so as to make the carrier mobility greater.

After the amorphous silicon film is formed to a thickness of 500 to 5000 Å, for example 1500 Å by means of the foregoing process, an intermediate heat treatment is performed at 450 to 700° C. for 12 to 70 hours in an oxygen-free atmosphere, for example, in a hydrogen atmosphere at 600° C.

Because an amorphous silicon oxide film is formed on the surface of the substrate, beneath the silicon film, no specific nucleus exists in this heat treatment, so the whole amorphous silicon film is uniformly heat annealed. Specifically, the amorphous structure is kept in film forming and hydrogen is merely mixed in.

When annealing the silicon film, crystallization is inclined to take place in a highly ordered state from the amorphous structure, so that a crystal state is partly produced. Particularly, in the regions where a relatively highly ordered state is produced just after film forming of silicon, the tendency of crystallization to a crystal state is strong. A junction, however, takes place due to the silicon located between these regions, so that the silicon attracted each other.

According to laser Raman spectrometry measurement of the annealed silicon film, a peak is shifted from 522 cm$^{-1}$ of the single crystal silicon to a lower frequency side. The apparent grain diameter, when calculated using the half-value width, is 50 to 500 Å, like a micro crystal. Actually, many of these highly crystallized regions make up clusters. Each cluster is joined to the other by a silicon junction forming (i.e., anchoring) a semi-amorphous film.

Consequently, it is believed that the film could be said to have substantially no grain boundary (GB). The carriers can easily travel between the clusters through the anchored areas, so that the mobility of the carriers is higher than that of the poly-crystalline silicon having clear grain boundaries (GB).

The Hall mobility obtained is (μh)=10 to 200 cm$^2$/Vsec, and the electron mobility obtained is (μe)=15 to 300 cm$^2$/Vsec.

When the film is polycrystallized at a higher temperature of 900 to 12000° C. and not an intermediate temperature, as described above, segregation of impurities occurs due to the growth of solid phase from nucleus in the film, and there are a lot of impurities such as oxygen, carbon, nitrogen in GB. Therefore, the mobility is large in the crystal, but the movement of carriers is prohibited by the barrier at GB. Consequently, it is actually impossible to obtain the mobility of 10 cm$^2$/Vsec. or more.

This is one reason why a silicon semiconductor with a semi-amorphous or semicrystalline structure is used in this embodiment. Of course, other crystalline semiconductor materials having a high mobility can also be used in the present invention. FIG. 18(A) shows the silicon film which is photoetched using a first photomask 91, with the NTFT region 913 (20 um in channel width) prepared at the left side of the drawing and the PTFT region 922 at the right side.

A silicon oxide film is then formed as a gate insulation film in the thickness range of 500 to 2000 Å (e.g., 1000 Å). This is prepared under the same conditions as the silicone oxide film formed as a blocking layer. A small amount of fluorine may be added to this film for fixation of the sodium ion during film forming.

When this operation is completed, a silicon film is provided containing a 1 to 5×10$^{21}$ cm$^{-3}$ concentration of phosphorus. Molybdenum (Mo), tungsten (W), MoSi$_2$ or WSi$_2$ film may be optionally formed on this silicon film to form a multilayer film. The silicon film (or multilayer film) is patterned with a second photomask 92 to obtain the configuration shown in FIG. 18(B). An NTFT gate electrode 909 and a PTFT gate electrode 921 are then formed. For example, as a gate electrode, a phosphorus-doped silicon 0.2 μm thick is formed and a molybdenum layer 0.3 μm thick is formed thereon with a channel length of 10 μm.

Figure 18C:
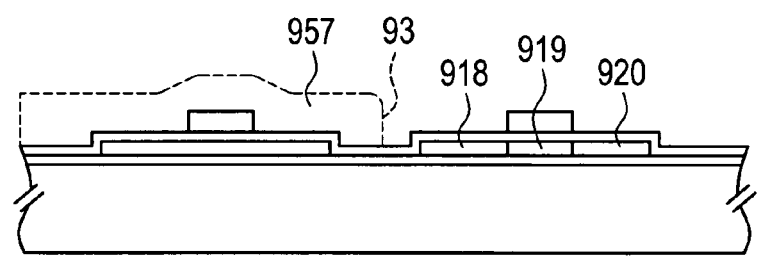
Figure 18D:
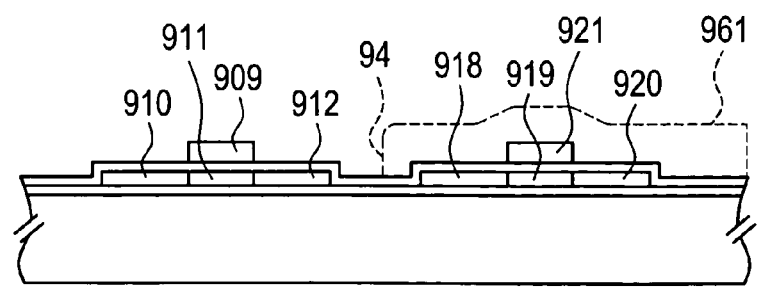
Figure 18E:
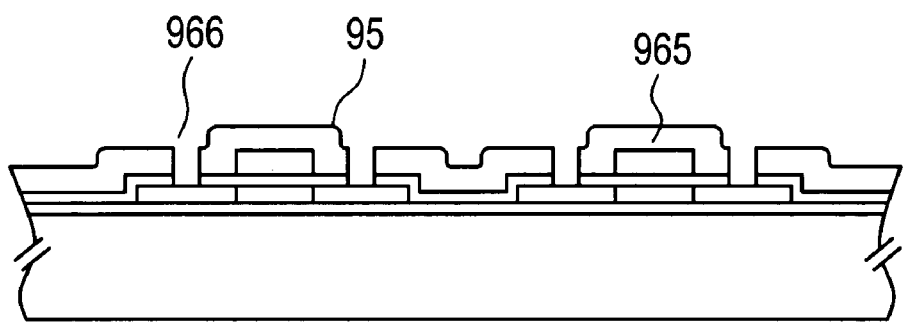

As shown in FIG. 18(C), a photoresist 957 is formed using a photomask 93, and boron is added using the ion implantation method at a dosage of 1 to 5×10$^{15}$ cm$^{-2}$ for the PTFT source 918 and drain 920. Next, as illustrated in FIG. 18(D), a photoresist 961 is formed using a photomask 94. Phosphorous is added using the ion implantation method at a dosage of 1 to 5×10$^{15}$ cm$^{-2}$ for an NTFT source 910 and drain 912.

Also, in the case where aluminum is used as the gate electrode material, after patterning with the second photomask 92, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

The doping above is made through a gate insulation film 954. However, in FIG. 18(B), using the gate electrodes 921, 909 as a mask, the silicone oxide on the silicone film may be removed followed by the addition of the boron and phosphorous directly into the silicon film using the ion implantation method.

Next, annealing is again conducted for 10 to 50 hours at 600° C. The impurities of the NTFT source 910 and drain 912, and the PTFT source 918, and drain 920, are activated to form P+ and N+ regions. The channels 919 and 911 below the gate electrodes 921 and 909 are made of a semi-amorphous semiconductor.

The entire manufacturing process for the C/TFT can thus be done without having to apply a temperature above 700° C. in the self-aligning system. This makes it possible to use materials other than expensive quartz as the substrate material. Accordingly, this embodiment of the invention is very suitable for a liquid crystal display having a large picture element.

The heat anneal process, shown in FIG. 18(A) and FIG. 18(D), is performed twice. However, the anneal process of FIG. 18(A) can be omitted, depending on the desired characteristics, and followed up with the heat anneal process of FIG. 18(D), thereby shortening the manufacturing time. Also, in FIG. 18(E), the interlayer insulation layer 965 is made of silicon oxide film using the sputtering method mentioned above.

This silicon oxide film can, however, also be formed using the LPCVD method or photo CVD method or normal pressure CVD method. The thickness of the insulation layer is e.g. 0.2 to 0.6 μm.

Next, using photo mask 95, a window 966 for the electrodes is formed. Then, a layer of aluminum is formed over the entire structure using the sputtering method, and leads 971 and 972 and contacts 967, 968 are made using photo mask 96. An organic resin film 969 for surface-flattening, e.g. a transparent polyimide resin film is formed, and electrode openings are provided using photomask 97.

Figure 18F:
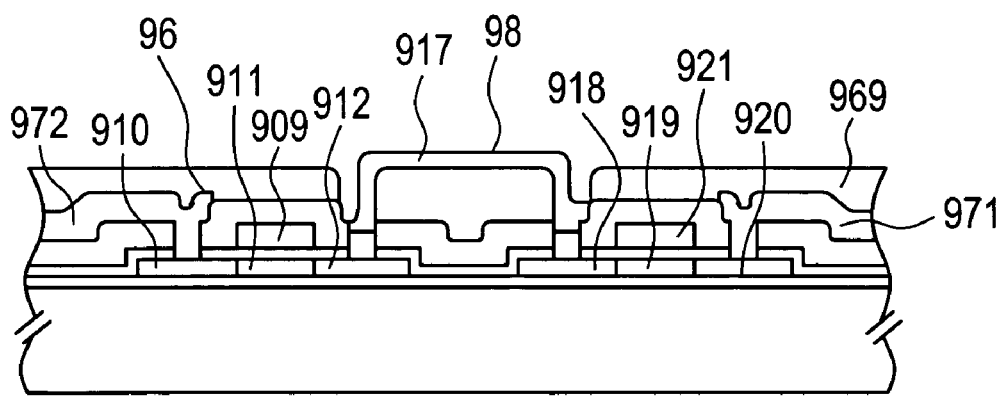

Two TFTS are formed in a complementary structure in a picture element of the liquid crystal display device as shown in FIG. 18(F). The output terminals of the TFTS are each connected to the (transparent) electrode of the picture element of the liquid crystal display device, forming the ITO (Indium Tin Oxide) by sputtering. The electrode 917 is completed by etching through the photomask 98.

The ITO film is formed in the range from room temperature to 150° C. and finished by annealing at 200° C. to 400° C. in oxygen or atmosphere. The NTFT 913, the PTFT 922 and the transparent electrode 917 are thus prepared on a single glass substrate 950.

The electrical characteristics of the TFT obtained thus are as follows:

mobility in the PTFT: 20 cm$^2$/Vs;

Vth in the PTFT: −5.9 V;

mobility in NTFT: 40 cm$^2$/Vs; and

Vth in NTFT: 5.0 V.

Another glass substrate, provided with a transparent electrode over the entire surface thereof, and the substrate fabricated according to the above-described method are combined to form a liquid crystal cell. A TN liquid crystal material is injected into the liquid crystal cell. FIG. 38 illustrates the positioning of the electrodes and the like for the liquid crystal display device according to this embodiment.

An NTFT 913 is provided at the intersection of a first signal line 905 and a third signal line 903, and, in the same manner, an NTFT for another picture element is provided at the intersection of the first signal line 905 and a third signal line 904. A PTFT is provided at the intersection of a second signal line 908 and the third signal line 903. Also, an NTFT for another picture element is provided at the intersection of another, adjacent first signal line 906 and the third signal line 903, while in the same manner an NTFT is provided at the intersection of the first signal line 906 and the third signal line 904.

The NTFT 913 is connected to the first signal line 905 through a contact on the input terminal on the drain 910, and the gate 909 is connected to a signal line 903 which is formed of multilayer wiring. The output terminal of the source 912 is connected to a picture element electrode 917 through a contact.

The PTFT 922 is connected to the second signal line 908 through a contact on the input terminal on the drain 920, wherein the gate 921 is connected to the signal line 903, and the output terminal of the source 918 is connected to the picture element electrode 917 through a contact in the same way as in the NTFT.

An adjacent C/TFT is connected to signal line 903, and the PTFT 922 of the C/TFT is connected to a second signal line 907. Also, the NTFT 913 of the adjacent C/TFT is connected to the first signal line 906.

One pixel comprising a picture element 923, formed from a transparent conducting film and a C/TFT, is interposed between this pair of signal lines 905 and 908. By repeating this type of configuration laterally and vertically, the 2×2 matrix can be expanded to form a large picture element liquid crystal display device of 640×480 or 1280×960 matrixes.

A special feature of the device of the present invention is that the picture element electrode 917 is set at three values of the liquid crystal potential $V_{LC}$ by providing a complementary configuration of two TFTs for one picture element.

Next, in order to form a second substrate, an ITO film (Indium Tin Oxide) is formed by sputtering on a substrate which is formed by laminating a silicon oxide film to a thickness of 2000 Å on glass plate by the sputtering process. This ITO film is formed in the range from room temperature to 150° C. and finished by annealing at 200° C. to 400° C. in oxygen or atmosphere.

A polyimide precursor member is printed on the above-mentioned substrate using the offset method and fired for one hour at 350° C. in an oxygen-free atmosphere (for example, in a nitrogen atmosphere). The polyimide surface is then reformed using a commonly known rubbing method, so that a means for orienting the liquid crystal molecules in a uniform direction in at least the initial stage is provided, whereby the second substrate is completed.

Next, the liquid crystal composition, having ferroelectricity, is interposed between the first and second substrates, and the assembly is sealed around the periphery using an epoxy-type adhesive. A drive IC of a TAB form is connected to a lead on the substrate and a polarizing plate is affixed to the outside to obtain a light-transmission type of liquid crystal display device.

FIG. 14 shows the display for the A, E, and C picture elements when the drive waveform shown in FIG. 16 is applied. In FIG. 14, darkness is expressed by a dot. A clear gradated display is obtained, as shown in FIG. 14.

In a second embodiment of the present invention, a first substrate and a second substrate are obtained using the same process as for the Embodiment 1. However, no polyimide film for alignment is formed on the second substrate. Since this device is made for use in a video camera viewfinder, the pitch of the picture element is 60 μm, and a matrix 200 high×300 wide is formed.

In this embodiment, a nematic liquid crystal composition is dispersed throughout an acrylic organic resin to form a dispersed-type liquid crystal display device. 62 wt % of the nematic liquid crystals is dispersed throughout an acrylic resin denatured with an ultraviolet-curable epoxy. This material is interposed between the first and second substrates, and is then cured by the application of a light beam from a UV light source with a 1000 mW output for 20 sec.

This display device is time-shared into 16 separate time periods to provide a gradated display, and each color has 16 gradations, to give a liquid crystal display device which can display a total of 4096 colors. The drive wave form at that time is shown in FIG. 19.

In summary, a plurality of write-in entries (display frames) is provided in conventional gradated display methods. For example, 16 frames are utilized to provide a method for presenting a gradated display by a combination of their ON/OFF states. If, in a total 16 frames, eight frames are ON and the remaining eight frames are OFF, a gradated display results at a 50% transmission, which is the average transmittance in this case. If, however, four frames are ON and the remaining 12 frames are OFF, the average transmittance becomes 25% and a gradated display occurs at this transmission.

When this conventional method is used, there is a strong possibility that the number of frames is less than the lowest confirmed number of frames (30 frames) which is the minimum number of frames that can be discerned by the human eye. This is the main cause of a drop in the quality of the display.

In this embodiment, where the frequency of the driver is increased to provide a gradated display in accordance with the present invention, a gradated display becomes possible preventing the actual frame frequency from decreasing. Therefore, the frequency is never lower than a visually confirmed frequency, so that a drop in display quality does not occur, and a high quality picture can be provided.

By using the same type of process and drive method it is possible to provide a word processor screen, a computer screen, or a device for projecting a visual image display.

Figure 9:
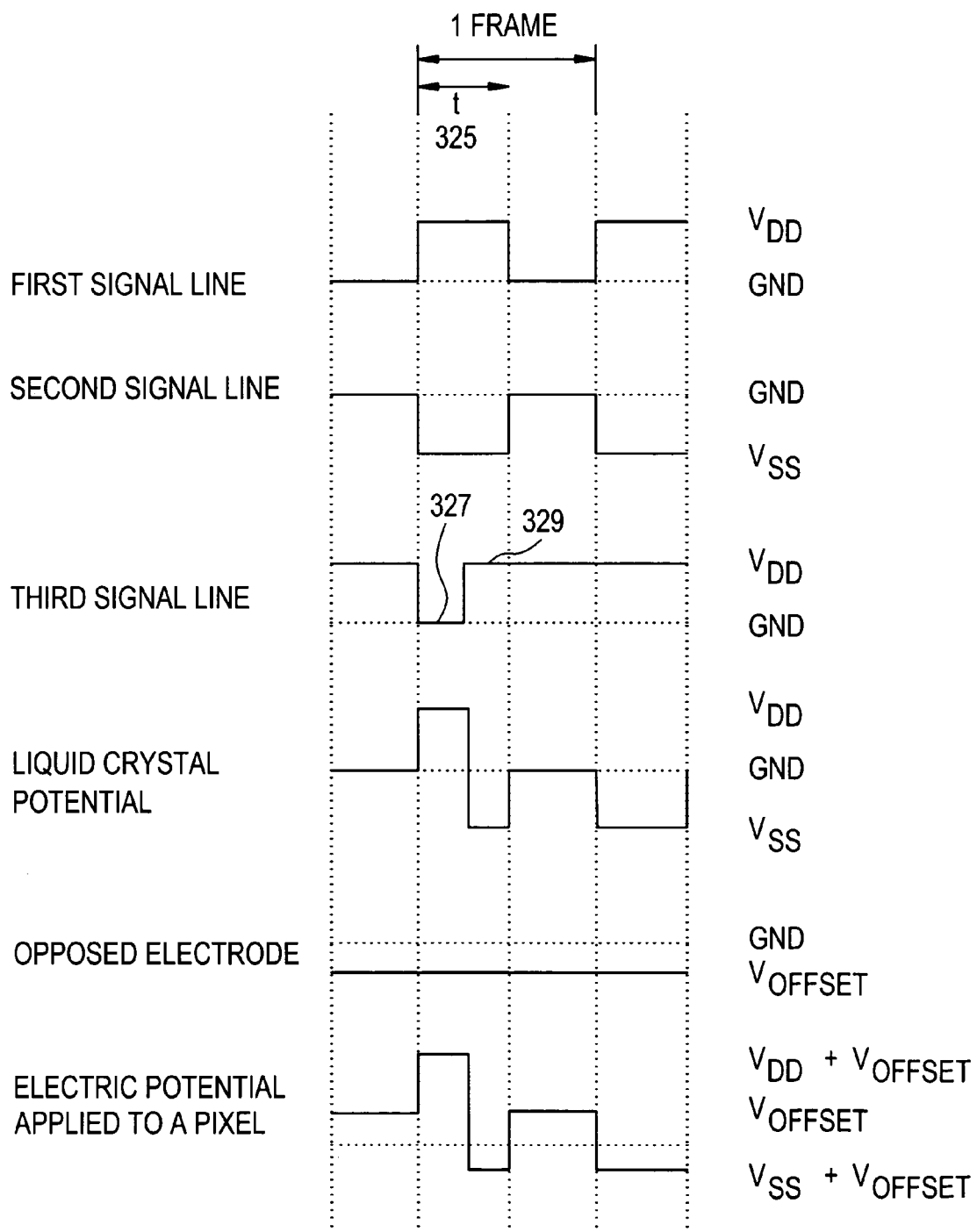
FIG. 9 illustrates a graph showing an example of the drive waveforms in accordance with the present invention.
Figure 10:
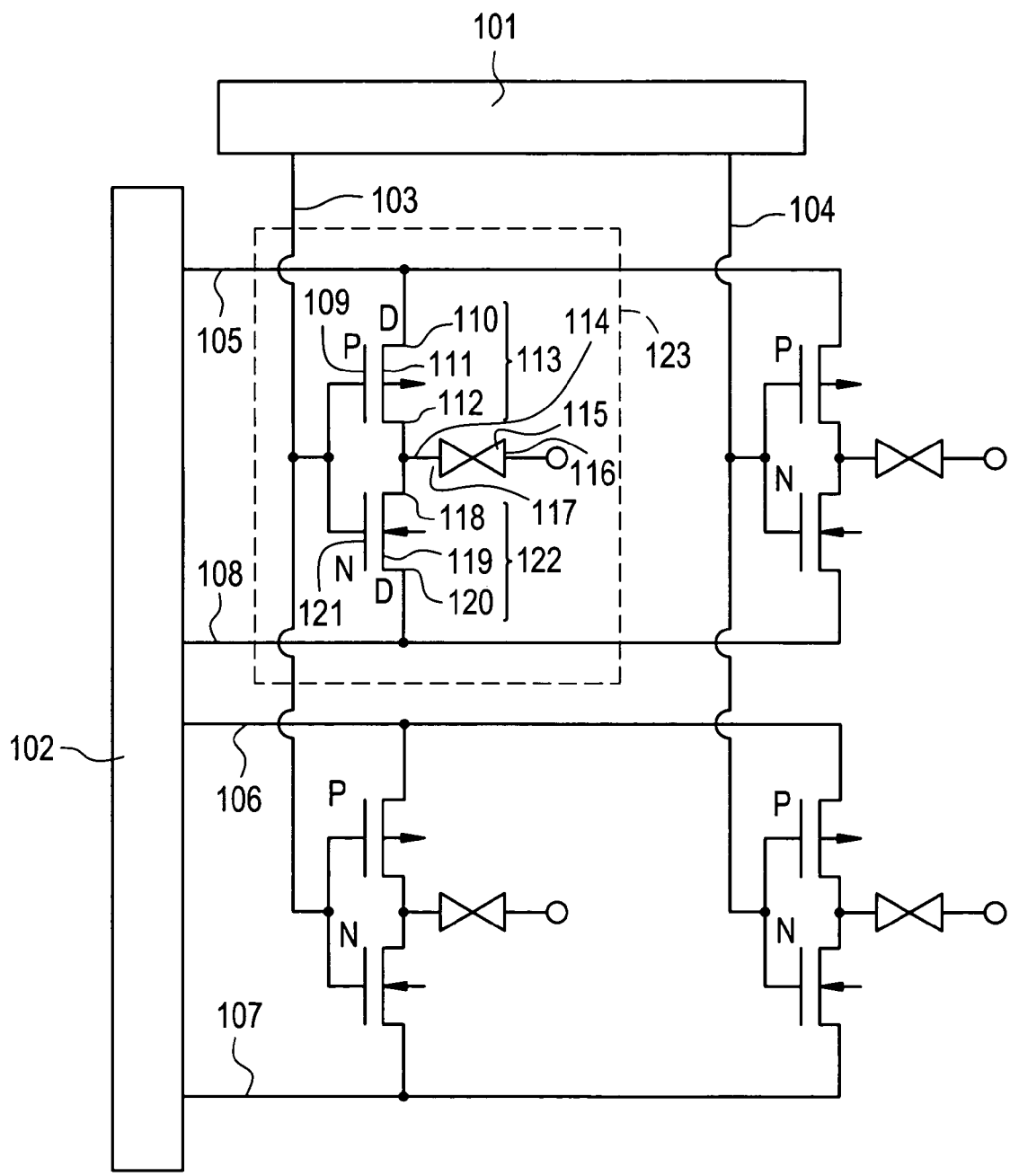
FIG. 10 shows an example of the circuit configuration of a liquid crystal electro-optical device in accordance with the present invention.
Figure 11:
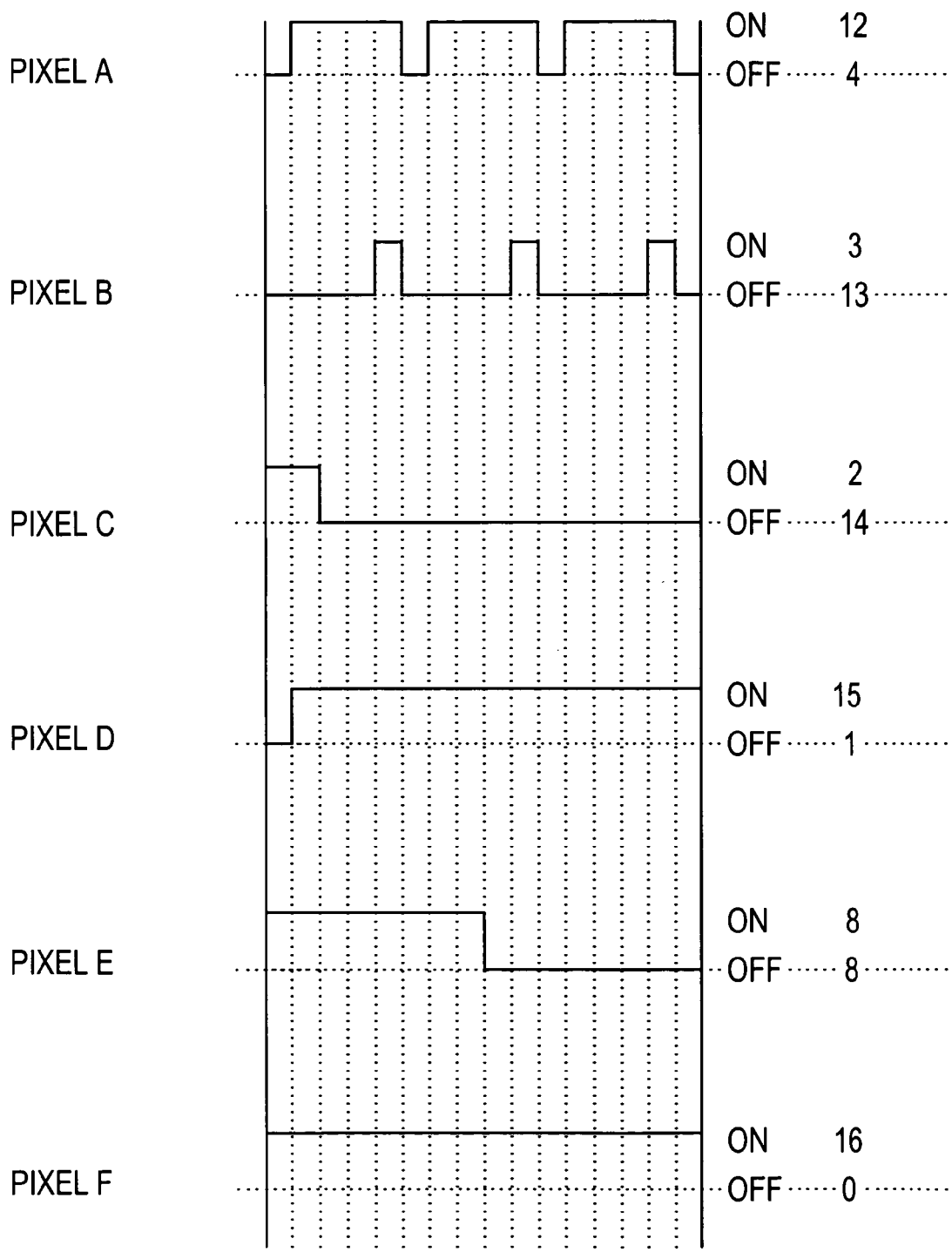
FIG. 11 illustrates a graph showing another example of conventional drive waveforms.
Figure 12:
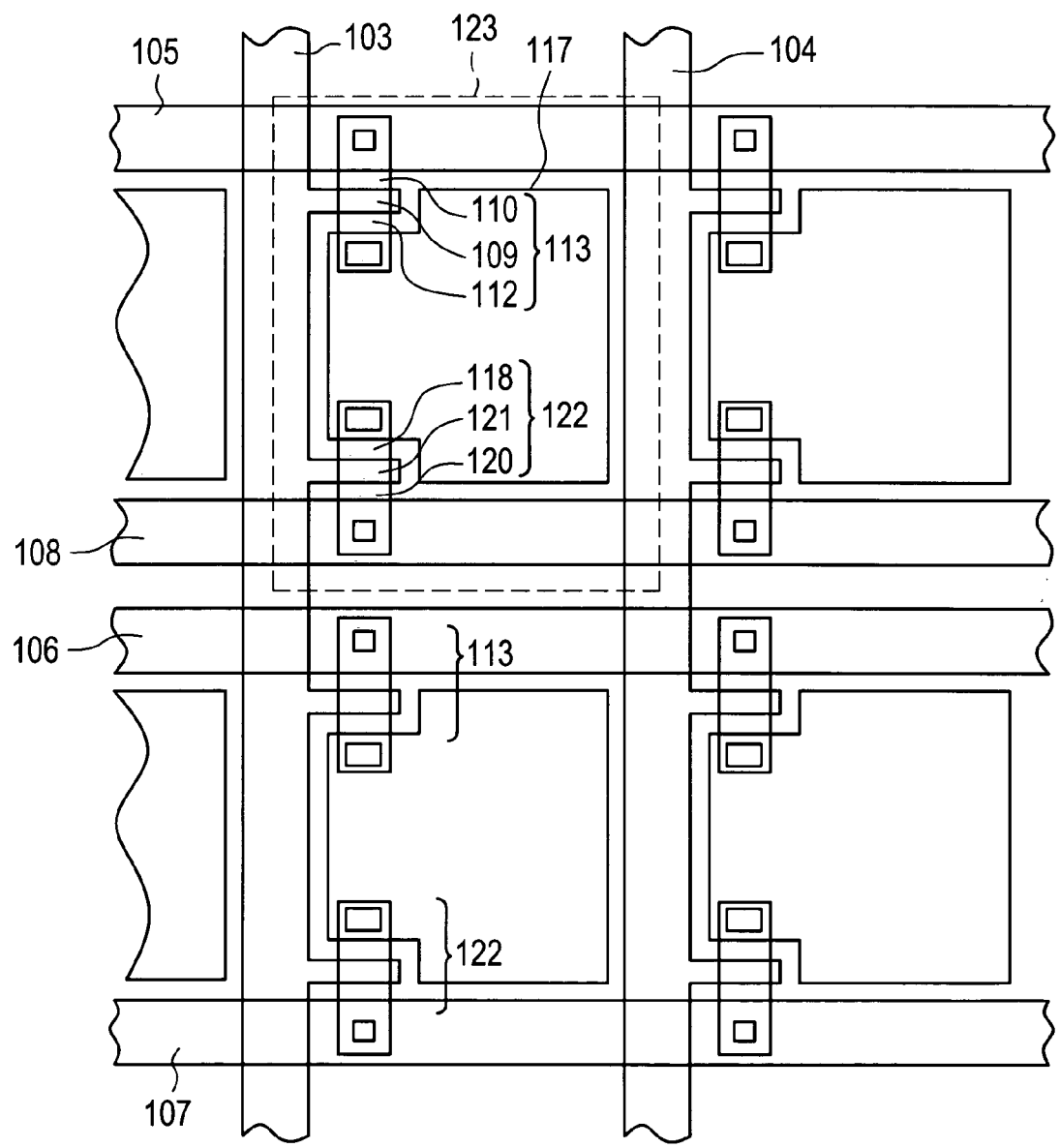
FIG. 12 shows a layout of electrodes and the like of one embodiment of the present invention.

The liquid crystal electro-optical device utilized in a third embodiment of the present invention has the circuit configuration shown in FIG. 10, namely, the circuit configuration of inverter type. FIG. 12 shows the layout of the actual electrodes and the like corresponding to the circuit configuration of FIG. 10. In order to simplify the explanation, the parts corresponding to a 2×2 matrix only are described. Also, the actual driving signal waveform is shown in FIG. 9.

Figure 13A:
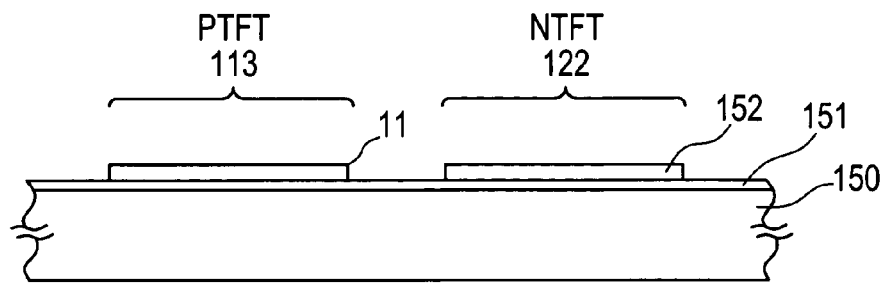
FIGS. 13(A) to 13(F) illustrate cross-sectional views to show the formation process of a substrate of the present invention.
Figure 13B:
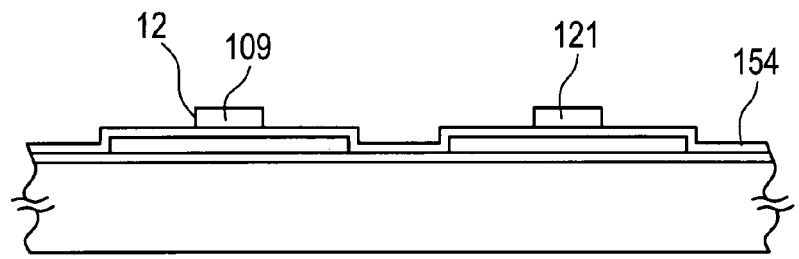
Figure 13C:
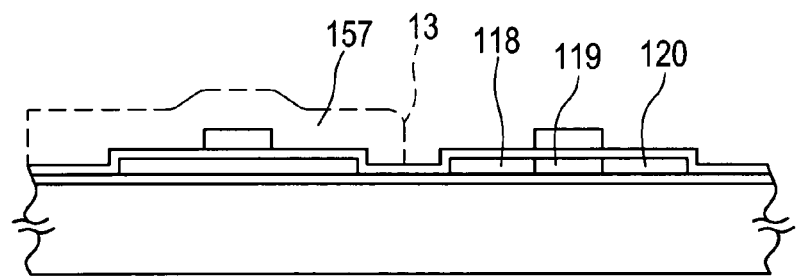
Figure 13D:
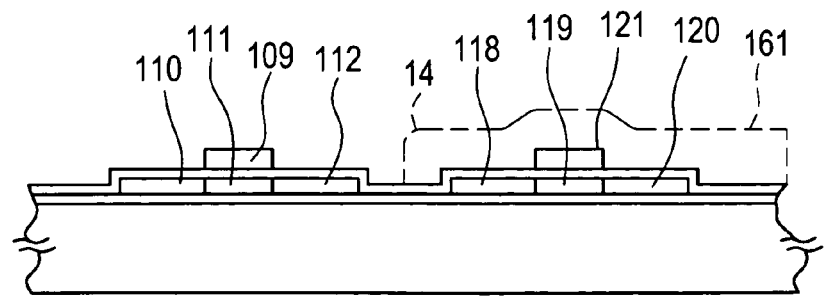
Figure 13E:
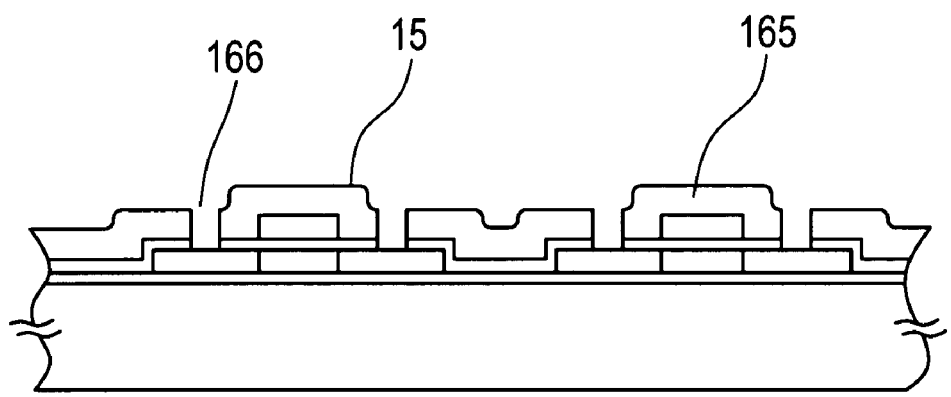
Figure 13F:
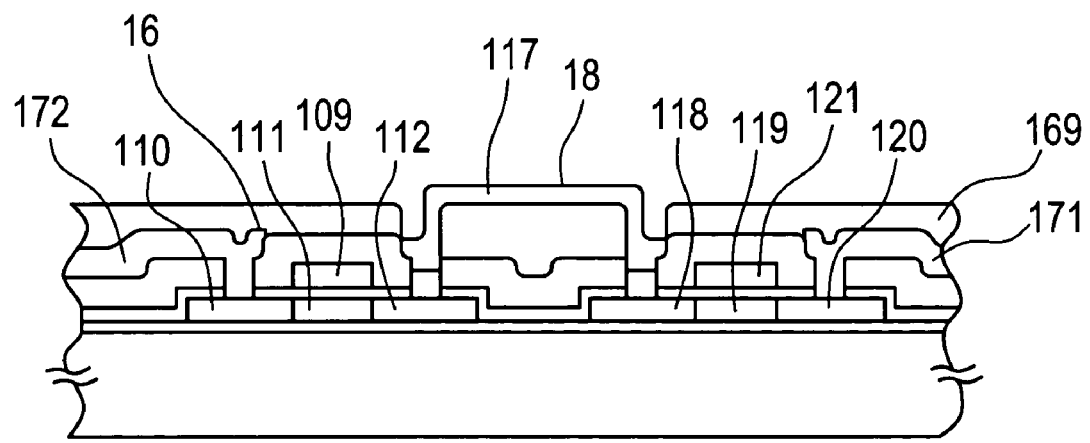

The process for forming a substrate for the liquid crystal electro-optical device utilized in this embodiment is shown in FIGS. 13(A) to (F). In accordance with the process shown in FIGS. 13(A) to (F), the substrate shown in FIG. 13(F) is formed in the same manner as in Embodiment 1. The substrate has the same structure as that in Embodiment 1 except that the location of a PTFT and an NTFT thereof is opposite to that of Embodiment 1, as shown in FIGS. 10 and 13. With the obtained substrate, a light-transmission type liquid crystal electro-optical device is completed as in Embodiment 1.

In the fourth embodiment of the present invention, a first substrate and a second substrate are obtained using the same process as described with respect to the third embodiment. However, an orientation film made of polyimide is not formed on the second substrate. With these first and second substrates, a liquid crystal electro-optical device for use in a video camera viewfinder is formed at a pitch of a picture element of 60 μm, and a matrix 200 high×300 wide in the same way as in Embodiment 2.

In this embodiment, where the frequency of the driver is increased for providing a gradated display of the present invention, a gradated display becomes possible, preventing the actual frame frequency from decreasing. Therefore, the frequency never becomes lower than a visually confirmed frequency, so that a drop in display quality does not occur, and a high quality picture can be provided.

By using the same type of process and drive method it is possible to provide a word processor screen, a computer screen, or a device for projecting a visual image display.

Figure 15:
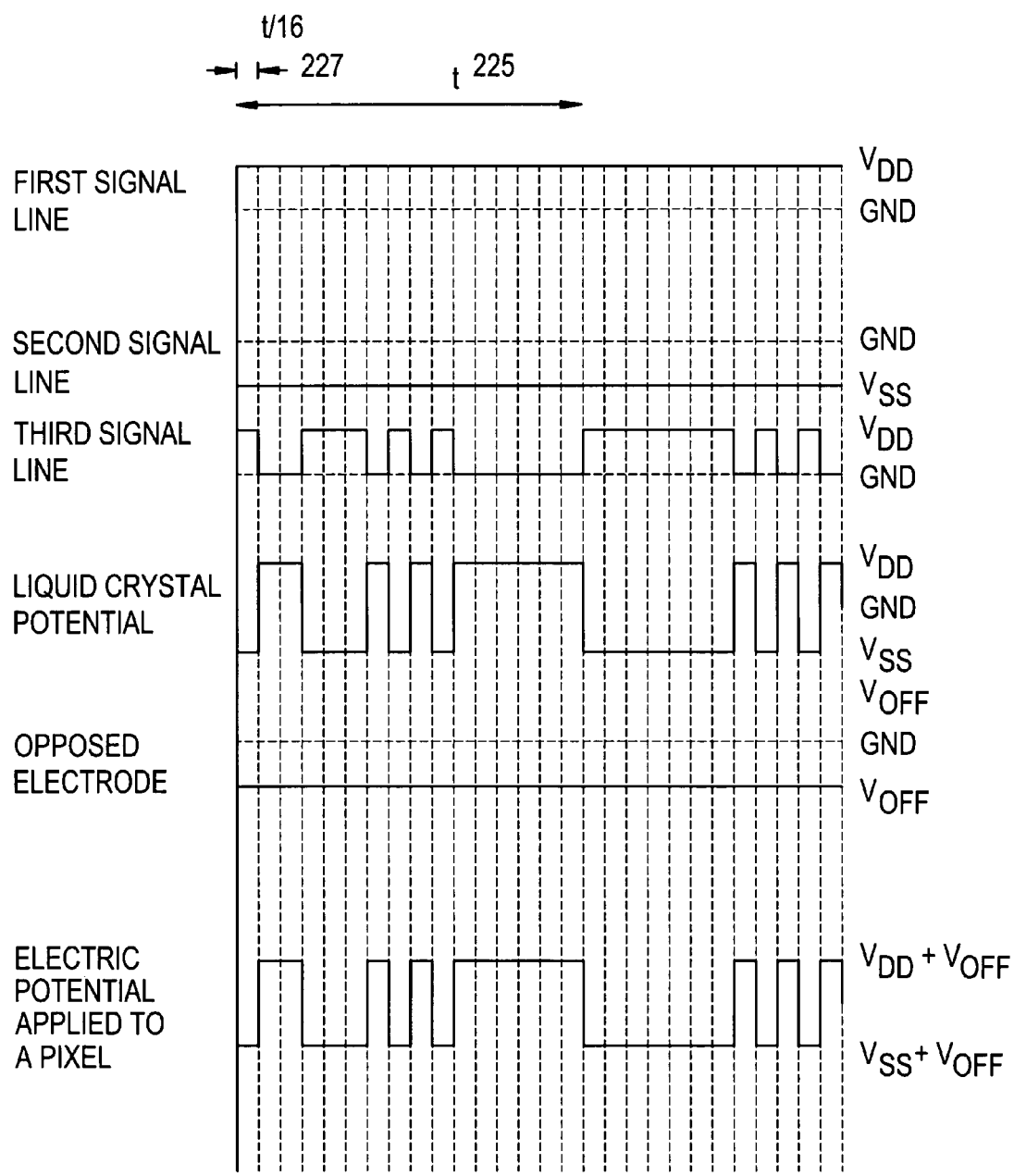
FIG. 15 illustrates a graph showing another example of the drive waveforms in the present invention.

In the drive method of the present invention shown in FIG. 15 where the unit time $t_{225}$ for writing-in a picture element is divided into 16 minimum units (a period of each minimum unit 227 is t/16), each color is displayed with 16 gradations, so that a display with 4096 colors is possible in total.

Figure 3:
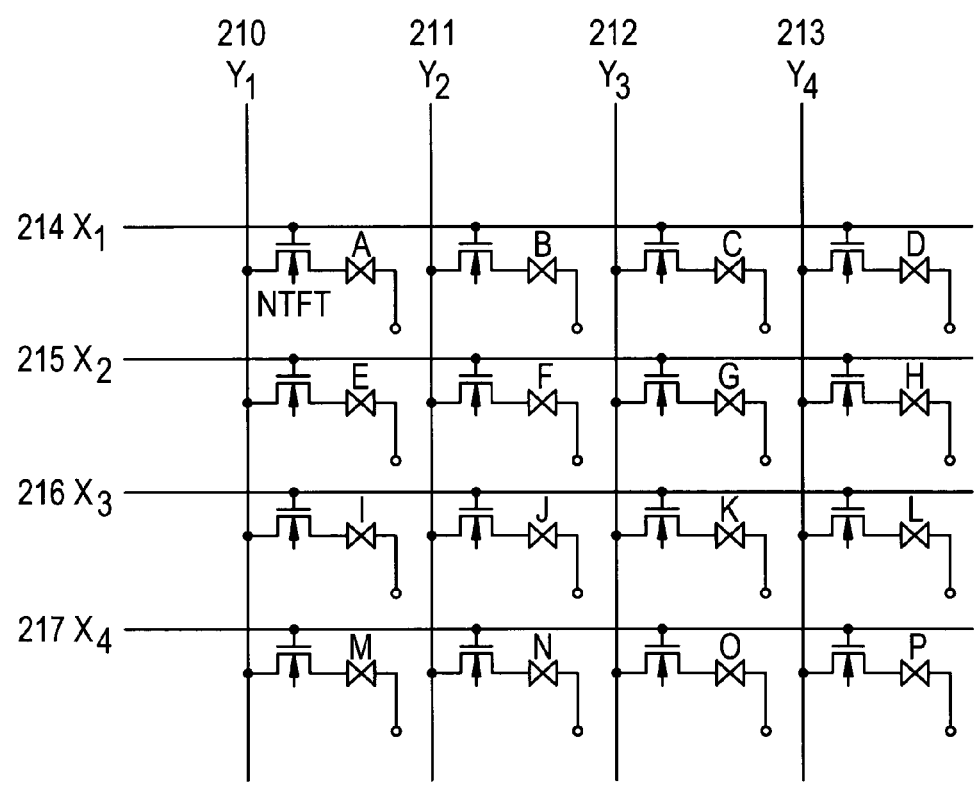
FIG. 3 illustrates an electric circuit of the NTFT matrix.
Figure 4:
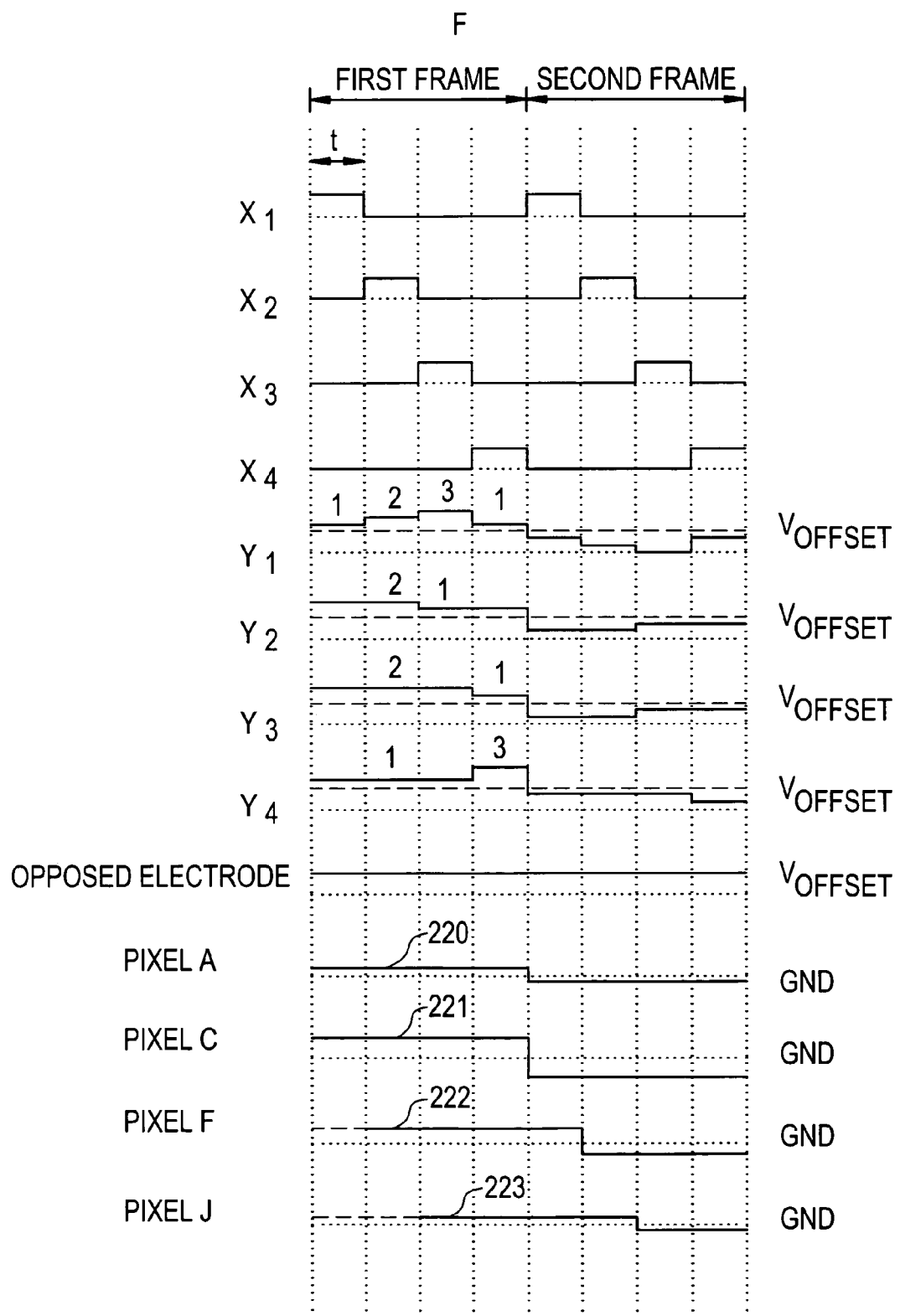
FIG. 4 illustrates a graph showing an example of the drive waveforms in the prior art device.
Figure 5:
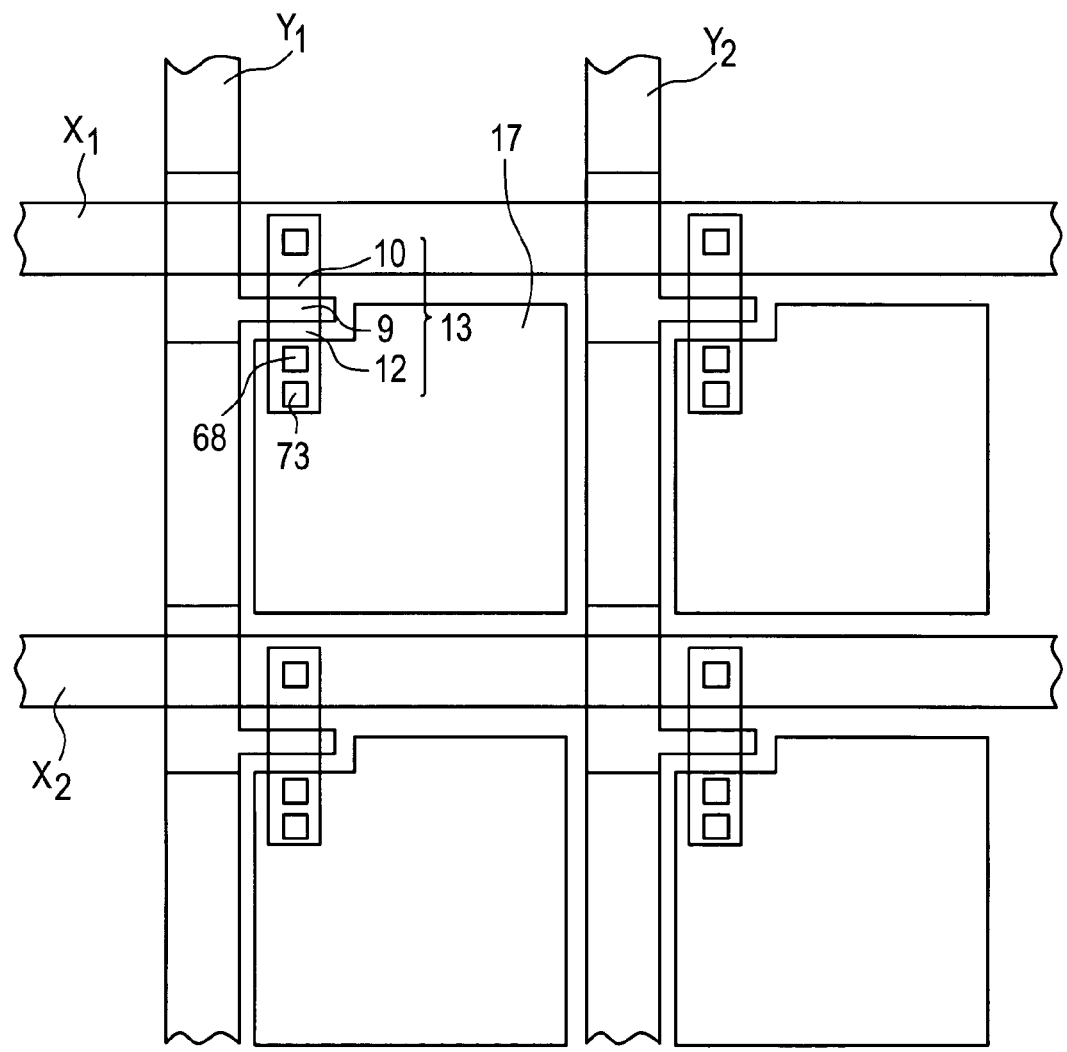
FIG. 5 illustrates a partly cut-away plan view of the device of an embodiment in the present invention.

In the fifth embodiment of the present invention, a liquid crystal display device with the circuit configuration shown in FIG. 3 is used. FIG. 5 shows the layout of the actual electrodes and the like corresponding to the circuit configuration of FIG. 3.

Figure 1:
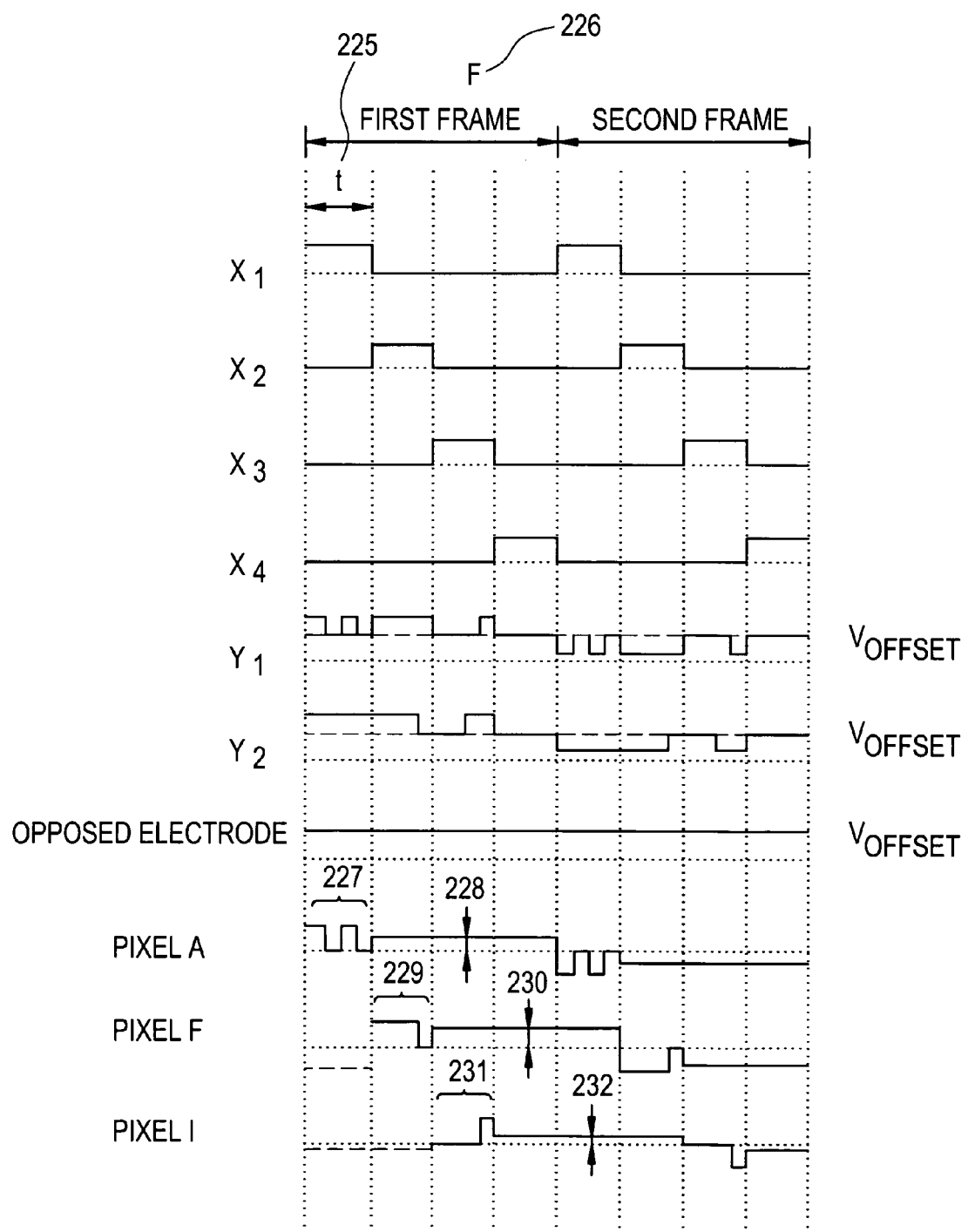
FIG. 1 illustrates a graph showing an example of the drive waveforms in this invention.

In order to simplify the explanation, the parts corresponding to a 4×4 matrix (2×2 matrix) only are described. Also, the actual driving signal waveform is shown in FIG. 1. For simplicity, the explanation of the signal waveform is also given for the case of 4×4 matrix configuration.

Figure 6A:
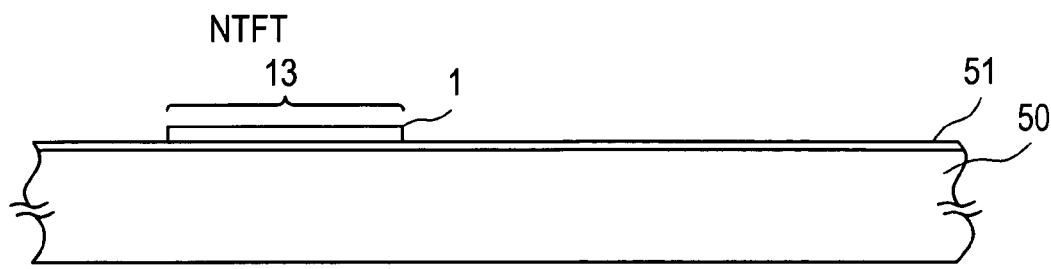
FIGS. 6 (A) to 6 (G) are cross-sectional views to show the manufacturing process of an example of this invention.

The manufacturing process for the liquid crystal display device used in this embodiment is shown in FIGS. 6(A)-6(D). In FIG. 6(A), a silicon oxide film for a blocking layer 51 having a thickness of 1000 to 3000 angstroms is formed on a glass substrate 50, using a magnetron RF (high frequency) sputtering method. The glass substrate 50 utilized is the one which is not expensive unlike quartz glass and is resistant to heat treatment up to 700° C. e.g. of 600° C. The conditions for the process are as follows:

Atmosphere: 100% oxygen;
Film Formation Temperature: 150° C.;
Output Power: 400-800 W; and
Pressure: 0.5 Pa.

The film formation, using either quartz or single-crystal silicon for a target, has a speed of 30 to 100 Å/min.

On the top surface thereof, a silicon film in an amorphous state having a thickness of 500 to 5000 Å, e.g. 1500 Å, is formed as in Embodiment 1. In the case of using low pressure CVD method to form the amorphous silicon film as in Embodiment 1, boron may be added at a concentration of $1\times10^{15}$ to $1\times10^{18}$ cm$^{-3}$ by the use of diborane during the film formation, in order to control the threshold voltage (Vth) of the NTFT.

Then, in the same manner as in Embodiment 1, the silicon film in an amorphous state is heat-annealed at an intermediate temperature of 450 to 700° C. for 12 to 70 hours under a non-oxide atmosphere. Then, an NTFT region 13 is obtained from the silicon film by the use of a first photomask 1.

A silicon oxide film is then formed as a gate insulating film 54 in the thickness range of 500 to 2000 Å (e.g., 1000 Å). This is prepared under the same conditions as the silicone oxide film formed as a blocking layer. A small amount of fluorine may be added to the film for fixation of the sodium ion during the film formation.

When this operation is completed, a silicon film containing a 1 to $5\times10^{21}$ cm$^{-3}$ concentration of phosphorus, or a multi-layered film comprising the silicon film laminated thereon with molybdenum (Mo), tungsten (W), MoSi$_2$ or WSi$_2$ film is formed. The film is then patterned with a second photomask 2 to obtain the configuration shown in FIG. 6(B). Phosphorus is added by ion implantation method at a dosage of 1 to $5\times10^{15}$ cm$^{-2}$ for a NTFT source 20 and drain 18, using the gate electrode 9 as a mask.

Also, in the case where aluminum is used as the gate electrode material, after patterning with the second photomask 2, it is possible to form source and drain contact holes at positions closer to the gate by anodic oxidation of the surface of the patterned aluminum gate electrode so that self-aligning construction can be applied. Therefore, the TFT characteristics can be further increased by improving the mobility and decreasing the threshold voltage.

Figure 6B:
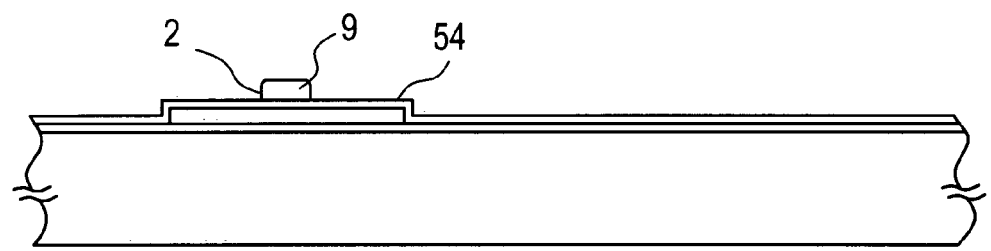
Figure 6C:
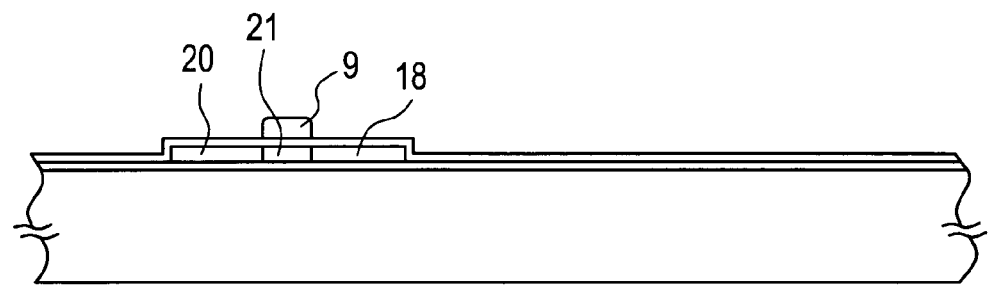
Figure 6D:
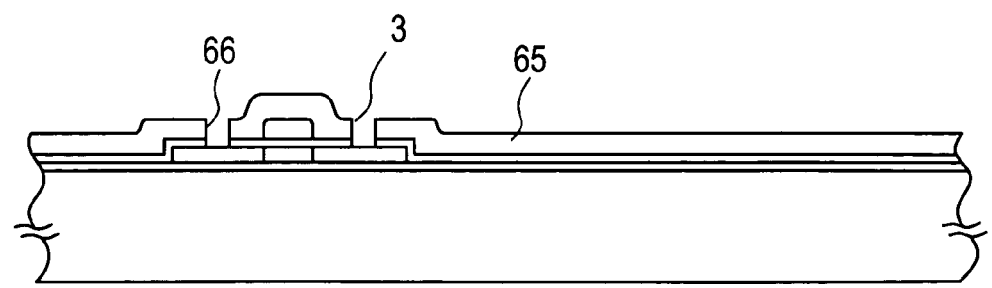
Figure 6E:
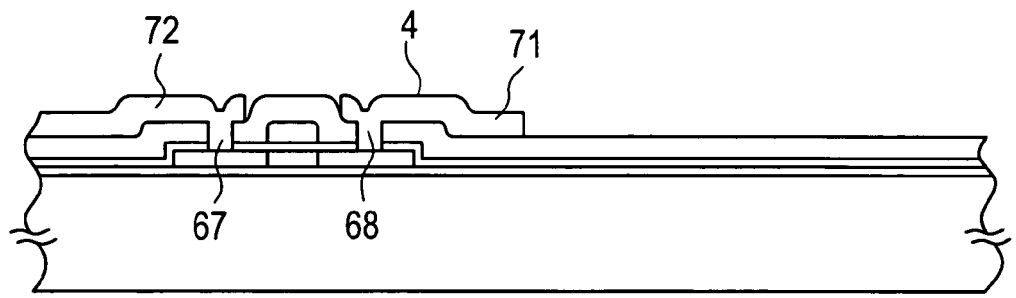

The above-described process is carried out through the gate insulating film 54. However, as illustrated in FIG. 6(B), it is possible to remove the silicon oxide formed on the silicon film using the gate electrode 9 as a mask and then add the phosphorus directly into the silicon film using the ion implantation method.

Next, annealing is again conducted for 10 to 50 hours at 600° C. The impurities are activated whereby the source 20 and drain 18 of the NTFT are made N$^+$ regions. A channel forming region 21 of semi-amorphous semiconductor is formed below the gate electrode 9.

The entire manufacturing process for the NTFT can thus be done without having to apply a temperature above 700° C. in spite of the self-aligning system. Thus, it is possible to use materials other than expensive ones such as quartz for the substrate material. Accordingly, this embodiment of the invention is very suitable for a liquid crystal display having a large number of pixels.

The heat anneal process is carried out twice as shown in FIGS. 6(A) and (C). However, the anneal process of FIG. 6(A) may be omitted, depending on the desired characteristics, and followed up with the heat anneal process of FIG. 6(C), thereby shortening the manufacturing time. Also, in FIG. 6(D), the interlayer insulating layer 65 is made of silicon oxide film using the sputtering method mentioned above.

The silicon oxide film can, however, also be formed using the LPCVD method or photo CVD method or normal pressure CVD method. The thickness of the film is e.g. 0.2 to 0.6 μm.

Next, using photo mask 3, an opening 66 for the electrodes is formed. Then, a layer of aluminum is formed on the entire surface by sputtering, and leads 71 and 72 and contacts 67, 68 are formed by using photo mask 4. An organic resin film 69 for surface-flattening, e.g. a transparent polyimide resin film is formed, and openings for electrodes are provided using a photomask 5.

Figure 6F:
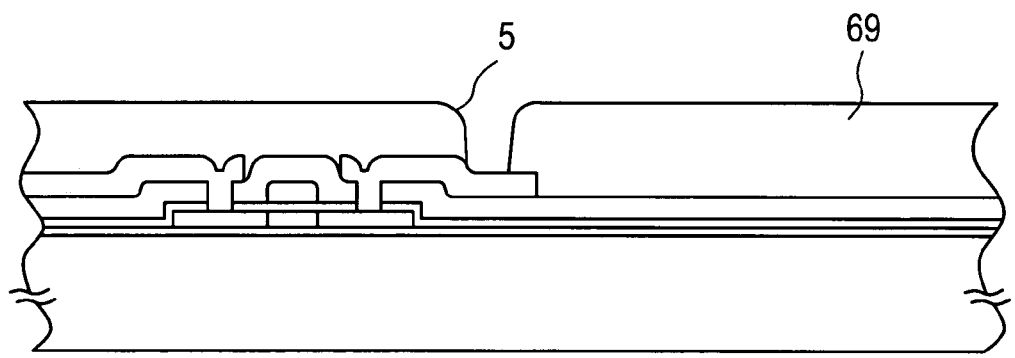
Figure 6G:
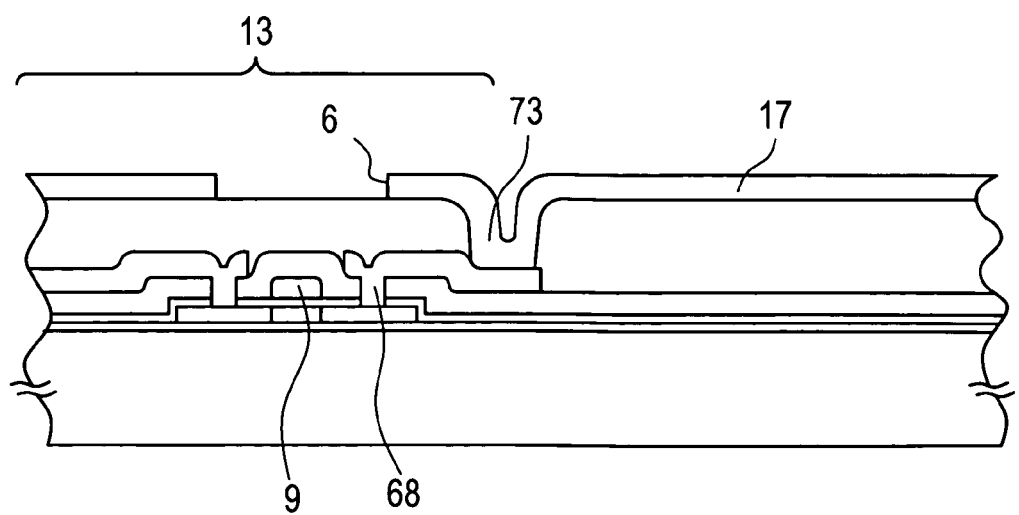

The TFT is thus formed as shown in FIG. 6(F), and further an ITO (Indium Tin Oxide) film is formed by sputtering so that the output terminal of the TFT is connected to a transparent electrode of the picture element of the liquid crystal display device by the ITO.

The electrode is completed by etching the ITO film through a photomask 6, whereby a pixel electrode 17 and a contact 73 of the pixel electrode with the drain electrode are completed. This ITO film is formed in the range from room temperature to 150° C. and annealed at 200° C. to 400° C. in oxygen or atmosphere.

The NTFT 13 and the transparent pixel electrode 17 are thus prepared on an identical glass substrate 50. The electrical characteristics of the TFT formed are as follows:

mobility: 40 cmcm$^2$/Vs; and
Vth: 5.0V.

The first substrate is thereby completed.

A second substrate is manufactured in the same manner as the second substrate of the first embodiment. Next, the liquid crystal composition exhibiting ferroelectricity is interposed between the first and second substrates, and the assembly is sealed around the periphery using an epoxy-type adhesive. A drive IC of a TAB form is connected to a lead on the substrate and a polarizing plate is affixed to the outside to obtain a light-transmission type of liquid crystal display device.

FIG. 7 shows the display for the A, F, and I picture elements when the drive waveform shown in FIG. 1 is applied. FIG. 7 additionally shows that a clear gradated display is obtained.

In a sixth embodiment of the present invention, a first substrate and a second substrate are obtained using the same process as for the fifth embodiment. However, an orientation film made of polyimide is not formed on the second substrate. With these first and second substrates, a liquid crystal electro-optical device for use in a video camera viewfinder is formed at a pitch of a picture element of 60 μm and a matrix 200 high×300 wide in the same way as in the second embodiment of the present invention.

Figure 8:
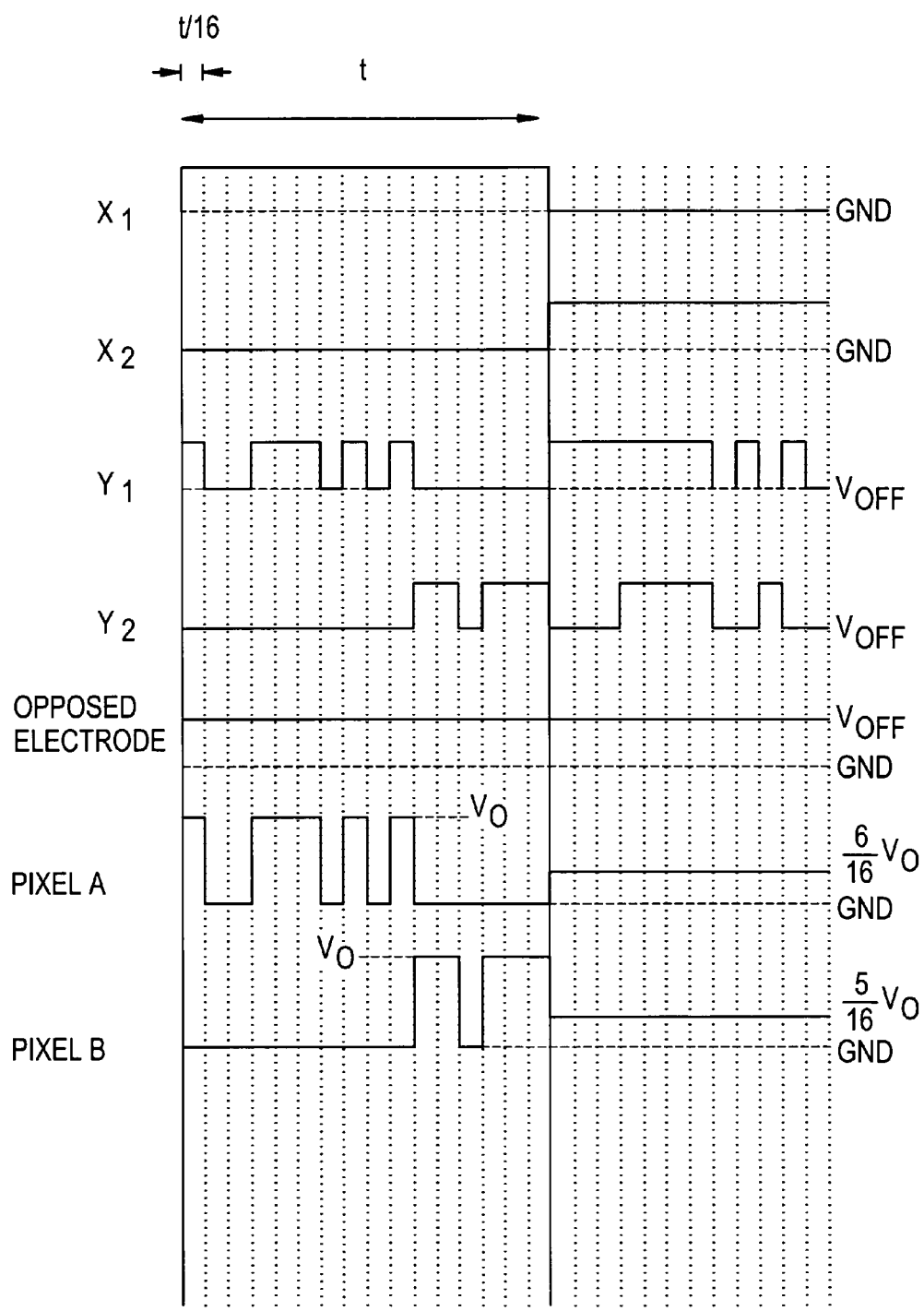
FIG. 8 shows another example of the drive waveforms in this invention.

In the drive method of the present invention shown in FIG. 8, where the unit time t for writing-in a picture element is divided into 16 minimum units (a period of each minimum unit is t/16), each color is displayed with 16 gradations, so that a display with 4096 colors is possible in total.

In this embodiment, where the frequency of the driver is increased for providing a gradated display of the present invention, a gradated display becomes possible, thereby preventing the actual frame frequency from decreasing. Therefore, the frequency never becomes lower than a visually confirmed frequency, so that a drop in display quality does not occur, and a high quality picture can be provided.

The quality of gradated displays can be improved over conventional displays by performing the above-mentioned conventional method for gradated display together with the method for gradated display in accordance with the present invention. The method of the present invention is to control the average voltage applied to a liquid crystal pixel, where complete response of liquid crystal is not required.

Figure 2:
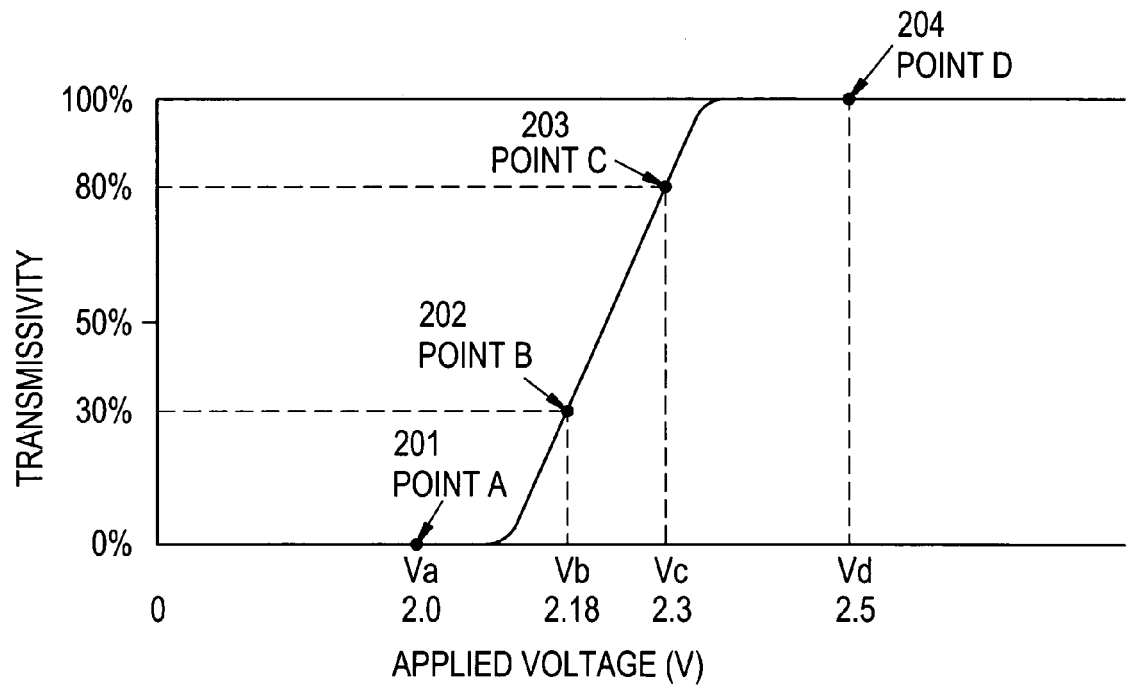
FIG. 2 illustrates a graph showing the electro-optical characteristics of the nematic liquid crystal.

Conventionally, it was difficult to directly apply the voltages $V_b$ and $V_c$ shown in FIG. 2 to pixels. However, by changing the average of the voltage applied to pixel electrodes, an effect can be obtained as if the voltages $V_b$ and $V_c$ are directly applied to pixels.

In other words, the present invention provides a method for controlling liquid crystal which responds incompletely. Although only N-channel field effect transistors are utilized in this embodiment, P-channel field effect transistors may also be utilized.

Figure 21:
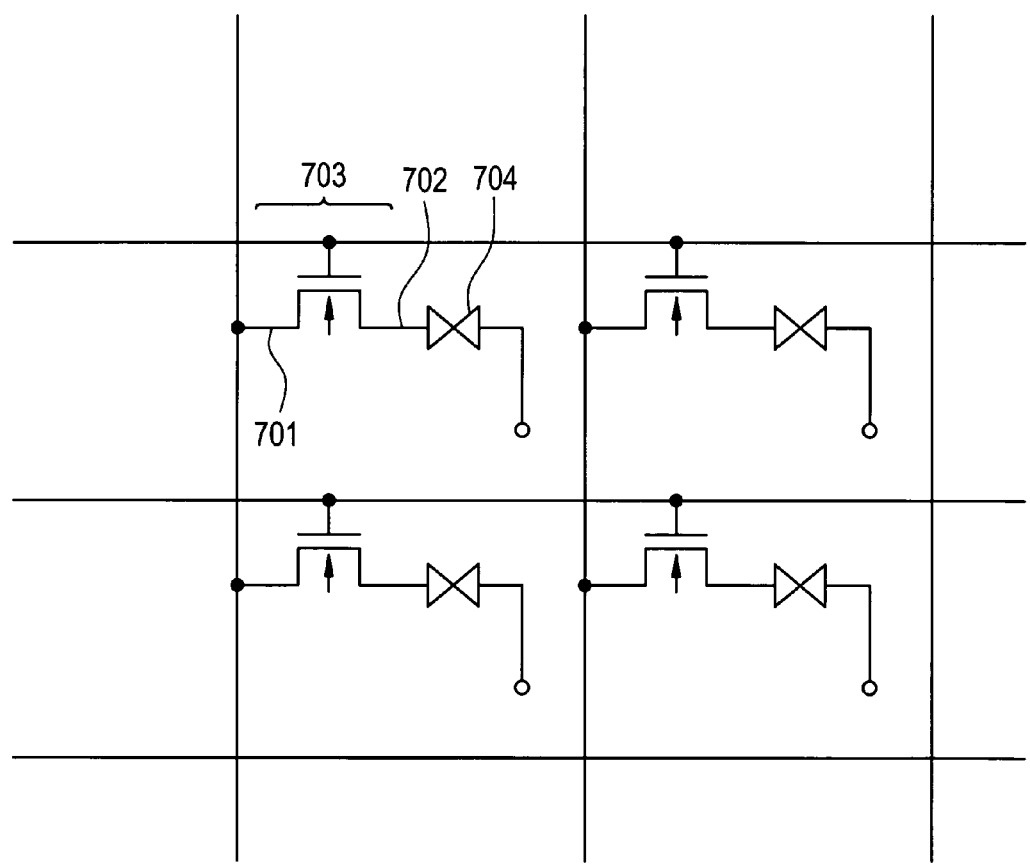
FIG. 21 illustrates another example of the circuit configuration of a liquid crystal electro-optical device of the present invention.

In the seventh embodiment of the present invention, a liquid crystal electro-optical device (image display device) with the circuit configuration shown in FIG. 21 is utilized as a television to be placed on a wall, for example. The TFTs utilized therein are made of polycrystal silicon subjected to laser annealing and are of stagger type.

Figure 37:
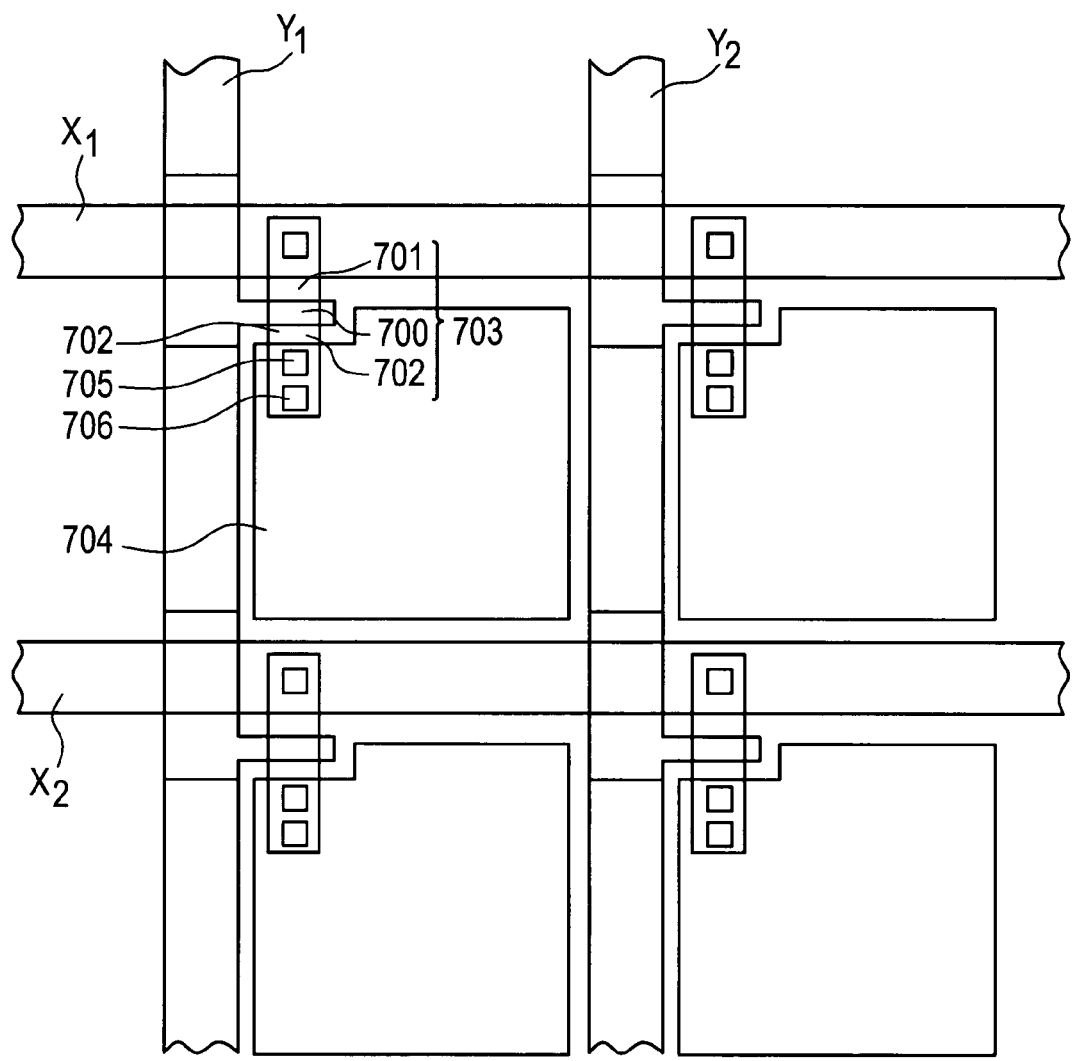
FIG. 37 illustrates a layout of electrodes and the like of another embodiment of the present invention.

Referring to FIG. 21, a gate electrode 700, a source 701, a drain 702, a NMOSTFT 703, and a pixel electrode 704 are shown. Also illustrated in FIG. 21 is a lead contact 705 and a pixel contact 706. The layout of the actual electrodes and the like corresponding to the circuit configuration in FIG. 21 is shown in FIG. 37. To simplify the explanation, the parts corresponding to a 2×2 (or less) matrix only are described. Also, the reference numerals are made so as to correspond to those in FIG. 21. Further, the actual driving signal waveform is shown in FIG. 1. For simplicity, the explanation of the signal waveform is also given for the case of 4×4 matrix configuration.

Figure 22A:
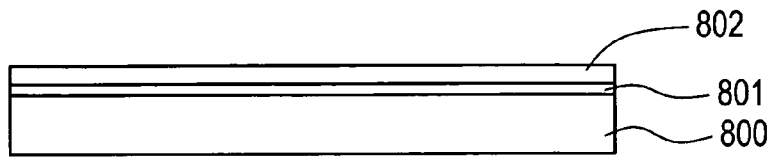
FIGS. 22(A) to 22(I) are cross-sectional views to show the manufacturing process of another example of the present invention.

The manufacturing process for the liquid crystal display device used in this embodiment is shown in FIGS. 22(A)-22(I). In FIG. 22(A), a silicon oxide film for a blocking layer 801 having a thickness of 1000 to 3000 angstroms is formed on a glass substrate 800, using a magnetron RF (high frequency) sputtering method. The glass substrate 800 utilized is the one which is not expensive unlike quartz glass and is resistant to heat treatment up to 700° C. e.g. of 600° C. The conditions for the process are as follows:

Atmosphere: 100% oxygen;
Film Formation Temperature: 150° C.;
Output Power: 400-800 W; and
Pressure: 0.5 Pa.

The film formation, using either quartz or single-crystal silicon for a target, has a speed of 30 to 100 Å/min.

On the silicon oxide film, a silicon film in an amorphous state is formed. In the case of using plasma CVD method to form this amorphous silicon film, the film formation temperature is from 250° C. to 350° C. (e.g. 320° C. in this embodiment), and monosilane ($SiH_4$) is utilized. However, disilane ($Si_2H_6$) or trisilane ($Si_3H_8$) may be utilized instead of monosilane. The gas is inputted to a PCVD apparatus, maintained at a pressure of 3 Pa and a high frequency electric power, is applied thereto at a frequency of 13.56 MHz, whereby the silicon film is deposited. A high frequency electric power of 0.02 to 0.10 W/cm$^2$ is appropriate in this case, and in this embodiment a high frequency electric power of 0.055 W/cm$^2$ is applied. The flux of the monosilane is at 20SCCM and the film formation rate under this condition is about 120 Å/min.

Boron may be added at a concentration of $1\times10^{15}$ to $1\times10^{18}$ cm$^{-3}$ by using diborane during the film formation, in order to control the threshold voltage (Vth) of the NTFT.

Not only this plasma CVD method but also sputtering method and low pressure CVD method can be utilized for forming the silicon film to be a channel region in a TFT. In the case of using a sputtering method, the conditions are as follows:

back pressure before sputtering: up to $1\times10^{-5}$ Pa;
target: a single crystal silicon;
atmosphere: argon with hydrogen 20 to 80% by volume,
    e.g. 20 volume % Ar and 80 volume % $H_2$;
the film forming temperature: 150 C;
frequency: 13.56 MHz;
sputter output: 400 to 800 W; and
pressure: 0.5 Pa.

If using the LPCVD method to form the silicon film, disilane ($Si_2H_6$) or trisilane ($Si_3H_8$) is supplied to the CVD apparatus at a temperature 100 to 200° C. less than the crystallization temperature (i.e., 450 to 550° C., for example at 530° C.). The pressure inside the reaction furnace is 30 to 300 Pa. The film forming speed is 50 to 250 Å/minute.

With respect to the film formed by these methods, it is preferable that the oxygen concentration is $5\times10^{21}$ cm$^{-3}$ or less. In order to promote crystallization of the film, it is desirable that the oxygen concentration is $7\times10^{19}$ cm$^{-3}$ or less, preferably $1\times10^{19}$ cm$^{-3}$ or less. However, if the concentration is too low, the current leak in the OFF state increases because of the back light. If the oxygen concentration is too high, crystallization becomes difficult and the laser annealing temperature must be increased or the annealing time lengthened. The silicon concentration is assumed to be $4\times10^{22}$ cm$^{-3}$ and the hydrogen concentration is $4\times10^{20}$ cm$^{-3}$ which is equal to one atomic % of the silicon concentration.

Also, to promote further crystallization at the source and drain, the oxygen concentration is adjusted to $7\times10^{19}$ cm$^{-3}$ or less, or, preferably, $1\times10^{19}$ m$^{-3}$ or less, and oxygen may be added by ion implantation to a concentration range of $5\times10^{20}$ to $5\times10^{21}$ cm$^{-3}$, only to the channel forming regions of the TFTs which form the pixels.

By the above-described method, the silicon film 802 in an amorphous state is formed to be 500 to 5000 Å in thickness, (e.g., 1000 Å in this embodiment).

Figure 22B:
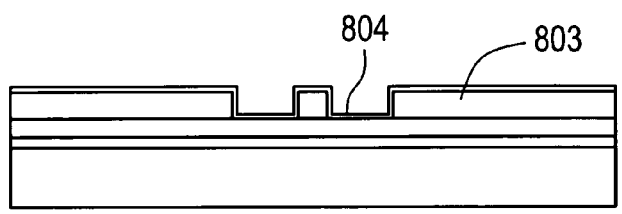
Figure 22C:
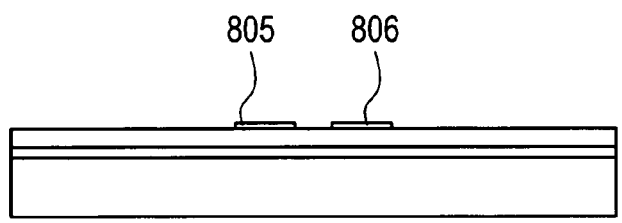
Figure 22D:
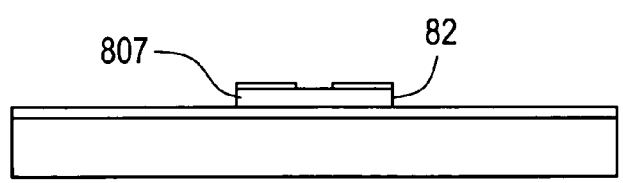
Figure 22E:
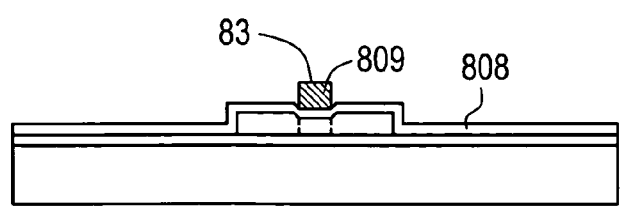
Figure 22F:
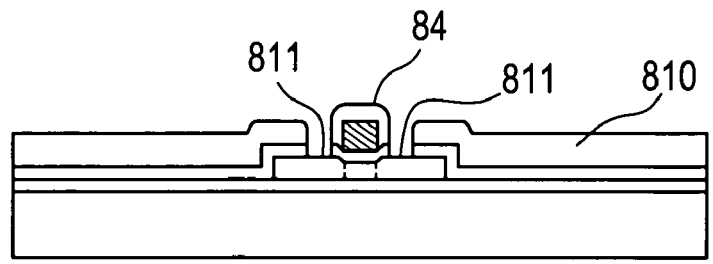
Figure 22G:
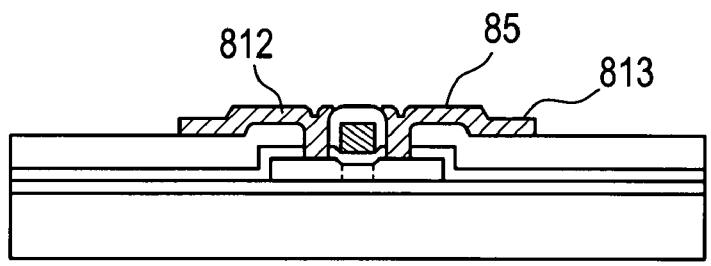
Figure 22H:
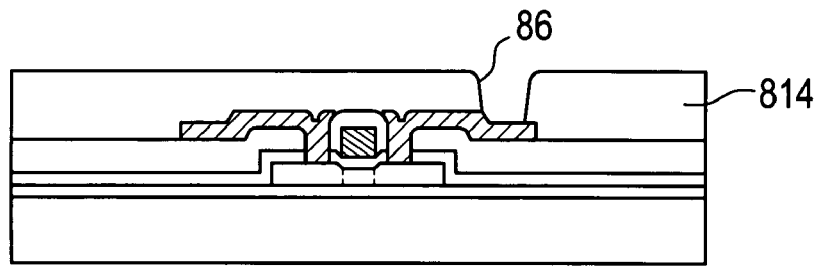
Figure 22I:
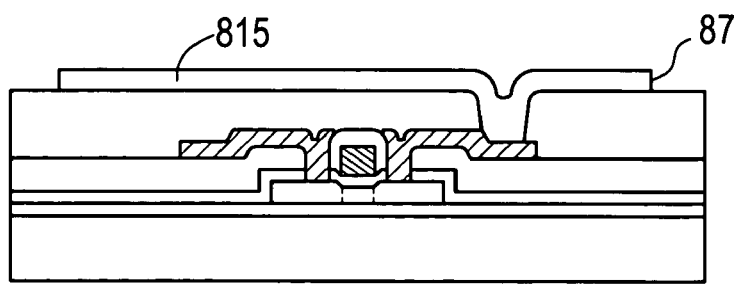
Figure 23A:
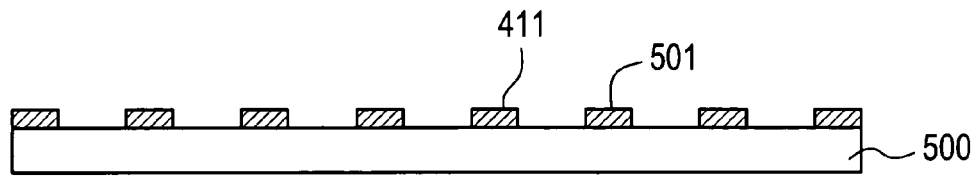
FIGS. 23(A) to 23(E) are cross-sectional views to show the formation process of a substrate of the present invention.
Figure 23B:
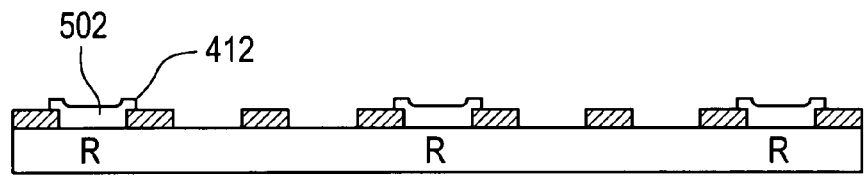
Figure 23C:
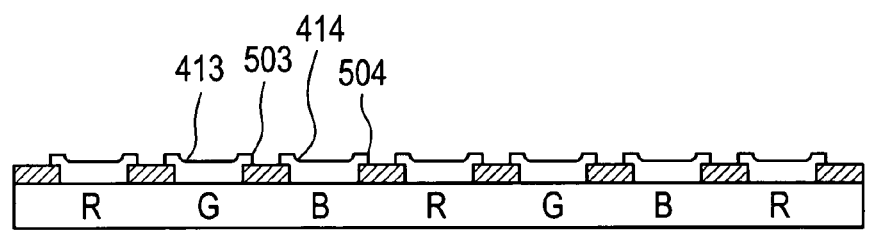
Figure 23D:
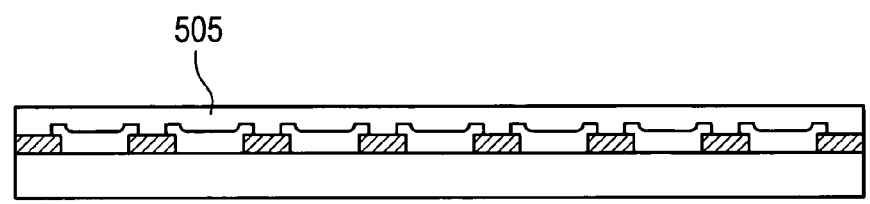
Figure 23E:
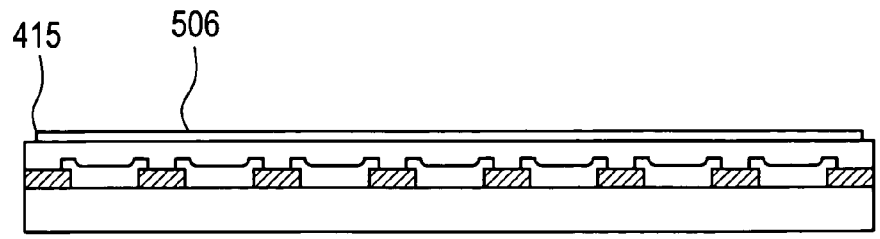

Next, photoresist 803 is formed in a pattern having openings therein on source and drain regions as shown in FIG. 22(B) by the use of a mask 1. On this structure, a silicon film 804 to be an n-type activation layer is formed by plasma CVD. The film formation temperature is 250° C. to 350° C. (specifically 320° C. in this embodiment). Monosilane ($SiH_4$) and phosphine ($PH_3$) of monosilane base at a concentration of 3% are utilized. They are introduced into a PCVD apparatus maintained at a pressure of 5 Pa and an electric power at a high frequency of 13.56 MHz is inputted thereto, whereby the silicon film 804 is deposited. The high frequency electric power of 0.05 to 0.20 W/cm$^2$ is appropriate in this case. In this embodiment an electric power of 0.120 W/cm$^2$ is inputted.

The n-type silicon film formed by the above-described method has a specific electric conductivity of about $2\times10^1$ [$\Omega cm^{-1}$]. The thickness thereof is 50 Å. Then, source and drain regions 805 and 806 are formed by a lift-off method. After that, an island region 807 for an N-channel thin film transistor is formed using a mask 82.

Subsequently, laser annealing to the source, drain, channel regions and laser doping to the activation layer are carried out simultaneously by the use of XeCl excimer laser. The threshold energy of this laser at this moment is 130 mJ/cm$^2$. On the other hand, in order to melt the whole film thickness, the energy of 220 mJ/cm$^2$ is necessary. However, if a laser having an energy more than 220 mJ/cm$^2$ is irradiated from the beginning, hydrogen contained in the film would be discharged rapidly, resulting in the destruction of the film. For this reason, it is necessary to first discharge the hydrogen at a low energy and then melt the film. In this embodiment, a laser at 150 mJ/cm$^2$ is irradiated to discharge hydrogen and then a laser at 230 mJ/cm$^2$ is irradiated to crystallize the film.

When annealing the silicon film, crystallization is inclined to take place in a highly ordered state from the amorphous structure, so that a crystal state is partly produced. Particularly, in the regions where a relatively highly ordered state is produced just after film forming of silicon, the tendency of crystallization to a crystal state is strong. A junction, however, is created due to the silicon between these regions, so that the silicon attracted each other.

According to laser Raman spectrometry measurement of the annealed silicon film, it is observed that a peak is shifted from 522 cm$^{-1}$ of the single crystal silicon to a lower frequency side. The apparent grain diameter, when calculated using the half-value width, is 50 to 500 Å. Actually, there are many of these highly crystallized regions that make up clusters. Each cluster is joined to the other by a silicon junction forming (i.e., anchoring) a film.

Consequently, it is believed that the film can be said to have substantially no grain boundary (GB). The carriers can easily travel between the clusters through the anchored areas, so the mobility of the carriers is higher than that of the poly-crystalline silicon, having clear grain boundaries (GB). The electron mobility (ue) obtained is 15 to 300 cm$^2$/Vsec.

A silicon oxide film 808 is then formed as a gate insulating film in the thickness range of 500 to 2000 Å (e.g., 1000 Å). This is prepared under the same conditions as the silicon oxide film formed as a blocking layer. A small amount of fluorine may be added to this film for fixation of the sodium ion during film formation.

When this operation is completed, a silicon film containing phosphorus at a concentration of 1 to $5\times10^{21}$ cm$^{-3}$, or a multilayered film comprising the silicon film laminated thereon with molybdenum (Mo), tungsten (W), MoSi$_2$ or WSi$_2$ film is formed. This film is patterned with a third photomask 83 to obtain the configuration shown in FIG. 22(E). A gate electrode 809 is then formed. For example, as a gate electrode, a phosphorus-doped silicon 0.2 µm thick is formed and a molybdenum layer 0.3 µm thick is formed thereon with a channel length of 7 µm.

Also, in the case where aluminum is used as the gate electrode material, after patterning with the third photomask 83, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

The entire manufacturing process for the TFT can thus be done without having to apply a temperature above 400° C.

This makes it possible to use, as the substrate, materials other than expensive materials such as quartz. Accordingly, this embodiment of the invention is very suitable for a liquid crystal display having a large number of picture elements.

Next, a silicon oxide film is formed as an interlayer insulator 810 by a sputtering method. In place of the sputtering method, a LPCVD method, a photo CVD method, and a normal pressure CVD method may be utilized for the formation of the silicon oxide film. The thickness of the layer is 0.2 to 0.6 µm, for example. After that, an opening 811 for electrode is formed using a forth photomask 84. On the entire surface of this structure, an aluminum film having a thickness of 0.3 µm is formed by sputtering method, and then a lead 812 and a contact 813 are formed using a photomask (85). An organic resin for surface-flattering 814 (e.g. a transparent polyimide resin) is then applied on the top surface, and an opening for an electrode is again formed using a sixth photomask 86.

An ITO (Indium Tin Oxide) film of 0.1 µm thickness is formed on the entire surface of this structure by sputtering and is subsequently patterned into a pixel electrode 815 by using a seventh photomask 87. This ITO film is formed at room temperature to 150° C. and annealed at 200° C. to 400° C. in an oxygen or an atmosphere. The electrical characteristics of the formed TFT are as follows:

Mobility: 80 cm$^2$/Vs; and
Vth: 5.0V.

In accordance with the foregoing method, the first substrate for a liquid crystal electro-optical device is completed.

The method for forming the second substrate is shown in FIGS. 23(A)-23(E). A polyimide resin film, made of polyimide mixed with black pigment, having a thickness of 1 µm is formed on a glass substrate 500 by a spin coat method and is patterned into black stripes 501 by the use of a first photomask 411.

Then, a film of polyimide resin mixed with red pigment having a thickness of 1 µm is formed by spin coat method and is subsequently patterned into red color filters 502 by the use of a second photomask 412.

In the same manner as above, green color filters 503 are formed by the use of a third photomask 413, and blue color filters 504 by the use of a fourth photomask 414. During the formation of the filters, the filters are baked at 350° C. for 60 min. in an nitrogen atmosphere. Subsequently, a transparent polyimide layer is formed as a leveling layer 505 by spin coat method.

On the entire surface of the structure, an ITO film of 0.1 µm thickness is formed by sputtering and is patterned into a common electrode 506 by the use of a fifth photomask 415. This ITO film is formed at room temperature to 150° C. and annealed at 200 to 300° C. in an oxygen or an atmosphere. Thus, the second substrate is completed.

A polyimide precursor material is printed on the above-described substrates by an off-set method and baked at 350° C. for 1 hour in an non-oxide atmosphere, (e.g., in nitrogen). Then the surface of the polyimide is subjected to a known rubbing method, so as to provide a means for orienting liquid crystal molecules in a fixed direction in at least an initial stage.

A nematic liquid crystal composition is interposed between the first and second substrates and the periphery of the substrates, is sealed with an epoxy adhesive. An drive IC in TAB form and a PCB comprising a common signal wiring and an electric potential wiring are connected to the lead on the substrate, and a polarizing plate is affixed to the outside, whereby a light-transmission type liquid crystal electro-optical device is obtained.

Figure 24:
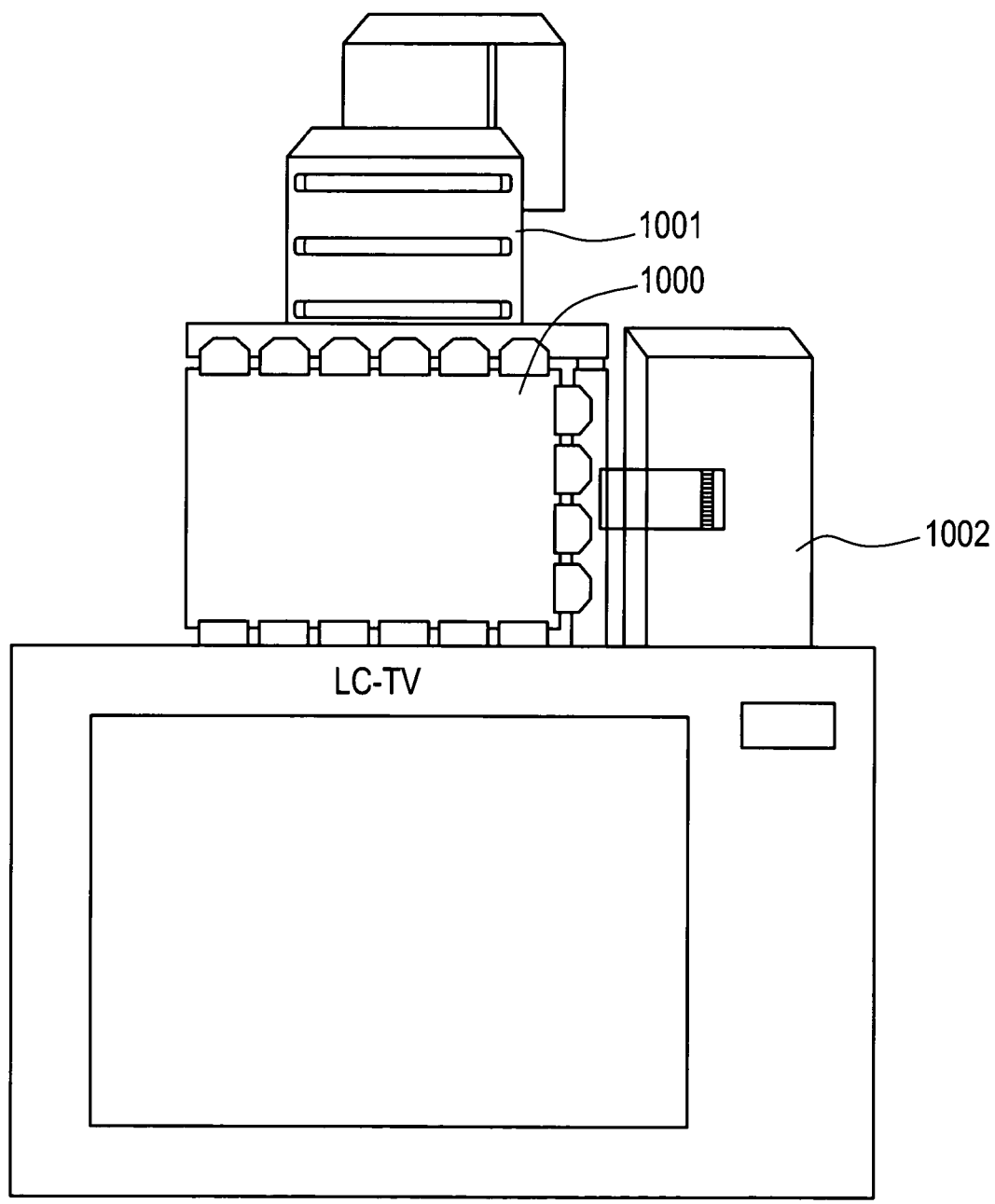
FIG. 24 shows a schematical configuration of an electro-optical device of one embodiment of the present invention.

FIG. 24 shows the schematic configuration of the electro-optical device obtained in accordance with this embodiment. The liquid crystal panel 1000 obtained by the above steps is combined with a back light device 1001 comprising three cool cathode tubes. Then a tuner 1002 for receiving TV electric waves is connected thereto, to complete an electro-optical device. Since the electro-optical device obtained has a flat form compared with the conventional CRT type electro-optical device, it is possible to hang it on the wall and the like.

Figure 25:
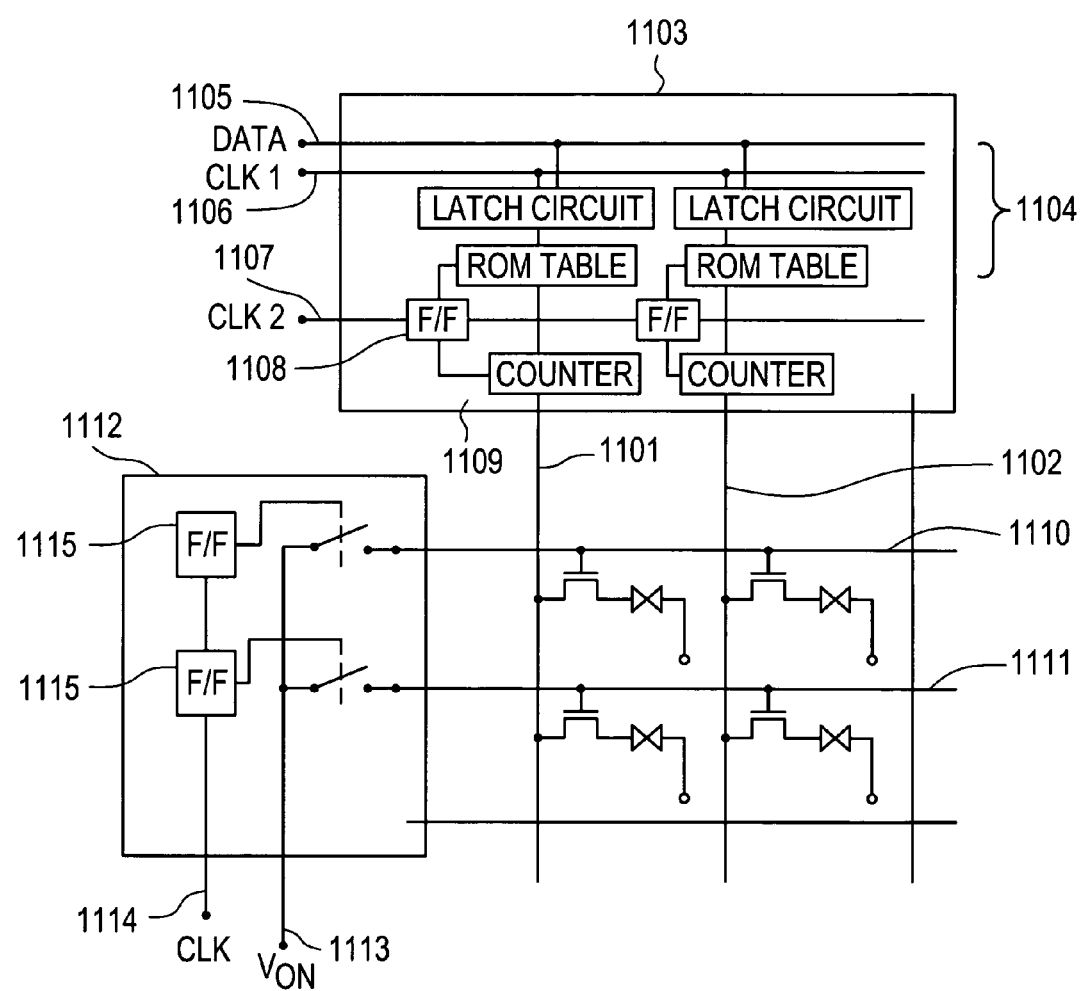
FIG. 25 shows the peripheral circuitry of a liquid crystal electro-optical device of the present invention.

Next, the configuration of a peripheral circuitry of the liquid crystal electro-optical device is described with reference to FIG. 25. The peripheral circuitry comprises a driver circuit 1103 connected to information signal side wires 1101 and 1102 which are connected to the matrix circuit of the liquid crystal electro-optical device. The driver circuit 1103 is divided into two drive frequency systems. One of them is a data latch circuit system 1104 having a drive method same as the conventional method, where the main composition is a basic clock CLK1 1106 for transferring data 1105 by turns and 1-12 bits parallel processing. The other is the system composed in accordance with the present invention. It is composed of a flip flop circuit 1108, a counter 1109 and a clock CLK2, 1107 for the independent frequency from the data transfer frequency. Pulses are formed by the counter 1109 so as to correspond to the gradated display data transmitted from the data latch system 1104.

The present invention is directed to this type of system. That is, by utilizing two kinds of drive frequency, a clear digital gradated display can be obtained without reducing frame numbers for rewriting a picture. Accordingly, occurrence of flicker and the like due to the reduction of the frame number can be avoided.

On the other hand, in a driver circuit 1112 connected to scanning signal lines 1110 and 1111, the electric potential transmitted from a voltage level 1113 is controlled by a flip flop circuit 1115 of a clock CLK 1114 to supply address signals.

In the TFT obtained in accordance with this embodiment the mobility is 80 cm$^2$/Vs, so that drive frequency can be increased up to about 1 MHz. Therefore, a gradated display of up to 42 gradations is possible, the gradation number being calculated by the following formula:

1 MHz/(400*60)=42, where 1 MHz represents the drive frequency, 400 the duty number, and 60 the frame number.

In the case of an analog gradated display method, a gradated display of 16 gradations is its limit due to the variation of the TFT characteristics. In the case of the digital gradated display method of the present invention, however, since the influence from the variation of the TFT characteristics is very little, a gradated display of 42 gradations is possible. In the case of a color display, a colorful, fine display of 74,088 colors is possible.

The eighth embodiment of the present invention describes the manufacture of a video camera viewfinder utilizing a liquid crystal electro-optical device of 1 inch diagonal.

In this embodiment, a device utilizing amorphous TFTs in a 387×128 matrix by low temperature processing is formed for a viewfinder. The manufacturing method of the liquid crystal display device utilized in this embodiment is explained below with reference to FIG. 26.

A silicon oxide film of 1000 to 3000 Å thickness is formed as a blocking layer 1201 on inexpensive glass 1200 such as soda-lime glass by magnetron RF (high frequency) sputtering method. The process conditions are as follows:

Atmosphere: 100% oxygen;
Film Formation Temperature: 15° C.;
Output Power: 400-800 W; and
Pressure: 0.5 Pa.

Quartz or single-crystal silicon is utilized as a target, and the film formation speed is 30 to 100 Å/min.

Figure 26A:
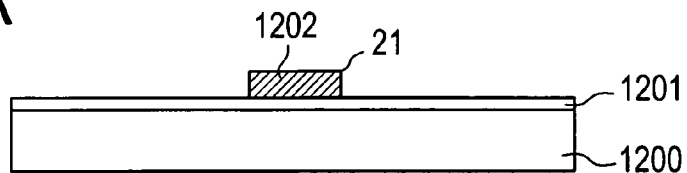
FIGS. 26(A) to 26(E) are cross-sectional views to show the manufacturing process of a liquid crystal device of one embodiment of the present invention.
Figure 26B:
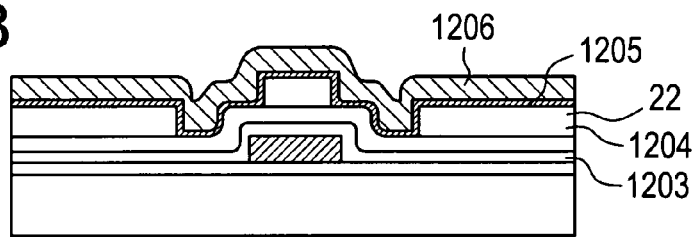
Figure 26C:
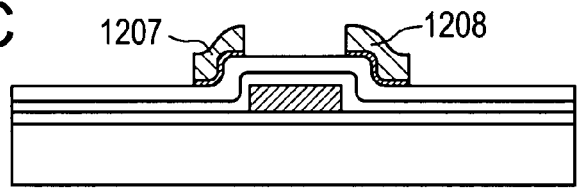
Figure 26D:
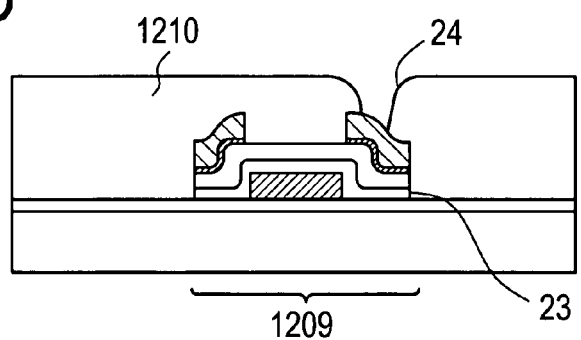
Figure 26E:
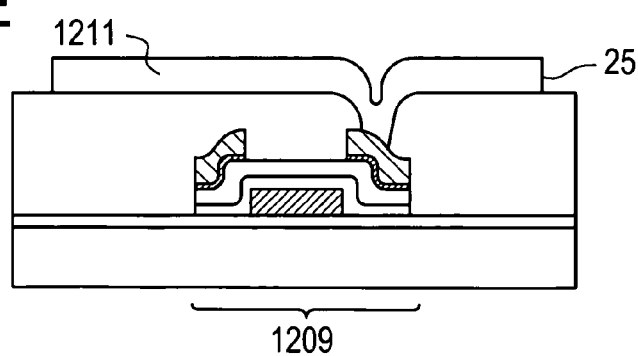

Then, a silicon film containing a 1 to 5×10$^{21}$ cm$^{-3}$ concentration of phosphorus, or a multilayered film comprising the silicon film laminated thereon with molybdenum (Mo), tungsten (W), MoSi$_2$ or WSi$_2$ film is formed, which is then patterned with a first photomask 21 to form a gate electrode 1202 as in FIG. 26(A). In this embodiment, the channel length is 10 um and as a gate electrode a phosphorus doped silicon film of 0.2 μm thickness is formed and a molybdenum film of 0.3 μm thickness is formed further thereon.

In the case of utilizing aluminum (Al) for the gate electrode material, after patterning with the first photomask 21, it is possible to prevent the occurrence of cracks, voids in a channel region or an insulating layer on the gate electrode by anodic oxidation of this surface of the patterned aluminum gate electrode. Therefore, the TFT characteristics can be further increased by improving mobility and decreasing the threshold voltage.

A silicon oxide film is then formed as a gate insulating film 1203 in the thickness range of 500 to 2000 Å (e.g., 1000 Å). This is prepared under the same conditions as the silicon oxide film formed as a blocking layer. A small amount of fluorine may be added to this film for fixation of the sodium ions during the film formation.

An amorphous silicon film is then formed on this structure by plasma CVD method. When forming a silicon film by plasma CVD, the temperature is maintained at e.g. 300° C. and monosilane (SiH$_4$) or disilane (Si$_2$H$_6$) is utilized. The gas is introduced into a PCVD apparatus and a high frequency electric power of 13.56 MHz is input thereto, whereby the film is formed.

With respect to the film formed by the above method, it is preferable that the oxygen concentration is 5×10$^{21}$ cm$^{-3}$ or less. If the oxygen concentration is higher than this range, the mobility is decreased. If the concentration is too low, the current leak in the OFF state increases because of the back light. For this reason, the concentration is held in the range from 4×10$^{19}$ to 4×10$^{21}$ cm$^{-3}$. Silicon concentration is assumed to be 4×10$^{22}$ cm$^{-3}$. Hydrogen concentration is 4×10$^2$ cm$^3$ which is equal to one atomic % of the silicon concentration. In accordance with the above method, a silicon film in an amorphous state is formed to be 500 to 5000 Å thick (e.g., 1500 Å).

Then, a resist film 1204 for forming a contact region by lift-off method is formed utilizing a second photomask 22, and on the top surface a silicon film 1205 to be an n-type activation layer is formed by plasma CVD. The film formation temperature is in the range from 250° C. to 350° C. (at 320° C. in the present embodiment) Monosilane and monosilane-based phosphine (PH$_3$) at a concentration of 1% and hydrogen (H$_2$) are introduced at a ratio of 5:3:20 into a PCVD apparatus at a pressure of 5 Pa and a high frequency electric field at 13.56 MHz is applied to form the silicon film. At this moment, a high frequency electric power of 0.05 to 0.20 W/cm$^2$ is appropriate, and an electric power of 0.120 W/cm$^2$ is utilized in this embodiment.

The formed silicon film 1205 to be an n-type activation layer has a specific electric conductivity of about 2×10$^{-1}$ ncm$^{-1}$. The film thickness thereof is 50 Å. Then, aluminum film 1206 of 3000 Å thickness is formed for a lead and a contact electrode by sputtering. Unnecessary portions of the aluminum film are removed by lift-off method to form a source region 1207 and a drain region 1208.

After forming each TFT 1209 in the form of island by the use of a third photomask 23, an organic resin 1210 for surface flattering (e.g., a transparent polyimide resin), is applied as shown in FIG. 12(D), and an opening for electrode is again formed by the use of a photomask 24.

In order to connect the output end of the NTFT to one of transparent pixel electrodes of the liquid crystal device, an ITO (Indium Tin Oxide) film is formed by sputtering method. The ITO film is subjected to etching by using a photomask 25 to form an electrode 1211. The ITO film is formed at room temperature to 150° C. and annealed at 200° C. to 400° C. in an oxygen or an atmosphere. Thus, an NTFT 1209 and an electrode 1211 made of a transparent conductive film are formed on an identical glass substrate 1200. The electrical characteristics of the thus obtained TFT are as follows:

Mobility: 0.2 cm$^2$/Vs; and

Vth: 5.3V.

Next, in the same manner as described with respect to the seventh Embodiment of the present invention, color filters and a transparent conductive film of ITO are formed to a thickness of 1000 Å on an insulating substrate to obtain a second substrate.

On the substrates, a polyimide precursor material is printed by off-set printing and baked at 350° C. for 1 hour in an non-oxidation atmosphere (e.g., in nitrogen). The surfaces of the polyimide are then subjected to a known rubbing treatment to provide a means for orienting liquid crystal molecules in a fixed direction in at least an initial stage. Thus, the first and second substrates are completed.

Then a nematic liquid crystal composition is interposed between the first and the second substrates, and the periphery thereof is sealed with an epoxy adhesive. Since the pitch of the leads on the substrate is so fine as 46 µm, the connection is carried out by the use of COG method. In this embodiment, leads are connected to gold bumps provided on an IC chip by means of a silver paradium resin of epoxy system. Then an epoxy transformed acrylic resin is filled in the space between the substrate and the IC chip for the purpose of fixing and enclosing the IC chip and the substrates. Then a polarizing plate is affixed to the outside thereof, whereby a light-transmission type liquid crystal display device is obtained.

With the TFT prepared in accordance with the present embodiment, the mobility of 0.2 cm$^2$/Vs can be obtained in spite of the amorphous state, and accordingly the drive frequency can be increased to about 100 KHz. Therefore, a gradated display having 13 gradations is possible, the gradation number being calculated by the following formula:

$$100 \text{ KHz}/(128*60)=13,$$

where 100 KHz represents a drive frequency, 128 duty number, and 60 a frame number.

When carrying out the usual analog gradated display with a liquid crystal electro-optical device of 50 mm square size (the substrate of which size is obtained by dividing 300 mm square substrate into 36 plates) on which TFTs of 384×128=49,152 are formed, the variation of the amorphous TFT characteristic is about ±10%, so that a gradated display of 8 gradations is its limit. In the case of carrying out the digital gradated display method of the present invention, the method is not affected by the variation of TFT characteristic so much, so that a gradated display of 13 gradations or more is possible. In the case of a color display, a colorful, fine display of 2027 colors is possible.

The ninth embodiment of the present invention the manufacture of a projection type image display device as shown in FIG. 27 is described. In this embodiment of the invention, an image projecting part for a projection type image display device is assembled using three liquid crystal electro-optical devices 1300. Each of them has a 640×480 dot matrix, and 307,200 pixels are formed within the size of 4 inch diagonal. The size of one pixel is 127 µm square.

The projection type image display device is composed of three liquid crystal electro-optical devices 1300 for three primary colors of light (i.e., red, green, and blue respectively), a red color filter 1301, a green color filter 1302, a blue color filter 1303, reflection boards 1304, a metal halide light source 1307 of 150 W, and an optical system for focus 1308.

The substrate of the liquid crystal electro-optical device utilized for an electro-optical device of this embodiment has an NMOS configuration and a matrix circuitry. A device comprising high mobility TFTs formed by low temperature process is utilized to compose the projection type liquid crystal electro-optical device.

Figure 28A:
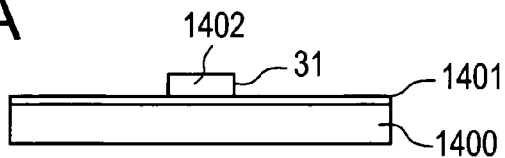
FIGS. 28(A) to 28(G) are cross-sectional views to show the manufacturing process of a liquid crystal display device of one embodiment of the present invention.

The manufacturing method for the liquid crystal display device utilized in this embodiment is explained hereinafter with reference to FIG. 28. A silicon oxide film of 1000 to 3000 Å thickness is formed as a blocking layer 1401 on glass 1400 by magnetron RF (high frequency) sputtering as shown in FIG. 28(A). The glass is the one which is not expensive unlike quartz glass and the like, and is resistant to thermal treatment at a temperature not higher than 700° C. (e.g., about 600° C.). The process conditions of the film formation are the same as those for the silicon oxide film as a blocking layer in the first embodiment of the invention.

On the silicon oxide film, a silicon film in an amorphous state is formed to be 500 to 5000 Å thick, e.g. 1500 Å thick, in the same manner as the case of the silicon film in an amorphous state in the first embodiment of the invention.

As in the first embodiment, the silicon film in an amorphous state is then annealed at an intermediate temperature of 450° C. to 700° C. for 12 to 70 hours in a non-oxide atmosphere.

Then the silicon film is subjected to photo etching by the use of a first photomask 31 to form a region 1402 for TFT (having a channel width of 20 µm), as shown in FIG. 28(A). A silicon oxide film of 500 to 2000 Å in thickness (e.g., 1000 Å) is formed as a gate insulating film 1403. The formation conditions are the same as those for the silicon oxide film as a blocking layer. A small amount of fluorine may be added during the film formation for fixation of sodium ions.

Figure 28B:
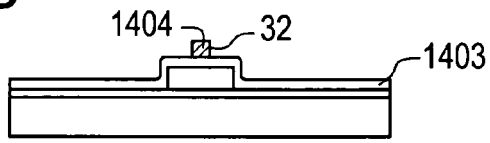
Figure 28C:
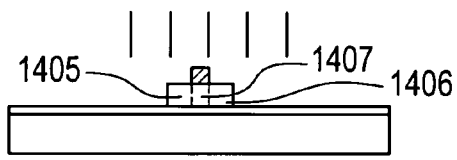

Then, a silicon film containing a 1 to 5×10$^{21}$ cm$^{-3}$ concentration of phosphorus, or a multilayered film comprising the silicon film laminated thereon with molybdenum (Mo), tungsten (W), MoSi$_2$ or WSi$_2$ film is formed, which is subsequently patterned with a second photomask 32 to form a gate electrode 1404 as in FIG. 28(B). In this embodiment, a channel length is made 10 µm, and as a gate electrode the phosphorus doped silicon of 0.2 µm thickness is formed and further a molybdenum film of 0.3 µm thickness is laminated thereon. In FIG. 28(C), phosphorus is added by ion implantation method at a dosage of 1 to 5×10$^{15}$ cm$^{-2}$ to form a source 1405 and a drain 1406.

In the case of utilizing aluminum (Al) as a gate electrode material, after patterning with the second photomask 32, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

Next, heat annealing is again carried out at 600° C. for 10 to 50 hours. Impurities in the source 1405 and the drain 1406 are activated to make the source and drain N⁺ regions. A channel forming region 1407 of semi-amorphous semiconductor is formed below the gate electrode 1404.

The entire manufacturing process for the NTFT can thus be done without having to apply a temperature above 700° C. in spite of the self-aligning system. This makes it possible to use materials other than expensive ones such as quartz for substrates. Accordingly, this embodiment of the invention is very suitable for a liquid crystal display having a large number of pixels.

Figure 28D:
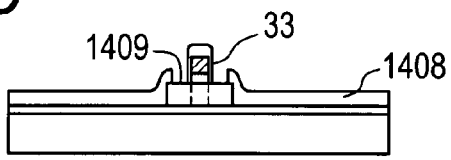
Figure 28E:
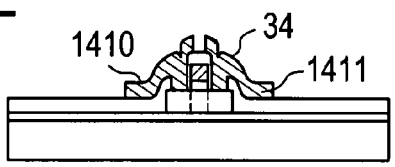
Figure 28F:
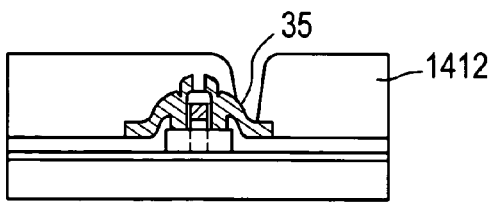
Figure 28G:
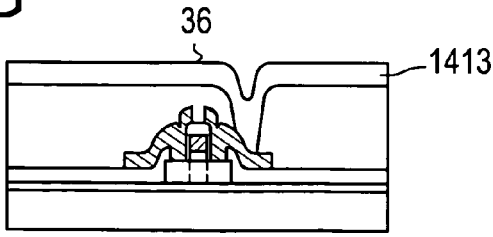

In this embodiment, the heat annealing process is carried out twice as shown in FIGS. 28(A) and (C). However, the anneal process of FIG. 28(A) may be omitted, depending on the desired characteristics, and followed up with the heat anneal process of FIG. 28(C), shortening the manufacturing time. In FIG. 28(D), an interlayer insulating layer 1408 is made of silicon oxide film using the sputtering method mentioned above.

This silicon oxide film can, however, be formed using a LPCVD method, a photo CVD method or a normal pressure CVD method. The thickness of the insulating layer is e.g. 0.2 to 0.6 μm.

Next, using photomask 33, an opening 1409 for the electrodes is formed. Then, a layer of aluminum is formed over the entire structure using the sputtering method, and a lead 1410 and a contact 1411 are formed using photomask 34.

An organic resin film 1412 for surface-flattering (e.g., a transparent polyimide resin film) is formed, and an opening for an electrode is formed using photomask 35.

In order to connect the output terminal of the NTFT to the transparent electrode of the pixel of the liquid crystal device, an ITO (Indium Tin Oxide) film is formed by sputtering. The ITO film is etched by the use of a photomask 36 to form an electrode 1413. The ITO film is formed at room temperature to 150° C. and annealed at 200 to 400° C. in an oxygen or an atmosphere.

Thus, the NTFT 1402 and the electrode 1413 of a transparent conductive film are formed on an identical glass substrate 1400. The electrical characteristics of the obtained TFT are as follows:

Mobility: 120 cm²/Vs; and
Vth: 5.0V.

Figure 29:
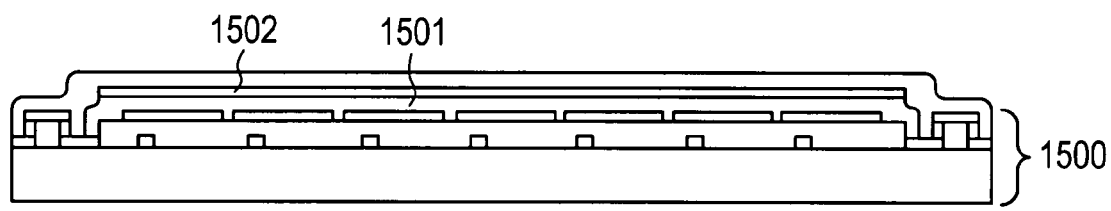
FIG. 29 shows a schematic configuration of a liquid crystal electro-optical device of one embodiment of the present invention.

A schematic view of the structure is shown in FIG. 29. On the substrate (1500 in FIG. 29) mentioned above, a mixture of loum thickness is formed by die-cast method, the mixture comprising fumaric acid polymeric resin and nematic liquid crystal both dissolved at a ratio of 65:35 in a common solvent, xylene. Then the above structure is heated at 120° C. for 180 min. in a nitrogen atmosphere to remove the solvent, whereby a liquid crystal dispersion layer 1501 is formed. It is found that tact-time could be shortened by making the pressure a bit lower than the atmospheric pressure at the moment.

Then, an ITO film is formed by sputtering to obtain an opposed electrode 1502. This ITO film is formed at room temperature to 150° C. A transparent silicon resin is then applied to be 30 um thick by printing method and is baked at 100° C. for 30 min. to obtain a liquid crystal electro-optical device.

The configuration and the function of the driver IC utilized in this embodiment is the same as that in the seventh embodiment of the present invention.

When a usual analog gradated display is carried out with a liquid crystal electro-optical device where 307,200 TFTs in 640×480 dot matrix are formed within 300 mm square, the variation in TFT characteristics is as large as about ±10%, so that a gradated display of up to 16 gradations is its limit. In the case of the TFTs formed in this embodiment, however, since the drive frequency can be increased up to 2.5 MHz, a gradated display of up to 86 gradations is possible, the gradation number being calculated by the following formula:

$$2.5 \text{ MHz}/(480 \times 60) = 86$$

where 2.5 MHz represents the drive frequency, 480 the number of scanning lines, and 60 the number of frames.

In the case of the digital gradated display method in accordance with this embodiment, the method is not affected by the variation in TFT characteristics much, so that a gradated display of 86 gradations is possible. With regard to a color display, a colorful, fine display having 262,144 colors can be obtained.

A conventional television set utilizing a liquid crystal display having 16 gradations is not suitable for displaying a natural landscape. For example, a hollow (uneven) surface of a 'lock' of one color should be displayed by subtly different colors in order to express a variety of shades of the hollow (uneven) surface in sunshine. However, the gradated display, in accordance with the present invention, makes it possible to project a picture (e.g., a 'lock' of one color) with variations of fine tone.

This liquid crystal electro-optical device is applicable not only to a front type projection TV as shown in FIG. 27 but also a rear type projection TV.

Figure 30:
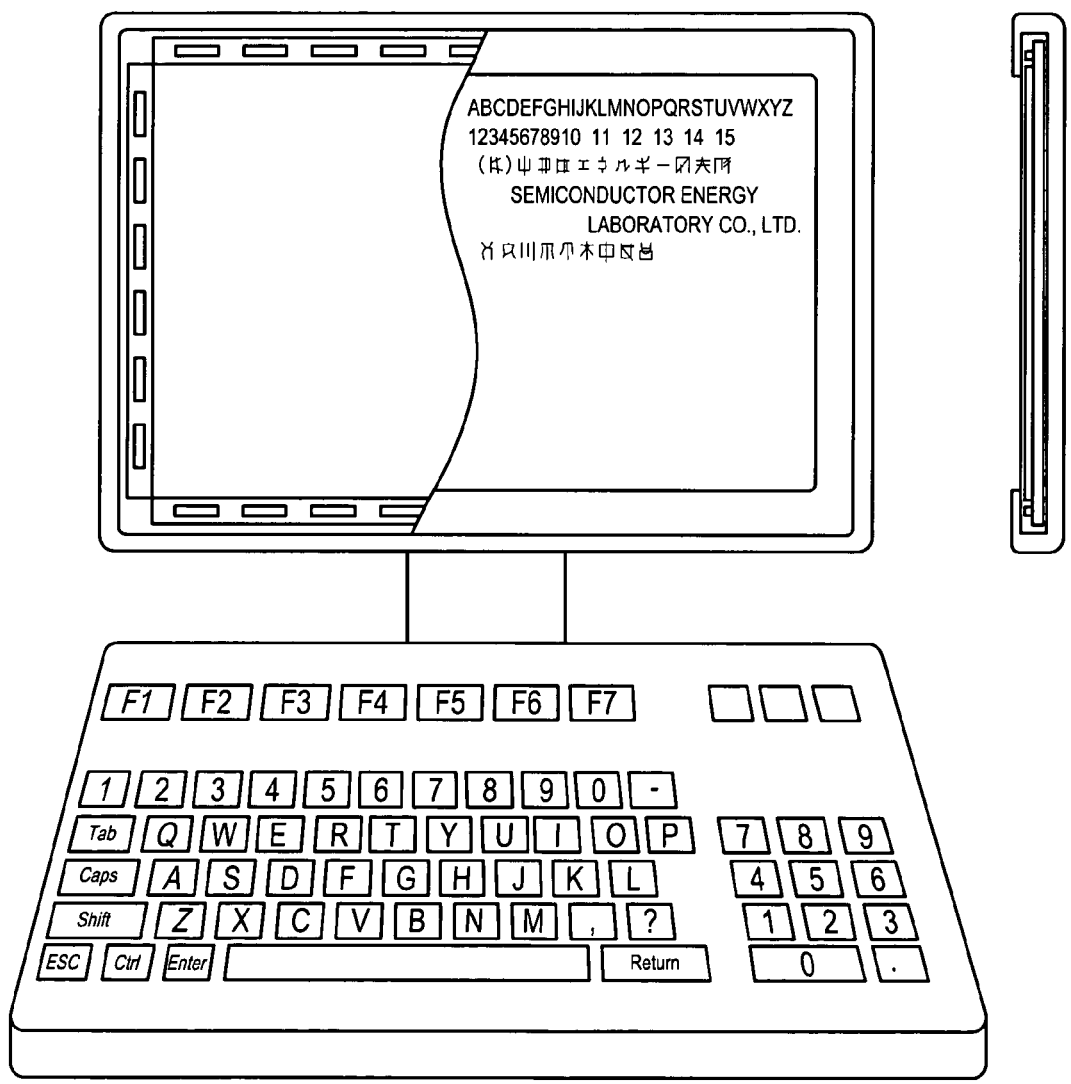
FIG. 30 shows a schematic configuration of a reflection type liquid crystal dispersion display device of one embodiment of the present invention.

The tenth embodiment of the present invention shows the manufacture of an electro-optical device for a portable computer utilizing a liquid crystal dispersion type display device of reflection type as shown in FIG. 30.

The first substrate utilized in this embodiment is formed by the same steps as in the seventh embodiment of the invention.

This embodiment will be explained below utilizing the liquid crystal electro-optical device shown in FIG. 29. Fumaric acid polymeric resin and a nematic liquid crystal mixed with a black pigment at 15% are dissolved in a common solvent, xylene at a ratio of 65:35. This solution is formed to a thickness of 10 um on the substrate 1500 by die-cast method and is then heated at 120° C. for 180 min. in a nitrogen atmosphere to remove the solvent, whereby a liquid crystal dispersion layer 1501 is obtained.

Then, an ITO film is formed by sputtering to obtain an opposed electrode 1502. This ITO film is formed at room temperature to 150° C. Then, a silicon resin of white color of 55 um thickness is applied on the rear surface by printing method and baked at 100° C. for 90 minutes to obtain a liquid crystal electro-optical device.

By utilizing the black pigment as the above, it became possible to display black color displayed when the light is dispersed (i.e. when no electric fields are applied) and also white color when the light is transmitted (i.e. when electric fields are applied), whereby a display as if characters are written on a paper could be obtained.

Alternatively, it is possible to display white color when the light is dispersed and black color when the light is transmitted, without mixing the black pigment. In this case, however, it is necessary to make the rear surface black. A display as if characters are written on a paper could be also obtained.

Figure 31:
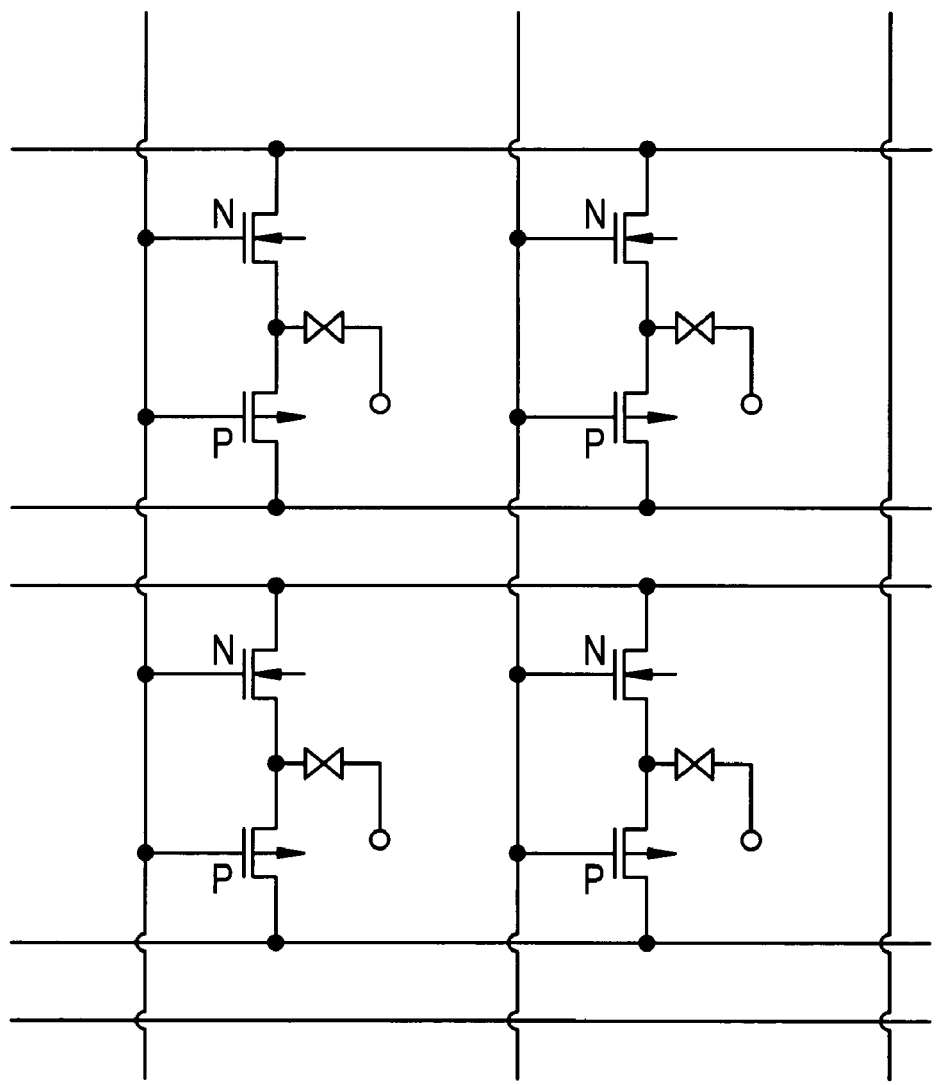
FIG. 31 illustrates an example of the circuit configuration of a liquid crystal display device of the present invention.

The eleventh embodiment of the present invention shows the manufacture of a television set to be hanged on the wall utilizing a liquid crystal display device having the circuit configuration shown in FIG. 31. TFTs utilized therein are made of polycrystalline silicon subjected to laser annealing and in stagger type.

Figure 32:
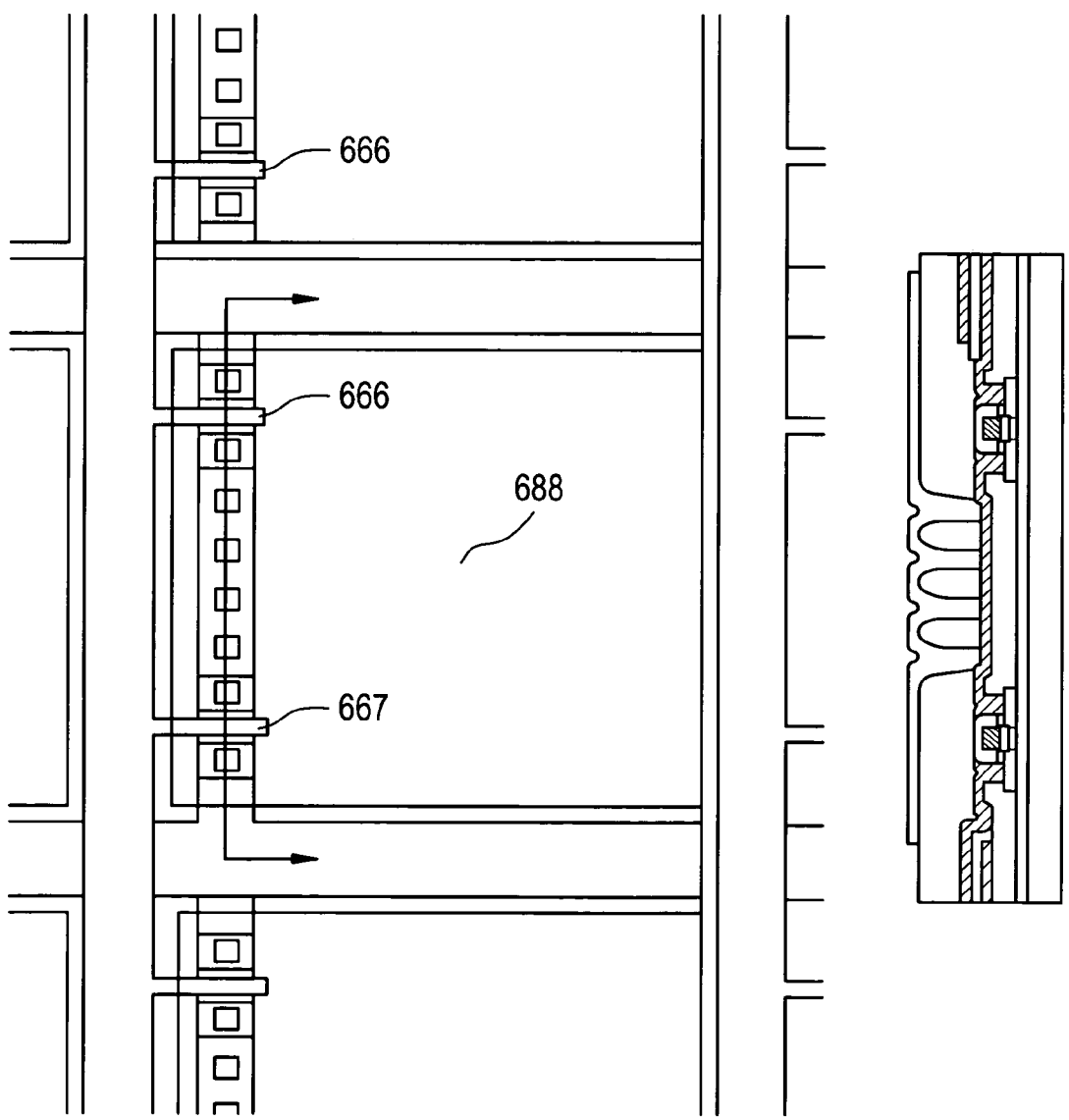
FIG. 32 illustrates a layout of electrodes and the like of another embodiment of the present invention.

FIG. 32 shows the layout of the actual electrodes and the like corresponding to the circuit configuration in FIG. 31. In order to simplify the explanation, the parts corresponding to a 2×2 (or less) matrix only are shown therein. Also, the actual driving signal waveform is shown in FIG. 16. For simplicity, the explanation of the signal waveform is also given for the case of 2×2 matrix configuration.

The manufacturing process for a liquid crystal panel utilized in this embodiment is explained with reference to FIG. 33.

Figure 33A:
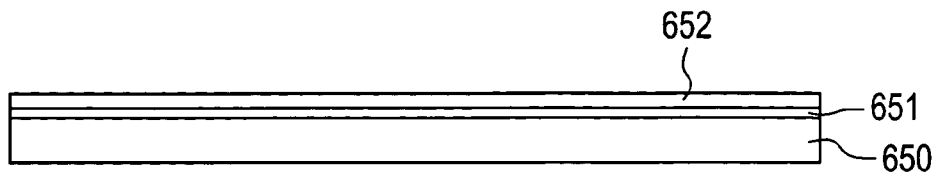
FIGS. 33(A) to 33(H) are cross-sectional views to show the manufacturing process for a liquid crystal panel of one embodiment of the present invention.

In FIG. 33(A), a silicon oxide film for a blocking layer 651 having a thickness of 1000 to 3000 Å is formed on a glass substrate 650, using a magnetron RF (high frequency) sputtering method. The glass substrate 650 is made of inexpensive materials glass capable of withstanding heat treatment up to 700° C., e.g. about 600° C.

The process conditions are the same as those for the silicon oxide film as a blocking layer in the seventh embodiment of the present invention. On the blocking layer 651, a silicon film 652 in an amorphous state is formed to be 500 to 5000 Å thick, e.g. 1000 Å thick, in the same manner as that for the silicon film in an amorphous state in described with respect to the seventh embodiment.

Figure 33B:
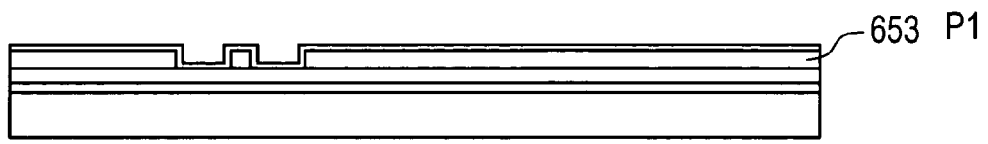

As shown in FIG. 33(B), a photoresist pattern 653 with source and drain regions opened is formed using a mask P1. Then, a silicon film to be an n-type activation layer is formed thereon by plasma CVD method. The film formation temperature is maintained at 250° C. to 350° C., specifically 320° C. in this embodiment. Monosilane ($SiH_4$) and monosilane-based phosphine ($PH_3$) at a concentration of 3% are introduced into a PCVD apparatus at a pressure of 5 Pa and a high frequency electric power at 13.56 MHz is inputted thereto, to thereby form the silicon film. A high frequency electric power of 0.05 to 0.20 W/cm$^2$ is appropriate, and a high frequency electric power of 0.120 W/cm$^2$ is inputted in this embodiment. The specific electric conductivity of the n-type silicon film thus obtained is about $2×10^{-1} \Omega \cdot cm^{-1}$. The film thickness is 50 Å.

Figure 33C:
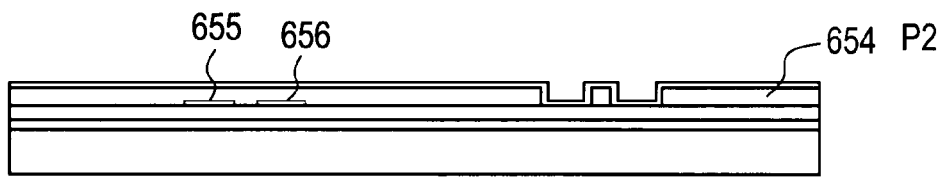
Figure 33D:
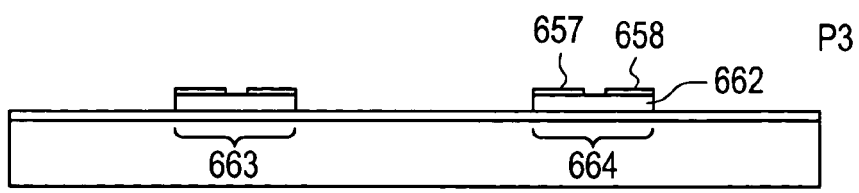
Figure 33E:
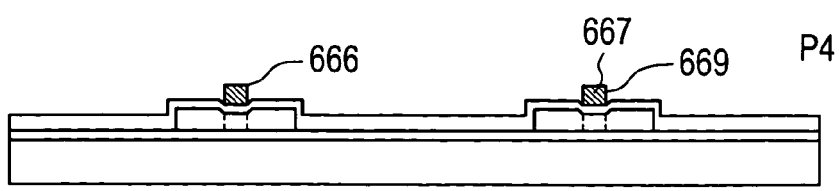

On the other hand, a photoresist pattern 654 with source and drain regions opened is formed using a mask P2, as shown in FIG. 33(C). Then, a silicon film to be a p-type activation layer is formed thereon by plasma CVD method. The film formation temperature is maintained at 250° C. to 350° C., specifically 320° C. in this embodiment. Monosilane ($SiH_4$) and monosilane-based diborane ($B_2H_6$) at a concentration of 2% are introduced into a PCVD apparatus at a pressure of 4 Pa and a high frequency electric power at 13.56 MHz is inputted to thereby form the silicon film. A high frequency electric power of 0.05 to 0.20 W/cm$^2$ is appropriate, and a high frequency electric power of 0.080 W/cm$^2$ is inputted in this embodiment. The specific electric conductivity of the p-type silicon film obtained is about $1×10^{-1} \Omega cm^{-1}$. The film thickness is 50 Å.

Then, source and drain regions 655, 656 and 657, 658 are formed by lift-off method. After that, an island region 663 for an N-channel type thin film transistor and an island region 664 for a P-channel type thin film transistor are formed using a mask P3 662.

Subsequently, laser annealing to the source, drain, channel regions and laser doping to the activation layers are carried out simultaneously by the use of XeCl excimer laser in the same way as in the seventh embodiment of the invention. An electron mobility (ue) of 15 to 300 cm$^2$/Vsec and a hole mobility (ue) of 5 to 100 cm$^2$/Vsec can be obtained.

A silicon oxide film of 500 to 2000 Å thickness, e.g. 1000 Å thickness, is then formed as a gate insulating film. This is prepared under the same conditions as the silicon oxide film formed as a blocking layer. A small amount of fluorine may be added to this film for fixation of the sodium ions during film formation.

When this operation is completed, a silicon film containing phosphorus at 1 to $5×10^{21}$ cm$^{-3}$ concentration, or a multilayered film comprising the silicon film laminated thereon with molybdenum (Mo), tungsten (W), $MoSi_2$ or $WSi_2$film is formed. The silicon film is patterned with a fourth photomask 669 to obtain the configuration shown in FIG. 33(E). Gate electrodes 666 and 667 are then formed. For example, for gate electrodes a phosphorus-doped silicon layer 0.2 μm thick is formed and a molybdenum layer 0.3 μm thick is formed thereon with a channel length of 7 μm.

Also, in the case where aluminum is used as the gate electrode material, after patterning with the fourth photomask 669, it is possible to form the source and drain contact holes at positions closer to the gates by anodic oxidation of this surface of the patterned aluminum gate electrode so that self-aligning construction can be applied. Therefore, the TFT characteristics can be further increased by improving the mobility and decreasing the threshold voltage.

The entire manufacturing process for the C/TFT can thus be done without having to apply a temperature above 400° C. This makes it possible to use, as the substrate, materials other than expensive materials, such as quartz. Accordingly, this embodiment of the invention is very suitable for a liquid crystal display having a large picture plane.

Figure 33F:
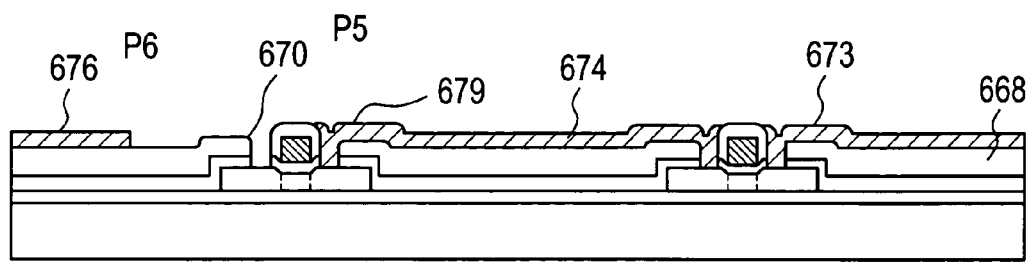
Figure 33G:
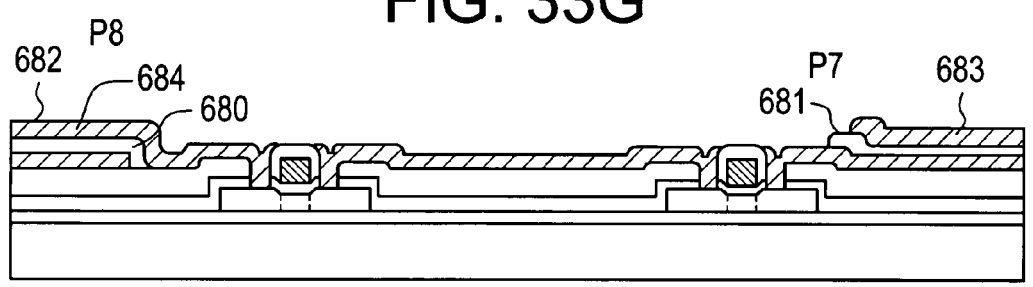
Figure 33H:
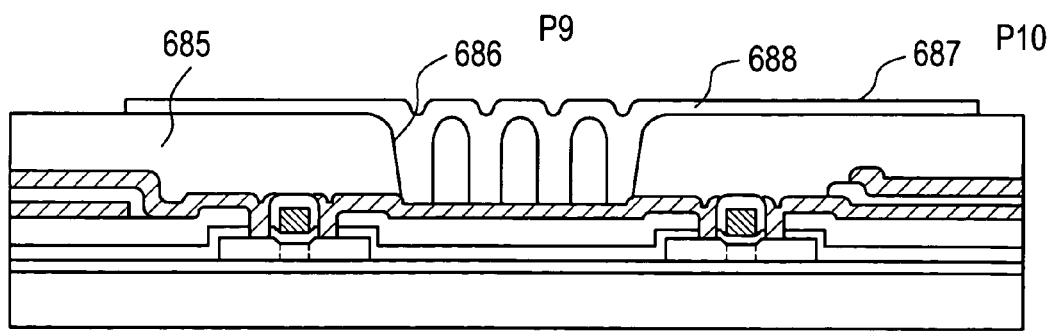

In FIG. 33(F), a silicon oxide film is formed as an interlayer insulator 668 by a sputtering method. In place of the sputtering method, LPCVD method, photo CVD method, and normal pressure CVD may be utilized for the formation of the silicon oxide film. The thickness of the layer is 0.2 to 0.6 um, for example. After that, an opening 679 for electrode is formed using a fifth photomask 670. On the entire surface of this structure, an aluminum film having a thickness of 0.3 μm is formed by sputtering method, and then a lead 674 and a contact 673 are formed using a sixth photomask 676.

A silicon oxide film is again formed as an interlayer insulating layer 680 by the above mentioned sputtering method. Instead of the sputtering method, the LPCVD method, the photo CVD method, and the normal pressure CVD method can also be utilized for forming the silicon oxide film. The silicon oxide film is then patterned using a seventh photomask 681. Then, on the entire surface an aluminum film of 0.3 μm thickness is formed by sputtering. A lead 683 and a contact 684 are then formed using an eighth photomask 682.

An organic resin for surface-flattering 685 (e.g., a transparent polyimide resin) is applied on the top surface, and further an opening for electrode is again formed using a ninth photomask 686.

An ITO film of 0.1 μm thickness is formed on the entire surface of this structure by sputtering and is subsequently patterned into pixel electrodes 688 by the use of a tenth photomask 687. This ITO film is formed at room temperature to 150° C. and annealed at 200° C. to 400° C. in an oxygen or an atmosphere.

The electrical characteristics of the thus formed NTFT and PTFT are as follows:

NTFT . . . Mobility: 80 cm$^2$/Vs,
  Vth: 5.0V; and
PTFT . . . Mobility: 30 cm$^2$/Vs,
  Vth: 5.5V.

In accordance with the foregoing method, the first substrate for a liquid crystal electro-optical device is completed.

A second substrate for the liquid crystal electro-optical device is formed in the same manner as in the seventh embodiment of the invention.

A nematic liquid crystal composition is interposed between the first and second substrates and the periphery of the substrates is sealed with an epoxy adhesive. A driver IC in TAB form and a PCB comprising a common signal wiring and a potential wiring are connected to the lead on the substrate, and a polarizing plate is affixed to the outside whereby a light-transmission type liquid crystal electro-optical device is obtained.

The structure of the electro-optical device obtained in accordance with this embodiment is the same as that in the seventh embodiment of the invention and schematically illustrated in FIG. 24.

Figure 34:
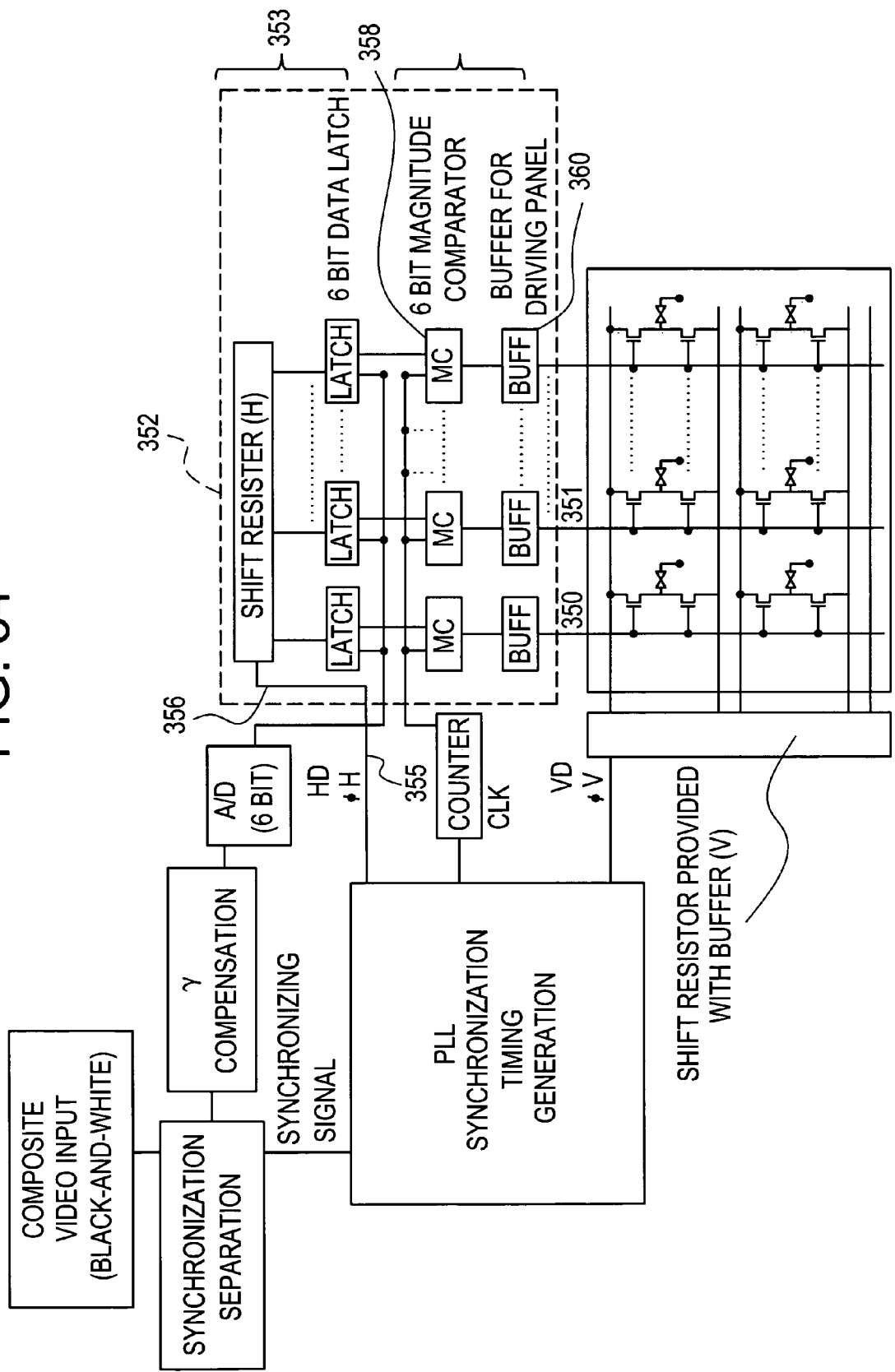
FIG. 34 shows the peripheral circuitry of a liquid crystal electro-optical device of the present invention.
Figure 35A:
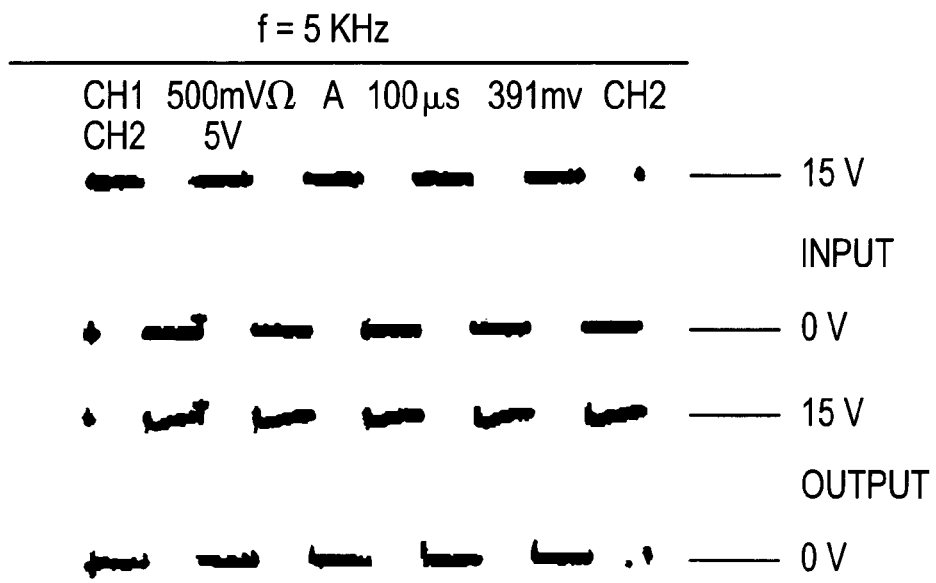
FIGS. 35(A) to 35(D) are graphs showing input signal waveforms inputted to and output signal waveforms outputted from the C/TFT obtained in one embodiment of the present invention.
Figure 35B:
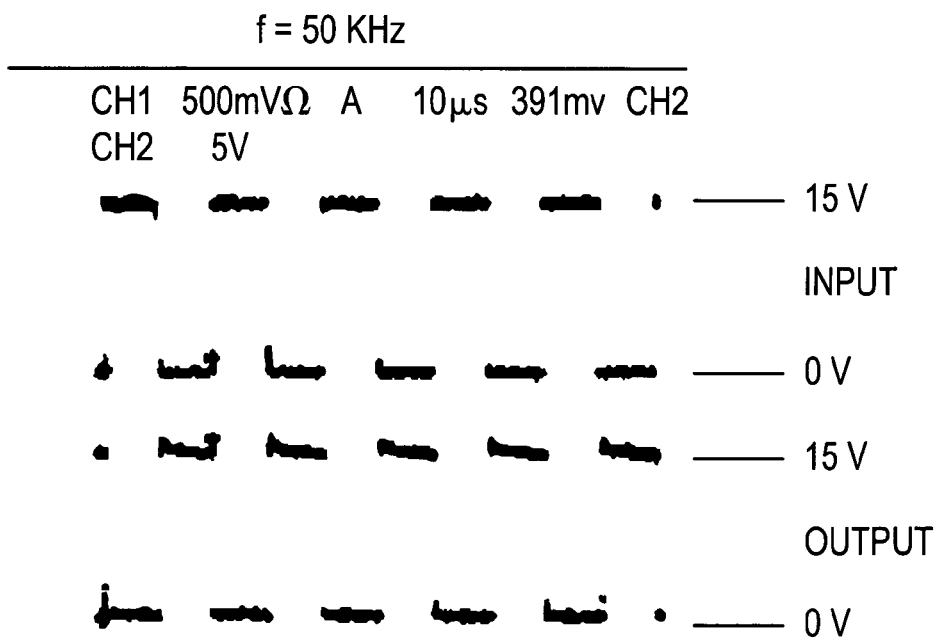
Figure 35C:
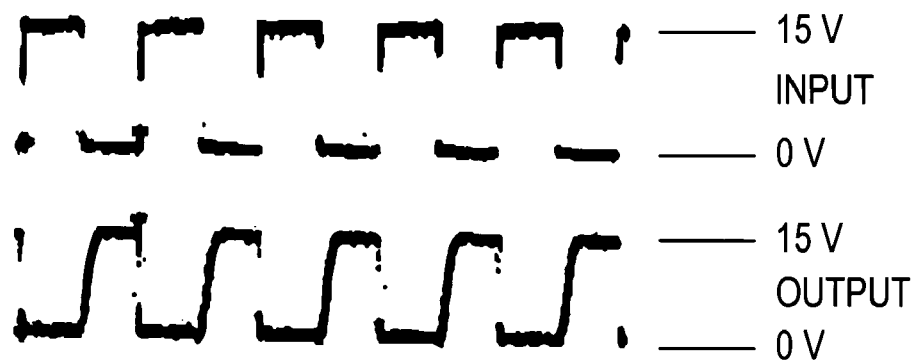
Figure 35D:
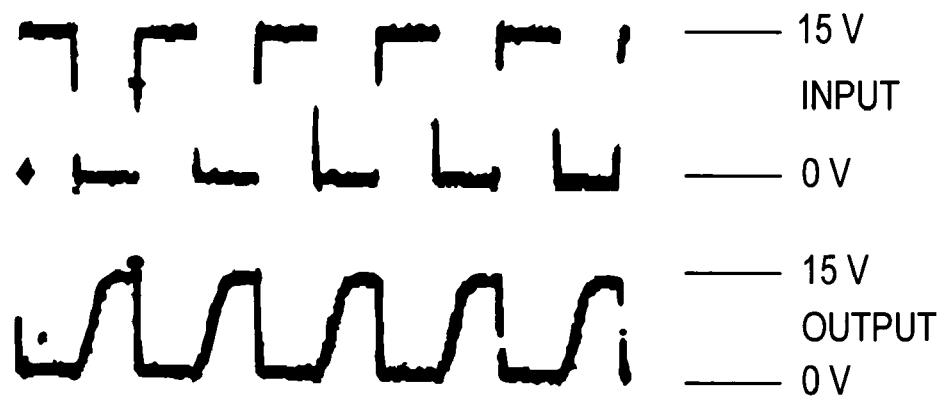

Next, the configuration of a peripheral circuitry of the liquid crystal electro-optical device is described with reference to FIG. 34.

A driver circuit 352 is connected to information signal side wires 350 and 351 which are connected to the matrix circuit of the liquid crystal electro-optical device. The driver circuit 352 is divided into two drive frequency systems. One of them is a data latch circuit system 353 having a conventional drive method, where the main composition is a basic clock OH 355 for transferring data 356 by turns and 1-12 bits parallel processing is conducted. The other frequency drive system is the system composed in accordance with the present invention. That is, the system is composed of a magnitude comparator circuit 358, a buffer 360 for panel drive and a clock CLK 357 for the independent determination of the data transfer frequency. Pulses are formed by the counter 358 so as to correspond to the gradated display data transmitted from the data latch system 353.

The present invention is directed to this system. That is, by utilizing two kinds of drive frequency, a clear digital gradated display can be obtained without reducing frame numbers for rewriting a picture. Accordingly, occurrence of flicker, and the like, due to the reduction of the frame number can be avoided.

FIG. 35 is a photograph of oscilloscope showing input signal waveforms input to and output signal waveforms output from the C/TFT obtained in this embodiment. In FIGS. 35(A) to (D), the drive frequency of input signals is raised as 5 KHz, 50 KHz, 500 KHz, and 1 MHz. As is apparent from FIG. 35(D), even at 1MHz, output signal waveforms do not become gentle so much and fully useful output signals can be obtained.

The number of gradations of a gradated display can be calculated by dividing the drive frequency by duty number and frame number. In the case of the drive frequency of 1 MHz, a gradated display of 42 gradations (calculated by dividing 1 MHz by 400 and 60) can be obtained.

In an analog gradated display method, a gradated display of 16 gradations is its limit due to the variations in TFT characteristics. In the case of the digital gradated display method of the present invention, however, since the method is not affected by the variations in TFT characteristics so much, a gradated display of up to 42 gradations is possible. With regard to a color display, a colorful, fine display of 74,088 colors can be obtained.

The twelfth embodiment of the present invention shows the manufacture of a video camera viewfinder utilizing a liquid crystal electro-optical device of 1 inch diagonal.

In this embodiment, a first substrate with 387×128 pixel configuration is prepared by the same process as in the eleventh embodiment described above. Also, a second substrate is prepared by providing color filters and a transparent conductive film ITO to a thickness of 1000 Å on a substrate made of insulator by the same process as in the eleventh embodiment described above.

On the above substrates, a polyimide precursor material is printed by off-set method, and subsequently the substrates are baked at 350° C. for 1 hour in an non-oxidizing atmosphere (e.g., in nitrogen). Then, the surfaces of the polyimide films are subjected to a known rubbing treatment, whereby the first and second substrate provided with means for orientating liquid crystal molecules in one fixed direction in at least an initial stage are obtained.

A nematic liquid crystal composition is interposed between the above first and second substrates and the periphery of the substrates is sealed with an epoxy adhesive. Since the pitch of the leads on the substrates is as fine as 46 μm, connection is conducted by COG method. In this embodiment, leads are connected to gold bumps provided on an IC chip by means of a silver paradium resin of epoxy system, and then an epoxy transformed acrylic resin is filled in the space between the IC chip and the substrates for the purpose of fixing and enclosing the IC chip. Then a polarizing plate is affixed to the outside thereof, whereby a light-transmission type liquid crystal display device is obtained.

Since the channel length is 5 μm in the TFT of this embodiment, the drive frequency can be raised up to about 2 MHz. Hence, in accordance with the division of 2 MHz by 128 and 60, 260 gradations, approximately 256 gradations are possible in a gradated display. When carrying out the usual analog gradated display with a liquid crystal electro-optical device of 50 mm square size (the substrate of which size is obtained by dividing 300 mm square-sized substrate into 36 plates) on which TFTs of 384×128=49,152 are formed, the variation in the amorphous TFT characteristic is about +10%, so that a gradated display of 16 gradations is its limit. In the case of carrying out the digital gradated display method of the present invention, the method is not affected by the variation in TFT characteristic so much, so that a gradated display of 256 gradations or more is possible. In the case of a color display, a colorful, fine display of 16,777,216 colors is possible.

The thirteenth embodiment of the invention describes the manufacture of a projection type image display device as shown in FIG. 27. In this embodiment, an image projecting part for a projection type image display device is assembled using three liquid crystal electro-optical devices 1300. Each of them has a 640×480 dot matrix, and 307,200 pixels are formed within the size of 4 inch diagonal. The size of one pixel is 127 μm square.

The projection type image display device is composed of three liquid crystal electro-optical devices 1300 for three primary colors of light (i.e., red, green, and blue respectively), a red color filter 1301, a green color filter 1302, a blue color filter 1303, reflection boards 1304, a metal halide light source 1307 of 150 W, and an optical system for focus 1308.

The substrate of the liquid crystal electro-optical device utilized for an electro-optical device of this embodiment is the one having C/TFT configuration and a matrix circuitry. A device comprising high mobility TFTs formed by low temperature process is utilized to compose the projection type liquid crystal electro-optical device.

Figure 36A:
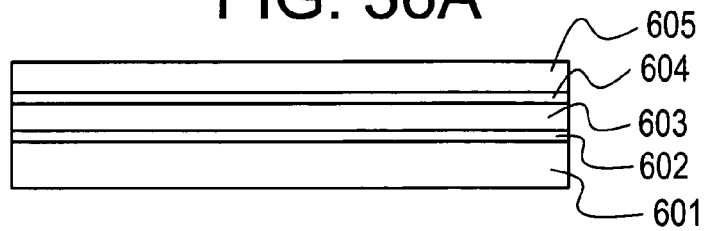
FIGS. 36(A) to 36(G) are cross-sectional views to show the manufacturing process for a liquid crystal display device of one embodiment of the present invention.

The manufacturing method for the liquid crystal display device utilized in this embodiment is explained hereinbelow with reference to FIGS. 36(A)-36(G). In FIG. 36(A), a silicon oxide film of 1000 to 3000 Å thickness is formed as a blocking layer 602 on glass 601 by a magnetron RF (high frequency) sputtering. The glass is the one which is not expensive unlike quartz glass and the like, and is resistant to thermal treatment at not higher than 700° C. (e.g., about 600° C.). The process conditions of the film formation are the same as those for the silicon oxide film as a blocking layer in the first embodiment of the invention.

On the silicon oxide film, a silicon film 603 in an amorphous state is formed to be 500 to 5000 Å thick, e.g. 1500 Å thick, in the same manner as the case of the silicon film in an amorphous state in the first embodiment of the invention.

As in the first embodiment, the silicon film in an amorphous state is then heat-annealed at an intermediate temperature of 450° C. to 700° C. for 12 to 70 hours in an non-oxide atmosphere.

A silicon oxide film 604 of 500 to 2000 Å thickness, e.g. 1000 Å thickness, is then formed as a gate insulating film. The formation conditions thereof are the same as those for the silicon oxide film as a blocking layer. A small amount of fluorine may be added during the film formation for fixation of sodium ions.

Figure 36B:
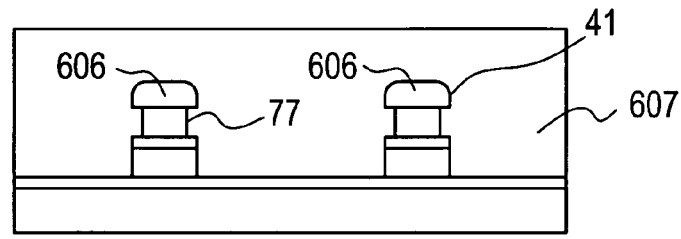
Figure 36C:
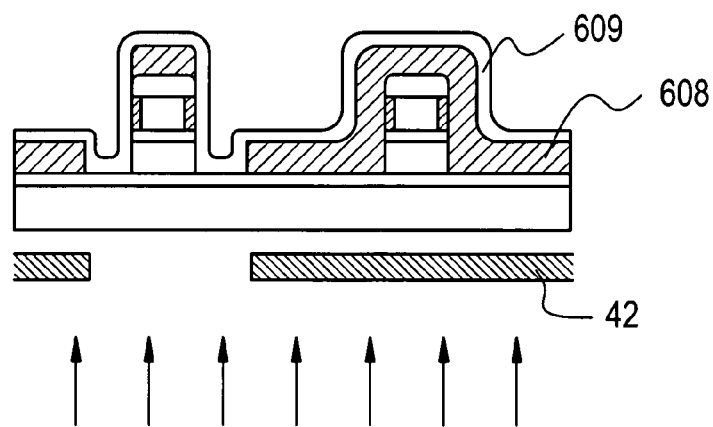

Then, a silicon film containing a 1 to $5 \times 10^{21}$ cm$^{-3}$ concentration of phosphorus, or a multilayered film comprising the silicon film laminated thereon with molybdenum (Mo), tungsten (W), MoSi$_2$ or WSi$_2$ film is formed, which is subsequently patterned with a first photomask 41 as in FIG. 36(B). In this embodiment, a molybdenum film is formed to a thickness of 0.3 μm as a gate electrode with a channel length of 10 μm. In the patterning, the gate electrodes are overetched 77 at about 3 μm. Then, a positive photoresist 607 is applied on the entire surface of the substrate.

Figure 36D:
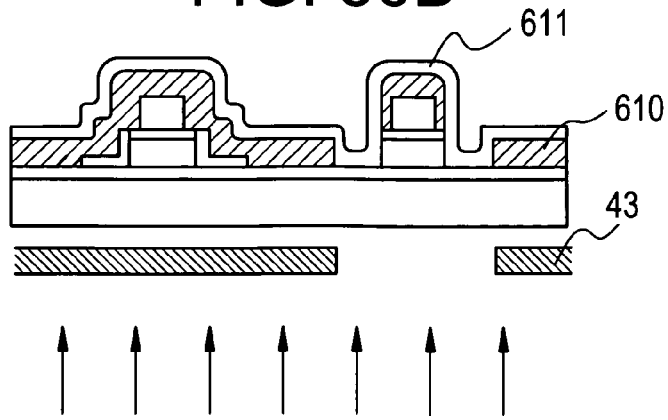

After the application, exposure and development are carried out from the rear side of the substrate, using a photomask 42 to thereby obtain a resist 608. Then, an n-type layer is deposited by sputtering. By subsequently removing the resist 608 by lift-off method, the configuration shown in FIG. 36(D) is obtained.

In the same manner, after a positive photoresist is applied on the entire surface of the substrate, exposure and development are carried out from the rear side of the substrate using a photomask 43 to thereby obtain a resist 610. Then a p-type layer is deposited by sputtering. By removing the resist 610 by lift-off method, the configuration shown in FIG. 36(E) is obtained.

The substrate is again heat-annealed at 600° C. for 10 to 50 hours, whereby impurities in sources 612, 614 and drains 613, 615 are activated to be N$^+$ or P$^+$ type. Channel formation regions 618 and 619 of semi-amorphous semiconductor is formed below gate electrodes 616 and 617. The entire manufacturing process for the C/TFT can thus be done without having to apply a temperature above 700° C. in the self-aligning system. This makes it possible to use materials other than expensive ones, such as quartz, as the substrate material. Accordingly, this embodiment of the invention is suitable for a liquid crystal display having a large picture plane.

Figure 36E:
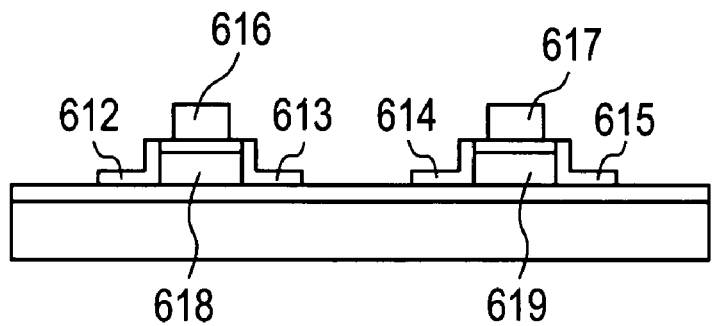

The heat anneal process, shown in FIG. 36(A) and FIG. 36(E), is performed twice. However, the anneal process in FIG. 36(A) can be omitted, depending on the desired characteristics, and followed up with the heat anneal process of FIG. 36(E), shortening the manufacturing time.

Figure 36F:
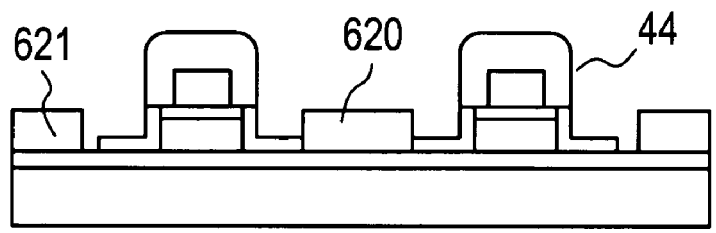
Figure 36G:
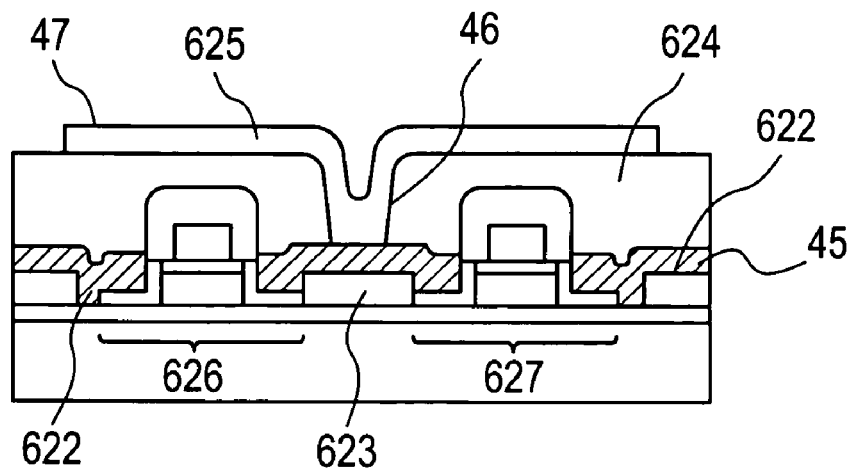

In FIG. 36(F), a silicon oxide film is formed as an interlayer insulator 620 by the sputtering method mentioned above. This silicon oxide film may be formed by the LPCVD method, photo CVD method, or normal pressure CVD method, instead. The thickness of the insulator is, e.g., 0.2 to 0.6 μm. Next, using a photomask 44, openings 621 for the electrodes are formed. Then, a layer of aluminum is formed on the entire structure using the sputtering method, and a lead 622 and a contact 623 are formed using a photomask 45, as shown in FIG. 36(F).

An organic resin film 624 for surface-flattering (e.g., a transparent polyimide resin film) is formed, and electrode an opening for an electrode is provided using a photomask 46.

In order to connect the output terminal of the C/TFT to the (transparent) electrode of the pixel of the liquid crystal display device, an ITO film is formed by sputtering. The electrode 625 is completed by etching through a photomask 47.

This ITO film is formed in the range from room temperature to 150° C. and annealed at 200° C. to 400° C. in oxygen or atmosphere. The NTFT 626, PTFT 627, and the transparent electrode 625 are thus prepared on an identical glass substrate 601. The electrical characteristics of the TFTs thus obtained are as follows:

NTFT . . . Mobility: 120 cm$^2$/Vs,
  Vth: 5.0V; and
PTFT . . . Mobility: 50 cm$^2$/Vs,
  Vth: 5.3V.

The substrate 1500 shown in FIG. 29 is obtained by the foregoing process.

A liquid crystal dispersion layer 1501 is formed on the substrate 1500 in the same manner as in the ninth embodiment described above, as shown in FIG. 29. Further an opposed electrode 1502 is formed thereon as in the ninth embodiment. Then, a transparent silicon resin of 30 μm thickness is applied on the top surface of the structure by printing method and is baked at 100° C. for 30 min. to thereby obtain a liquid crystal electro-optical device. The configuration and the function of the driver IC utilized in this embodiment are the same as in the eleventh embodiment.

When a usual analog gradated display is carried out with a liquid crystal electro-optical device where 307,200 TFTs in 640×480 dot matrix are formed within 300 mm square, the variation in TFT characteristics is as large as about ±10%, so that a gradated display of up to 16 gradations is its limit. In the case of the TFTs formed in this embodiment, however, since the drive frequency can be increased up to 2.5 MHz, a gradated display of up to 86 gradations is possible, the gradation number being calculated by the following formula:

2.5 MHz/(480×60)=86, where 2.5 MHz represents the drive frequency, 480 the number of scanning lines, and 60 the number of frames. With regard to a color display, a colorful, fine display having 262,144 colors can be obtained. This liquid crystal electro-optical device is applicable not only to a front type projection TV shown in FIG. 27 but also to a rear type projection TV.

The fourteenth embodiment of the present invention shows the manufacture of an electro-optical device for a portable computer utilizing a liquid crystal dispersion type display device of reflection type as in FIG. 30. A first substrate 1500 utilized in this embodiment is formed in the same manner as in the eleventh embodiment.

As shown in FIG. 29, a liquid crystal dispersion layer 1501, a counter electrode 1502 on the layer 1501, and a transparent silicon resin on the electrode 1502 are provided on the substrate 1500 as in the tenth embodiment, described above. The silicon resin is subsequently baked at 100° C. for 90 min. to thereby obtain a liquid crystal electro-optical device.

In the present invention, a gradated display is provided using a display drive system with the display timing related to the unit time t for writing-in a picture element and to the time F for writing-in one picture, wherein, by time-sharing the signal during a write-in of time t, without changing the time F, a clear gradated display controlled by digital can be obtained. Compared with the gradated display method using a plurality of frames, a display of high quality is possible without the decrease of display frequency by the digital gradated display method of the present invention.

Instead of a conventional analog gradated display, the present invention provides a digital gradated display with two kinds of drive frequencies being independent of each other. In the case of utilizing a liquid crystal electro-optical device in 640×400 dot matrix, conventionally it was very difficult to form all the 256,000 TFTs without variations in characteristic, and taking the actual productivity and yields into consideration, a gradated display of 16 gradations is its limit. On the other hand, in order to make clear the applied voltage level, a reference voltage value is inputted, instead of an analog value, as a signal from the controller side in the present invention. By controlling by a digital value the timing to connect the reference signal to TFT, the voltage applied to the TFT is controlled, whereby the variation in TFT characteristics is covered. Hence, a clear digital gradated display is possible in accordance with the present invention.

The use of two kinds of drive frequencies makes it possible to obtain a clear digital gradated display without changing the number of frames for rewriting a picture, and the occurrence of flicker and the like, due to the decrease of the frame number, can be avoided.

What is claimed is:

1. A method of manufacturing an active matrix type display device comprising the steps of:
    forming a gate electrode over an insulating surface of a first substrate;
    forming a gate insulating film over said gate electrode;
    depositing an amorphous semiconductor film comprising silicon on said gate insulating film;
    patterning said semiconductor film into an island comprising a channel region;
    forming a first organic leveling film over said semiconductor film after said patterning thereof to provide a leveled upper surface;
    forming an opening in said organic leveling film;
    forming a pixel electrode over said organic leveling film through said opening;
    forming a resin black matrix over a second substrate;
    forming a second organic leveling film over said resin black matrix;
    forming a counter electrode on said second leveling film; and
    facing said second substrate to said first substrate so that said counter electrode and said pixel electrode are opposed to each other.

2. A method according to claim 1 further comprising a step of depositing an n-type semiconductor layer on said amorphous semiconductor film through plasma CVD using a mixture gas containing a silane, phosphine and hydrogen.

3. A method according to claim 1 further comprising a step of forming a pair of impurity doped semiconductor layers on said island, wherein one of said impurity doped semiconductor layers is electrically connected with said pixel electrode.

4. A method according to claim 1 wherein said gate electrode comprises a doped silicon film and a molybdenum film formed thereon.

5. A method according to claim 1 wherein said gate electrode comprises aluminum.

6. A method according to claim 1 wherein said gate insulating film comprises silicon oxide.

7. A method according to claim 1 wherein said amorphous semiconductor film is deposited through plasma CVD.

8. A method according to claim 1 wherein said amorphous semiconductor film is deposited to a thickness of 500 to 5000 Å.

9. A method according to claim 1 wherein said organic leveling film directly contacts a portion of said amorphous semiconductor film.

10. A method according to claim 1 wherein said pixel electrode extends over said channel region.

11. A method of manufacturing an active matrix type display device comprising the steps of:
    forming a gate electrode over an insulating surface of a first substrate;
    forming a gate insulating film over said gate electrode;
    depositing an amorphous semiconductor film comprising silicon on said gate insulating film;
    patterning said semiconductor film into an island comprising a channel region;
    forming a first organic leveling film over said semiconductor film after said patterning thereof to provide a leveled upper surface;
    forming an opening in said organic leveling film;
    forming a pixel electrode over said organic leveling film through said opening;
    forming a color filter over a second substrate;
    forming a resin black matrix over said second substrate;
    forming a second organic leveling film over said color filter and said resin black matrix;
    forming a counter electrode on said second leveling film; and
    facing said second substrate to said first substrate so that said counter electrode and said pixel electrode are opposed to each other.

12. A method according to claim 11 further comprising a step of depositing an n-type semiconductor layer on said amorphous semiconductor film through plasma CVD using a mixture gas containing a silane, phosphine and hydrogen.

13. A method according to claim 11 further comprising a step of forming a pair of impurity doped semiconductor layers on said island, wherein one of said impurity doped semiconductor layers is electrically connected with said pixel electrode.

14. A method according to claim 11 wherein said gate electrode comprises a doped silicon film and a molybdenum film formed thereon.

15. A method according to claim 11 wherein said gate electrode comprises aluminum.

16. A method according to claim 11 wherein said gate insulating film comprises silicon oxide.

17. A method according to claim 11 wherein said amorphous semiconductor film is deposited through plasma CVD.

18. A method according to claim 11 wherein said amorphous semiconductor film is deposited to a thickness of 500 to 5000 Å.

19. A method according to claim 11 wherein said organic leveling film directly contacts a portion of said amorphous semiconductor film.

20. A method according to claim 11 wherein said pixel electrode extends over said channel region.

21. A method of manufacturing an active matrix type display device comprising the steps of:
    forming a gate electrode over an insulating surface of a first substrate;
    forming a gate insulating film over said gate electrode;
    depositing an amorphous semiconductor film comprising silicon on said gate insulating film;
    patterning said semiconductor film into an island comprising a channel region;
    forming a first organic leveling film over said semiconductor film after said patterning thereof to provide a leveled upper surface;

forming an opening in said organic leveling film;
forming a pixel electrode over said organic leveling film through said opening;
forming a resin black matrix over a second substrate;
forming a second organic leveling film over said resin black matrix;
forming a counter electrode on said second leveling film; and
facing said second substrate to said first substrate so that said counter electrode and said pixel electrode are opposed to each other,
wherein said opening has a tapered configuration so that a diameter thereof is larger at an upper portion than at a lower portion of said opening, and
wherein said upper portion of said opening is rounded from a first point on said leveled upper surface of said leveling film to a second point inside said opening adjacent said upper portion.

22. A method according to claim 21 further comprising a step of depositing an n-type semiconductor layer on said amorphous semiconductor film through plasma CVD using a mixture gas containing a silane, phosphine and hydrogen.

23. A method according to claim 21 further comprising a step of forming a pair of impurity doped semiconductor layers on said island, wherein one of said impurity doped semiconductor layers is electrically connected with said pixel electrode.

24. A method according to claim 21 wherein said gate electrode comprises a doped silicon film and a molybdenum film formed thereon.

25. A method according to claim 21 wherein said gate electrode comprises aluminum.

26. A method according to claim 21 wherein said gate insulating film comprises silicon oxide.

27. A method according to claim 21 wherein said amorphous semiconductor film is deposited through plasma CVD.

28. A method according to claim 21 wherein said amorphous semiconductor film is deposited to a thickness of 500 to 5000 Å.

29. A method according to claim 21 wherein said organic leveling film directly contacts a portion of said amorphous semiconductor film.

30. A method according to claim 21 wherein said pixel electrode extends over said channel region.

31. A method of manufacturing an active matrix type display device comprising the steps of:
forming a gate electrode over an insulating surface of a first substrate;
forming a gate insulating film over said gate electrode;
depositing an amorphous semiconductor film comprising silicon on said gate insulating film;
patterning said semiconductor film into an island comprising a channel region;
forming a first organic leveling film over said semiconductor film after said patterning thereof to provide a leveled upper surface;
forming an opening in said organic leveling film;
forming a pixel electrode over said organic leveling film through said opening;
forming a color filter over a second substrate;
forming a resin black matrix over said second substrate;
forming a second organic leveling film over said color filter and said resin black matrix;
forming a counter electrode on said second leveling film; and
facing said second substrate to said first substrate so that said counter electrode and said pixel electrode are opposed to each other,
wherein said opening has a tapered configuration so that a diameter thereof is larger at an upper portion than at a lower portion of said opening, and
wherein said upper portion of said opening is rounded from a first point on said leveled upper surface of said leveling film to a second point inside said opening adjacent said upper portion.

32. A method according to claim 31 further comprising a step of depositing an n-type semiconductor layer on said amorphous semiconductor film through plasma CVD using a mixture gas containing a silane, phosphine and hydrogen.

33. A method according to claim 31 further comprising a step of forming a pair of impurity doped semiconductor layers on said island, wherein one of said impurity doped semiconductor layers is electrically connected with said pixel electrode.

34. A method according to claim 31 wherein said gate electrode comprises a doped silicon film and a molybdenum film formed thereon.

35. A method according to claim 31 wherein said gate electrode comprises aluminum.

36. A method according to claim 31 wherein said gate insulating film comprises silicon oxide.

37. A method according to claim 31 wherein said amorphous semiconductor film is deposited through plasma CVD.

38. A method according to claim 31 wherein said amorphous semiconductor film is deposited to a thickness of 500 to 5000 Å.

39. A method according to claim 31 wherein said organic leveling film directly contacts a portion of said amorphous semiconductor film.

40. A method according to claim 31 wherein said pixel electrode extends over said channel region.

* * * * *